(12) United States Patent
Takita et al.

(10) Patent No.: US 7,079,443 B2
(45) Date of Patent: Jul. 18, 2006

(54) SEMICONDUCTOR DEVICE

(75) Inventors: Masato Takita, Kawasaki (JP); Masato Matsumiya, Kawasaki (JP); Satoshi Eto, Kawasaki (JP); Toshikazu Nakamura, Kawasaki (JP); Masatomo Hasegawa, Kawasaki (JP); Ayako Kitamoto, Kawasaki (JP); Kuninori Kawabata, Kawasaki (JP); Hideki Kanou, Kawasaki (JP); Toru Koga, Kawasaki (JP); Yuki Ishii, Kawasaki (JP); Shinichi Yamada, Kawasaki (JP); Kaoru Mori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 236 days.

(21) Appl. No.: 10/631,752

(22) Filed: Aug. 1, 2003

(65) Prior Publication Data

US 2004/0022091 A1    Feb. 5, 2004

Related U.S. Application Data

(62) Division of application No. 09/339,855, filed on Jun. 25, 1999, now Pat. No. 6,628,564.

(30) Foreign Application Priority Data

| Jun. 29, 1998 | (JP) | ................................. 10-182139 |
| Jun. 29, 1998 | (JP) | ................................. 10-182147 |
| Jul. 16, 1998 | (JP) | ................................. 10-202307 |

(51) Int. Cl.
*G11C 8/08* (2006.01)
(52) U.S. Cl. ................. 365/230.06; 365/189.11; 365/194; 365/196
(58) Field of Classification Search ........... 365/230.06, 365/189.11, 194, 196, 195
See application file for complete search history.

(56) References Cited

U.S. PATENT DOCUMENTS

| 5,410,508 A | 4/1995 | McLaury ................ 365/189.09 |
| 5,636,175 A | 6/1997 | McLaury ................ 365/230.06 |

(Continued)

FOREIGN PATENT DOCUMENTS

JP          1-260848          10/1989

(Continued)

*Primary Examiner*—Andrew Q. Tran
(74) *Attorney, Agent, or Firm*—Arent Fox PLLC

(57) ABSTRACT

A semiconductor device includes a word line drive circuit for resetting the word line by driving the word line connected to a memory cell and is constituted so as to switch a reset level of the word line drive circuit, which is set at the time of the reset operation of the word line, between a first potential such as a ground potential and a second potential such as a negative potential. Further, a semiconductor device including a memory cell array formed by arranging a plurality of memory cells and a word line reset level generating circuit for generating a negative potential makes it possible to vary the amount of a current supply of the word line reset level generating circuit when non-selected word lines are set to a negative potential by applying the output of the word line reset level generating circuit to the non-selected word lines, and varies the amount of the current supply of the negative potential in accordance with the operation of the memory cell array. Furthermore, in a semiconductor device including a plurality of power source circuits each having an oscillation circuit and a capacitor, for driving the capacitor by the oscillation signal outputted by the oscillation circuit, at least a part of these power source circuits shares in common the oscillation circuit, and different capacitors are driven by the oscillation signal outputted from the common oscillation circuit.

7 Claims, 57 Drawing Sheets

U.S. PATENT DOCUMENTS

| | | | | |
|---|---|---|---|---|
| 5,650,976 | A | 7/1997 | McLaury | 365/230.06 |
| 5,926,433 | A | 7/1999 | McLaury | 365/230.06 |
| 5,973,963 | A * | 10/1999 | Sugawara | 365/185.23 |

FOREIGN PATENT DOCUMENTS

| | | |
|---|---|---|
| JP | 2-73593 | 3/1990 |
| JP | 2-235368 | 9/1990 |
| JP | 3-173465 | 7/1991 |
| JP | 4-130766 | 5/1992 |
| JP | 5-217373 | 8/1993 |
| JP | 5-274876 | 10/1993 |
| JP | 6-204406 | 7/1994 |
| JP | 6-215568 | 8/1994 |
| JP | 7-307091 | 11/1995 |
| JP | 9-55084 | 2/1997 |
| JP | 9-134591 | 5/1997 |
| JP | 9-161481 | 6/1997 |
| JP | 2000-30437 | 1/2000 |
| KR | 1994-0002859 | 4/1994 |

* cited by examiner

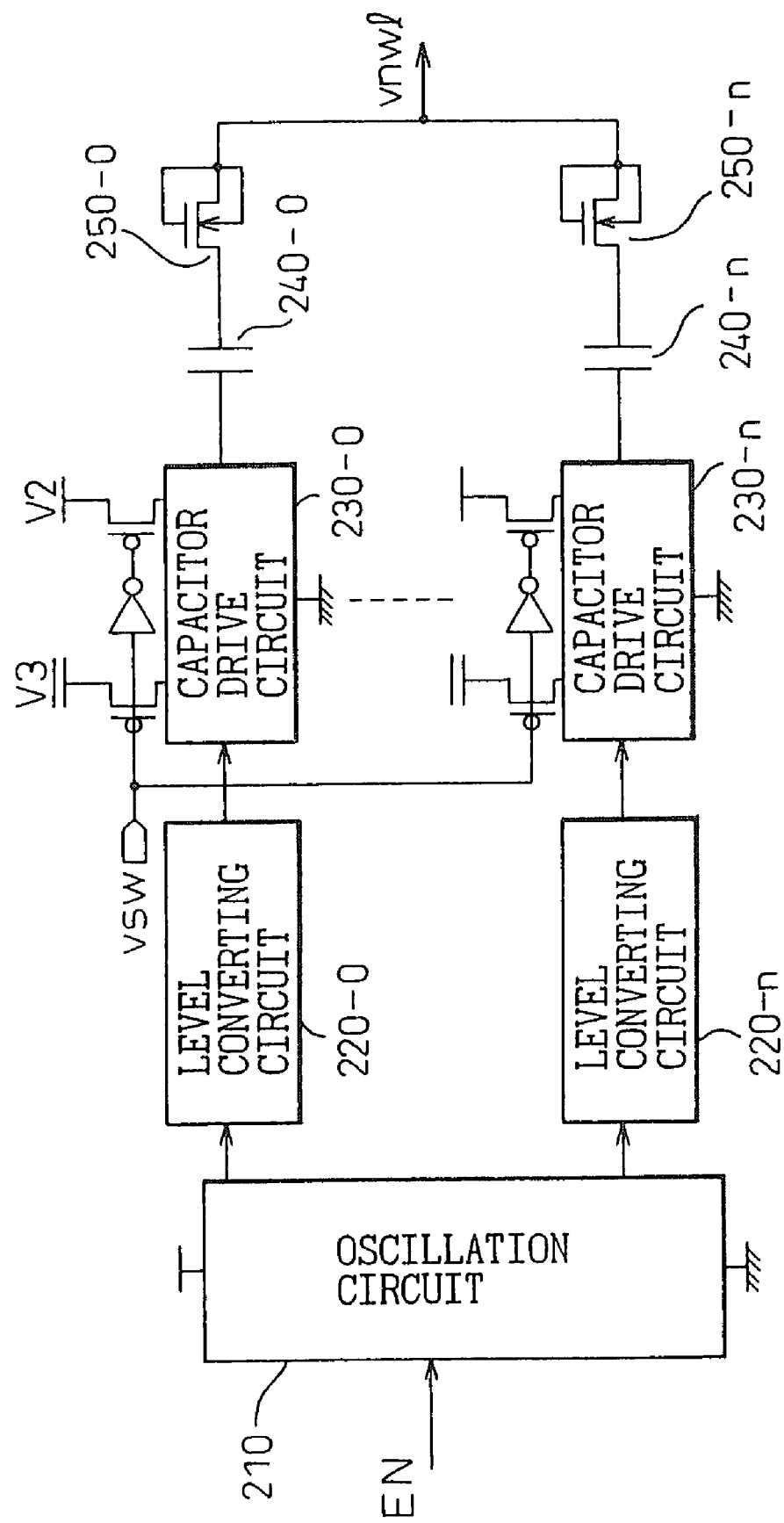

SEMICONDUCTOR DEVICE

This application is a Div of Ser. No. 09/339,855, filed Jun. 25, 1999, now U.S. Pat. No. 6,628,564.

BACKGROUND OF THE INVENTION

1. Field of the Invention

The present invention relates to a semiconductor device having the function of executing a reset operation of a word line connected to a specific memory cell, by driving the word line, in order to return the specific memory cell, in a memory cell array of a semiconductor memory, from an activated state to a standby state.

Demands for lower power consumption have been increasing in recent years in semiconductor devices comprising a semiconductor memory such as a dynamic random access memory (hereinafter abbreviated to "DRAM") in consideration of battery driving. Therefore, power that is consumed in a circuit for executing the reset operation described above must be reduced as much as possible, too.

The present invention also relates to a semiconductor device for storing data by storing charges in memory cells and more specifically, to a semiconductor device which sets a word line potential at the time of non-selection to a negative potential so as to insure a safe and reliable operation even when a power source voltage is lowered so as to cope with higher circuit integration and even when a transistor threshold voltage value becomes low.

The present invention also relates to a semiconductor device including a plurality of power source circuits for generating different potentials by driving a capacitor by an oscillation signal, such as a step-up circuit (i.e., booster circuit) and a step-down circuit and more specifically, to a semiconductor device comprising a DRAM having such power source circuits.

2. Description of the Related Art

Generally, each of a plurality of memory cells that constitute a memory cell array in the DRAM includes one cell transistor for reading or writing data and one cell capacitor connected to the source of this cell transistor. The cell capacitor stores a charge depending on the logic "1" or "0" of the data written into the memory cell. A word line is connected to the gate of each cell transistor so as to supply a voltage necessary for bringing this cell transistor into an operating state (activated state).

When an N-channel transistor is used as the cell transistor inside each memory cell, a threshold voltage between the gate and the source of this N-channel transistor must be taken into consideration. In other words, when data is written or read by selecting a specific memory cell among a plurality of memory cells, a step-up voltage which is elevated by at least the threshold voltage between the gate and the source of the N-channel transistor is supplied from a word line to the gate of the N-channel transistor in order to reliably bring the cell transistor in this specific memory cell from the standby state to the activated state. Furthermore, in order to accomplish a high-speed operation of the DRAM, the cell transistor in the selected memory cell must be quickly returned from the activated state to the standby state after the data is written into, or read out, from the selected memory cell.

The operation that supplies a reset signal of a predetermined level from the word line to the cell transistor so as to return the cell transistor under the activated state to the standby state is generally referred to as the "reset operation" of the word line. A technology which sets the level of the reset signal (reset level, that is, reset potential) outputted from a word line driver circuit, to a potential of a negative voltage level (negative potential), but not to the ground potential, has been employed for this reset operation so as to minimize the leakage of the charges that are stored in the cell capacitor.

On the other hand, the integration density has become higher and higher in semiconductor memories (semiconductor memory devices) and scaling-down of the memory cell size has been made with a higher integration density. When the memory cell is scaled-down, a driving voltage must be lowered because the withstand voltage of the memory cell becomes low, and it becomes more difficult to insure a safe and reliable operation of the memory. Particularly in the case of the memories of such a type in which a capacitor is provided to each memory cell and the charge storing state and the charge non-storing state in the capacitor are allowed to correspond to the data values, as typified by the DRAM, the charges that are stored in the capacitor gradually drop due to the leakage current of the memory cell, and a re-write operation referred to as "refresh" must be carried periodically. When the memory cell is scaled down, the withstand voltage of the capacitor becomes low, so that a high voltage cannot be applied to the memory cell. In other words, the voltage of the power source must be lowered. The threshold voltage of the transistor must be also lowered with the decrease of the power source voltage, thereby inviting the problem that the leakage current when the cell transistor is not selected (sub-threshold leak) increases and the data retaining time becomes short. When the data retaining time becomes short, the cycle of the refresh operation must be shortened so as to cope with this short time, thereby inviting also the drop of performance of the DRAM such as the increase of the refresh current.

On the other hand, attempts have been made in recent years to reduce operating voltages of the semiconductor devices to improve the operation speed, to save power and to reduce noise. For instance, a driving voltage of 5 V has long been used for the semiconductor devices but recently, a 3.3 V voltage has been used and this voltage may become lower in the future. Nonetheless, such a voltage alone is not sufficient to insure stability of the operation, and a higher voltage and a negative voltage become necessary. Therefore, a step-up power source circuit (i.e., boosting power source circuit) and a step-down power source circuit are provided inside the semiconductor device so as to generate the necessary voltages in the semiconductor device. The DRAM, in particular, has been developed by simplifying as much as possible the construction so as to attain a high integration density but recently, a high operation speed has become also an important object in addition to the high integration density.

In order to make the problem that is encountered when the reset potential of the word line is set to the negative potential during the reset operation of the memory cell in the DRAM, more easily understood, the construction and operations of DRAMs, etc., according to the prior art that have the function of executing the reset operation will be explained with reference to FIGS. 1 to 5 of the accompanying drawings in the later-appearing "BRIEF DESCRIPTION OF THE DRAWINGS".

FIG. 1 is a circuit diagram showing the construction of the first example of a semiconductor device having the function of setting a reset potential to a negative potential according to the prior art, and FIG. 2 is a timing chart useful for explaining the operation of the prior art device shown in FIG. 1. In this case, the drawings show the circuit construction for driving the word lines in the semiconductor device to simplify the explanation.

A word line driver 280 is shown disposed in FIG. 1 for supplying a driving signal SWL of a predetermined voltage level to the word line connected to the gate of the cell transistor inside the memory cell. This word line driver 280 includes an inverter comprising a P-channel transistor 285 and an N-channel transistor 290 for outputting the driving signal SWL on the basis of a selection signal, and an N-channel transistor 295 for clamping the word line at a predetermined reset level (reset potential) on the basis of a reset control signal SWDX. The source of each N-channel transistor 290, 295 is connected to a power source (negative power source) having a negative voltage Vnwl for resetting the word line. The N-channel transistor 295 becomes operative (ON) during the reset operation of the word line, and the output level of the driving signal SWL outputted from the word line driver circuit is substantially equal to the potential of the negative power source.

In FIG. 1, there is further disposed a word line driver control circuit 180 for controlling the voltage level of the driving signal SWL by supplying a high voltage side power source signal SWDZ to the P-channel transistor 285 of the word line driver 280. This word line driver control circuit 180 includes an inverter comprising a P-channel transistor 170 and an N-channel transistor 175. The source of the P-channel transistor 170 is connected to a power source of a step-up voltage Vpp, and the source of the N-channel transistor 175 is connected to the negative power source having a negative voltage Vnwl. Here, the high voltage side power source signal SWDZ of the step-up voltage Vpp or the negative voltage Vnwl is supplied to the high voltage side power source of the word line driver 280 on the basis of the control signal inputted from a node n01 on the input side of the inverter.

The operation of the semiconductor device of FIG. 1 is shown in the timing chart of FIG. 2. As is obvious from FIG. 2, when the memory cell is in a standby state, the signal level at the node n01, and the signal level at each portion, are as follows.

The signal level at the node n01=Vpp (high voltage level ("H (High)" level), the high voltage side power source signal SWDZ=Vnwl (low voltage level ("L (Low)" level), the selection signal MWL=Vpp, the reset controlling signal SWDX=Vii ("H" level). Therefore, the driving signal SWL=Vnwl. Here, symbol Vii represents the voltage of the step-down power source in the DRAM, and represents the "H" level which is lower than the "H" level of the step-up voltage Vpp.

Next, when the memory cell starts the active operation and enters the activated state, the memory cell is driven in such a manner that the level of the signal at the node n01 becomes equal to the negative voltage Vnwl and the level of the high voltage side power source voltage SWDZ reaches the step-up voltage Vpp. Further, the memory cell is controlled at the same timing so that the reset control signal SWDX becomes equal to Vnwl. Since the level of the selection signal MWL is set to the negative voltage Vnwl, the driving signal rises up to the step-up voltage Vpp.

The reset operation of the word line is executed when the activated state of the memory cell is returned to the standby state. In this case, the node n01 is first raised to the step-up voltage, so that the level of the high voltage side power source signal SWDZ reaches the voltage Vnwl. Since the level of the selection signal MWL remains the negative voltage Vnwl at this time, the P-channel transistor 285 becomes operative and the source of this transistor is connected to the node SWL. In consequence, the charges that are stored in the word line are absorbed by the negative power source through the P-channel transistor 285, and the potential of the node (word line) outputting the driving signal SWL drops. As the potential of this node lowers, the voltage comes close to the threshold voltage of the P-channel transistor 285. Therefore, a control is carried out at a suitable timing so that the selection signal MWL=Vpp. Furthermore, the node outputting the driving signal SWL is reset through the N-channel transistor 290 and is clamped at the negative voltage Vnwl. The negative voltage Vnwl clamped in this way corresponds to the reset potential of the word line.

In this case, all the charges Q (Q=(Vpp−Vnwl)×Cswl) charged to the node outputting the driving signal SWL must be absorbed by the negative power source having the negative voltage Vnwl. Here, symbol Cswl represents the total capacitance of the node.

The negative potential that is used for the reset operation of the word line and corresponds to the negative voltage Vnwl is not applied from outside the DRAM, and must be generated in the DRAM. A circuit that comprises an oscillating circuit unit and a pumping circuit unit is generally known as a negative potential generating circuit for generating such a negative potential.

Therefore, the construction of the semiconductor device according to the prior art, that absorbs the charge of the word line that is charged to the step-up voltage, under the activated state of the cell transistor, by the negative voltage, involves the problem that more power is consumed than in the construction in which the word line charge is absorbed by the power source of the ground potential. On the other hand, it is essentially necessary to set the potential at the time of the reset operation of the word line to a voltage level, which is as low as possible, in order to minimize the leak of the charge stored in the cell capacitor.

On the other hand, an increase in the refresh current causes a deterioration of a performance of the DRAM. To solve this disadvantage, Japanese Unexamined Patent Publication (Kokai) No. 9-134591 discloses a construction that reduces the sub-threshold leak by setting the potential of the non-selected word line (reset potential) to the negative potential below the ground level. FIG. 3 shows the basic construction of the semiconductor device as the second example of the prior art such as the device of Japanese Unexamined Patent Publication (Kokai) No. 9-134591. In addition to the conventional construction including the memory cell array, the word line driver (word line driver circuit) 200 and the X decoder (row decoder, that is, word line decoder) 300, a WL (word line) reset level generating circuit 400 is disposed so that the negative potential generated by this circuit 400 is supplied to the word line driver (word line driver circuit) 200.

The source and the drain of the cell transistor are connected to one of the ends of the capacitance and to the bit line, respectively. However, when the circuit is designed in such a manner that the potentials of the source and the drain do not fall to a level below the ground level, a negative bias voltage is applied between the gate and the source of the non-selected transistors if the potential of the word line connected to the gate of the cell transistor is lowered below the ground level. The larger becomes the negative value of the potential difference between the gate and the source of the transistor, the smaller becomes the sub-threshold leak of the transistor in a form of an exponential function, so that the decrease in the stored charges due to the leakage current can be reduced. Therefore, the reduction of the leakage current improves stability and reliability of the memory operation and accomplishes the improvement of performance such as the reduction of consumed power.

The negative potential generating circuit used in the second example of the conventional semiconductor devices allows the substrate potential of the cell transistor and its current supply/current absorption capability to be at a level that can sufficiently supplement the junction leak of the corresponding transistor. When the reset potential of the word line is set to the negative potential, however, a load such as the word line is charged and discharged by the negative potential power source. Therefore, a current supply capacity greater than that of the prior art devices becomes necessary. Japanese Unexamined Patent Publication (Kokai) No. 9-134591 discloses merely the disposition of the negative potential generating circuit but does not mention its construction, current supply capacity and current supplying method. However, it is assumed that the negative potential generating circuit that is disclosed in this reference quite naturally has a large current supply capacity.

When the negative potential generating circuit has a large current supply capacity, the power consumed in the negative potential generating circuit becomes great, too. Because the reduction of consumed power has been required for the semiconductor devices, the reduction of consumed power in the negative potential generating circuit is also required.

On the other hand, in order to cope with the disadvantage in which the operation of the semiconductor device becomes unstable due to lowering of the driving voltage, Japanese Unexamined Patent Publication (Kokai) No. 2-73593 discloses the construction for improving stability of the operation by increasing the voltage of the selected word line to a level higher than the voltage of the internal power source (internal voltage) and the power source voltage inputted from outside (external voltage). The aforementioned Japanese Unexamined Patent Publication (Kokai) No. 9-134591 discloses the construction for reducing the sub-threshold leak by setting the potential of the non-selected word lines (reset potential) to the negative potential below the ground level. Since the leak of the charges retained in the memory cell can be reduced in this way, the refresh cycle can be extended and consumed power can be reduced, as well.

FIG. 4 shows the voltage (potential) levels generated in the DRAM. The drawing shows the power source voltage levels generated on the chip with respect to the external power sources Vdd and GND, and these voltage levels are generated by the power source circuit that drives the capacitor by the oscillation signal. Symbol Vpp represents the "H" level of the selected word line, Vnwl represents the word line reset level, Vbb represents the back-bias voltage of the cell transistor and Vppr represents the step-up potential (i.e., step-up voltage) for generating Vg. Symbol Vg represents a constant potential used as the gate potential when the internally regulated voltage V2 is generated by using the N-channel transistor, as will be described later. Since Vg is V2+Vth (threshold voltage of the transistor), there is the case in which Vg>Vdd. Therefore, It is necessary to generate Vg from a potential higher than Vdd.

The negative potential Vbb is applied as the back-bias to the cell transistor so as (1) to prevent the forward-bias of the p-n junction inside the chip and to prevent also the destruction of the data and latch-up, (2) to reduce the change of the threshold voltage of the MOS transistor, (3) to reduce the junction capacitance by the back-bias (i.e., reverse-bias), and (4) to improve the transistor characteristics by increasing the threshold voltage of a parasitic MOS transistor.

The "H" level (Vpp) of the selected word line must be set to a level higher than "H" level of the cell stored charge +Vth.

Recently, the requirement for lowering the Vpp level has arisen with the progress of the lower voltage of the power source and lower power consumption of the semiconductor devices. To satisfy this requirement, the threshold voltage of the cell transistor must be lowered. When the threshold voltage of the cell transistor is lowered, however, the leakage current increases at the OFF time of the cell transistor and the holding time of the charge stored in the cell drops, so that the stable and reliable operation is impeded. To cope with the problem of lowering of the threshold voltage of the cell transistor, Japanese Unexamined Patent Publication (Kokai) No. 9-134591 proposes to set the word line reset level to the negative potential (Vnwl). If the word line reset level is kept at a potential lower than "L (Low)" of the bit line amplification, the negative bias is always applied between the gate and the source of the non-selected cell transistors in all the operating conditions, and the leakage current of the non-selected cell transistors can be thus reduced. In this way, a DRAM having high reliability can be accomplished.

As described above, various voltages are used in the DRAM other than the power source voltage supplied from external, and as to the power source voltage described above, power source circuits for generating different potentials by driving the capacitor with the oscillation signal are used.

FIG. 5 shows a structural example of the power source circuits in the conventional DRAM described above. As shown in the drawing, a plurality of power source circuits 10-0 to 10-n are provided on the chip. Each power source circuit includes an oscillation circuit 210 to 210-n, a capacitor drive circuit 230 to 230-n, a capacitor (pumping capacitor) 240 to 240-n and an output circuit (output transistor) 250 to 250-n, and outputs a voltage Vp1 to Vpn different from the external power source voltage.

The reduction of the chip area has been required for semiconductor devices so as to reduce the production cost. Also, the reduction of power consumption has been required to improve the chip performance (or chip characteristics). The semiconductor device includes a large number of power source circuits as shown in FIG. 5 in order to improve performance such as the high operation speed and the extension of the refresh time. From another aspect, however, this circuit construction invites the drop of performance such as the increase of the chip area and the increase of power consumption. It is therefore indispensable to reduce as much as possible a deterioration of performance in another aspect with the improvement of performance such as the high operation speed and the extension of the refresh time.

SUMMARY OF THE INVENTION

In view of the problems described above, it is the first object of the present invention to provide a semiconductor device which can minimize an increase of power consumption even when a word line is set to a negative potential for resetting the word line.

It is the second object of the present invention to reduce power consumption of a semiconductor device equipped with a negative potential generating circuit for generating the potential which set the reset potential of the word line to the negative potential.

It is the third object of the present invention to reduce the increase of a chip area and power consumption in a semiconductor device equipped with a plurality of power source circuits for improving performance such as a high operation speed and the extension of a refresh time.

To accomplish the first object, the semiconductor device according to the present invention includes a word line driver (word line drive circuit) having the function of driving a word line connected to a specific memory cell inside a memory cell array having a plurality of memory cells and for resetting the word line when the specific memory cell is returned from an activated state to a standby state, wherein the reset level of the word line driver, which is set when the reset operation of the word line is executed, is switched between first and second potentials.

Preferably, in the semiconductor device according to the present invention, a reset level switch circuit unit for switching the reset level between the first and second potentials is disposed in the word line driver.

Preferably, further, in the semiconductor device according to the present invention, a reset level switch circuit for switching the reset level between the first and second potentials is disposed separately from the word line driver.

Preferably, further, the semiconductor device according to the present invention includes further a plurality of word line drivers having the function of driving the word line connected to a specific memory cell inside a memory cell array having a plurality of memory cells and for resetting the word line when the specific memory cell is returned from an activated state to a standby state, and a reset level switch circuit for switching the reset level of a plurality of word line drivers between the first and second potentials is disposed separately from a plurality of word line drivers (a plurality of word line drive circuits) so that the switching operation of the reset level between the first and second potentials can be executed collectively by the reset level switch circuit for these word line drivers.

Preferably, further, in the semiconductor device according to the present invention, the second potential is set to a level lower than the first potential.

Preferably, further, in the semiconductor device according to the present invention, the first potential of the reset level is the ground potential and the second potential is a potential of a negative voltage level.

Preferably, further, in the semiconductor device according to the present invention, switching of the reset level to the first potential is executed before the reset operation of the word line is started.

Preferably, further, in the semiconductor device according to the present invention, switching of the reset level to the second potential is executed after the reset operation is started and the level of the word line drops.

Preferably, further, the semiconductor device according to the present invention includes a reset level switching control circuit for setting in advance a period, in which the level of the word line drops to a predetermined level from the start of the reset operation, and for switching the reset level between the first and second potentials after this period passes from the timing of the start of the reset operation.

Preferably, further, the semiconductor device according to the present invention includes a word line potential judging circuit for supervising the potential of the word line, and for switching the reset level between the first and second potentials when it detects the drop of the potential of the word line to a level below a predetermined level.

Preferably, further, in the semiconductor device according to the present invention, the switching operation of the reset level between the first and second potentials is executed by using an activation signal and a non-activation signal for activating and non-activating a sense amplifier provided to the memory cell array.

The aforementioned problem that power consumption increases in the semiconductor device results presumably from the fact that the charges of the "H" level, particularly the charges that are charged to the level of the boosting voltage, are all absorbed by the negative power source as the voltage-generating power source in the semiconductor device.

In the semiconductor device according to the present invention, therefore, the charges that are charged to the "H" level are absorbed by the power source of the first potential (ground potential, for example) in the first period of the reset operation of the word line, and after the level of the word line drops sufficiently, the remaining charges are absorbed by the power source having the second potential (potential of a negative voltage level, for example) lower than the first potential.

According to this circuit construction, the major proportion of the charges of the node of the word line, that are charged to the "H" level, are allowed to escape to the power source of the ground potential before the reset operation of the word line is started, and the amount of the charges that are allowed to escape to the negative power source having low power source efficiency can be decreased drastically. In this way, the present invention can reduce power consumption in the semiconductor device much more than the prior art devices, and can thus accomplish the first object described above.

To accomplish the second object, on the other hand, the semiconductor device according to the present invention uses a word line reset level generating circuit capable of varying the amount of a current supply of the negative potential, and changes the supply amount of the negative potential in accordance with the operating condition of the memory cell array.

In other words, the semiconductor device according to the present invention includes a plurality of word lines disposed in parallel, a plurality of bit lines extending in a vertical direction to the extending direction of the word lines, memory cell arrays each having memory cells that are disposed in the array form in such a manner as to correspond to a plurality word lines and to a plurality of bit lines, are connected to corresponding ones of these word lines and bit lines, and hold data by retaining the charge, and a word line reset level generating circuit, wherein, when the non-selected word lines are set to the negative potential by applying the output of the word line reset level generating circuit to the non-selected word lines, this word line reset level generating circuit can vary the amount of the current supply of the negative potential, and varies the amount of the current supply of the negative potential in accordance with the operating conditions of the memory cell array.

Preferably, the semiconductor device according to the present invention further includes a word line reset level detecting circuit for detecting the output state of the word line reset level generating circuit; and a word line reset level control circuit for controlling the operation of the word line reset level generating circuit on the basis of the detection result of this reset level detecting circuit.

Preferably, further, in the semiconductor device according to the present invention, the word line reset level control circuit stops the operation of the word line reset level generating circuit when the potential of the word line reset level is below a first predetermined voltage, operates the word line reset level generating circuit so that the amount of the current supply of the word line reset level generating circuit becomes maximal when the potential of the word line reset level generating circuit is above a second predetermined voltage, and controls the amount of the current supply of the word line reset level generating circuit in accordance with the access operation to the memory cell array when the potential of the word line reset level is between the first and second predetermined voltages.

Preferably, further, when the semiconductor device according to the present invention comprises a plurality of banks, the word line reset level generating circuit comprises a plurality of circuit units corresponding to a plurality of banks and capable of operating independently, and these circuit units are selected and operated in accordance with the operation of the memory cell array.

Preferably, further, in the semiconductor device according to the present invention, the word line reset level generating circuit includes an oscillation circuit, a capacitor and a capacitor drive circuit for driving the capacitor, wherein a higher potential of a power source of the capacitor drive circuit is higher than a higher potential of a power source of the oscillation circuit.

Preferably, further, in the semiconductor device according to the present invention, the word line reset level generating circuit includes an oscillation circuit, a capacitor and a capacitor drive circuit for driving the capacitor, wherein the higher potential of power source of the capacitor drive circuit is equal to the higher potential of the power source of the oscillation circuit.

Preferably, further, in the semiconductor device according to the present invention, the word line reset level generating circuit includes an oscillation circuit, a capacitor and a capacitor drive circuit for driving the capacitor, wherein the higher potential of the power source of the capacitor drive circuit is lower than the higher potential of the power source of the oscillation circuit.

Preferably, further, in the semiconductor device according to the present invention, the word line reset level generating circuit includes an oscillation circuit, a capacitor, a capacitor drive circuit for driving the capacitor, and a power source switch circuit for switching the connection of a power source line of higher potential of the capacitor drive circuit among the power source lines having a plurality of different potentials.

Preferably, further, in the semiconductor device according to the present invention, the power source switch circuit executes the switching operation between the power source line having a potential higher than the higher potential of the power source of the oscillation circuit and the power source line of higher potential having a potential equal to the potential of the oscillation circuit.

Preferably, further, in the semiconductor device according to the present invention, the power source switch circuit executes the switching operation between the power source line having a potential equal to the higher potential of the power source of the oscillation circuit and the power source line having a potential lower than the higher potential of the power source of the oscillation circuit.

Preferably, further, in the semiconductor device according to the present invention, the word line reset level generating circuit includes an oscillation circuit, a capacitor and a capacitor drive circuit for driving the capacitor, wherein the capacitor drive circuit applies a single oscillation signal outputted from the oscillation circuit to the capacitor.

Preferably, further, in the semiconductor device according to the present invention, the word line reset level generating circuit includes an oscillation circuit, a capacitor and a capacitor drive circuit for driving the capacitor, wherein the capacitor drive circuit applies a plurality of oscillation signals outputted from the oscillation circuit to the capacitor.

Preferably, further, in the semiconductor device according to the present invention, the word line reset level generating circuit includes a plurality of oscillation circuits for outputting oscillation signals having different frequencies, a capacitor, a capacitor drive circuit for driving the capacitor, and a selection circuit for selecting the oscillation signal from a plurality of oscillation circuits to be applied to the Capacitor drive circuit.

Preferably, further, in the semiconductor device according to the present invention, the word line reset level generating circuit includes a plurality of oscillation circuits for outputting oscillation signals having different frequencies, a capacitor, a power source switch circuit for switching the connection of a power source line of higher potential of a capacitor drive circuit for driving the capacitor among a plurality of power source lines having different potentials, and a selection circuit for selecting the oscillation signal from a plurality of oscillation circuits to be supplied to the capacitor drive circuit.

Preferably, further, in the semiconductor device according to the present invention, the word line reset level generating circuit includes an oscillation circuit, a plurality of capacitor units, a plurality of capacitor drive circuit units for driving the capacitor units and a switch for switching the input of the oscillation signal outputted from the oscillation circuit to each capacitor drive circuit unit, and this switch is switched in accordance with the operation of the memory cell array.

Preferably, further, the semiconductor device according to the present invention includes an internal regulator circuit for down-converting the power source voltage supplied from outside, and the higher potential of the power source of the oscillation circuit is supplied from this internal regulator circuit.

Generally, when the word line which is selected and activated is reset, a large current flows to the word line reset level and for this reason, a current supply of this circuit must be increased. When the semiconductor device is in a standby state, on the contrary, this circuit may have a current supply capacity sufficient to supply a current necessary for keeping the reset level. In the semiconductor device according to the present invention, therefore, the supply amount of the word line reset level generating circuit is increased when a large current supply capacity is required, and is decreased when a small current supply capacity may suffice. Consequently, if the word line reset level is set to the negative potential, then power consumption of the word line reset level generating circuit can be reduced. In this way, the second object of the present invention can be accomplished.

To accomplish the third object, the semiconductor device according to the present invention uses in common the oscillation circuit for a plurality of power source circuits.

In other words, the semiconductor device according to the present invention includes a plurality of power source circuits, each including an oscillation circuit and a capacitor, for generating a different potential by driving the capacitor by the oscillation signal outputted by the oscillation circuit, wherein at least a part of a plurality of power source circuits shares in common the oscillation circuit, and different capacitors are driven by the oscillation signal outputted from the common oscillation circuit.

Preferably, in the semiconductor device according to the present invention, each power source circuit is equipped with an operation control circuit at the input portion of the oscillation signal outputted from the common oscillation circuit to the capacitor drive circuit.

Preferably, further, in the semiconductor device according to the present invention, the power source circuits sharing the oscillation circuit generate different potentials.

Preferably, further, in the semiconductor device according to the present invention, the common oscillation circuit outputs a plurality of oscillation signals having different phases, and the capacitor is driven by a plurality of oscillation signals having different phases.

Preferably, further, in the semiconductor device according to the present invention, the power source circuits, having the capacitor that is driven by a plurality of oscillation signals having different phases, generate the same potential, and the outputs of the power source circuits are connected in common.

Preferably, further, in the semiconductor device according to the present invention, the power source circuit includes an operation control circuit disposed at the input portion of the oscillation signal outputted from the common oscillation circuit to the capacitor drive circuit, and switching the operating state of the power source circuit between the operating state and the non-operating state, and a potential detecting circuit for detecting the potential generated by the power source circuit, wherein the operation control circuit is controlled on the basis of the detection result of the potential detecting circuit.

Preferably, further, the semiconductor device according to the present invention includes a plurality of power source circuits each including a clock input circuit for receiving the clock inputted from outside and a capacitor, for generating different potentials by driving the capacitor by an internal clock for power source outputted by the clock input circuit.

Preferably, in the semiconductor device according to the present invention, the clock input circuit includes a frequency dividing circuit for frequency-dividing the clock, and the output of the frequency dividing circuit is outputted as the internal clock for power source.

Because the semiconductor device according to the present invention uses in common the oscillation circuit that has been provided in the past to each of a plurality of power source circuits, the semiconductor device of the present invention can eliminate the overlapping oscillation circuits and consequently, can reduce the chip area and power consumption of the overlapping oscillation circuits.

Because the operation control circuit is provided to the input portion of the oscillation signal outputted from the common oscillation circuit to the capacitor drive circuit, the operating condition can be controlled and in this way, the third object of the present invention can be accomplished.

Furthermore, the power source circuits sharing in common the oscillation circuit may generate different potentials or the same potential. When the same potential is generated, the outputs of the power source circuits are connected and used.

The capacitor may be driven by the oscillation signal having the same phase or by a plurality of oscillation signals having different phases. When the outputs of the power source circuits for generating the same potential are connected, the efficiency does not drop, even when the cycle of the oscillation signal is shortened, if the capacitors of the power source circuits are driven by a plurality of oscillation signals having different phases.

Furthermore, stable supply of the power source becomes possible by providing the operation control circuit to the input portion of the capacitor drive circuit and providing the potential detecting circuit for detecting the potential generated by the power source circuit, and by controlling the operation control circuit on the basis of the detection result of the potential detecting circuit.

Incidentally, it is possible to receive the clock inputted from outside by the clock input circuit and to drive the capacitors of a plurality of power source circuits for generating different potentials, by the output of the clock input circuit. The voltage can be stepped down similarly. In this case, the frequency dividing circuit for frequency-dividing the clock is provided in the clock input circuit so as to use the clock having a suitable cycle for the power source circuits.

BRIEF DESCRIPTION OF THE DRAWINGS

The above objects and features of the present invention will be more apparent from the following description of the preferred embodiments with reference to the accompanying drawings, wherein:

FIG. 42 is a block circuit diagram showing the basic construction of the WL reset level generating circuit of the sixth embodiment of the present invention;

DESCRIPTION OF THE PREFERRED EMBODIMENTS

Hereinafter, the basic embodiment of the present invention and some preferred embodiments thereof will be explained with reference to FIGS. 6 to 63B of the accompanying drawings.

Initially, a preferred embodiment for accomplishing the first object of the present invention will be explained.

Figure 6:
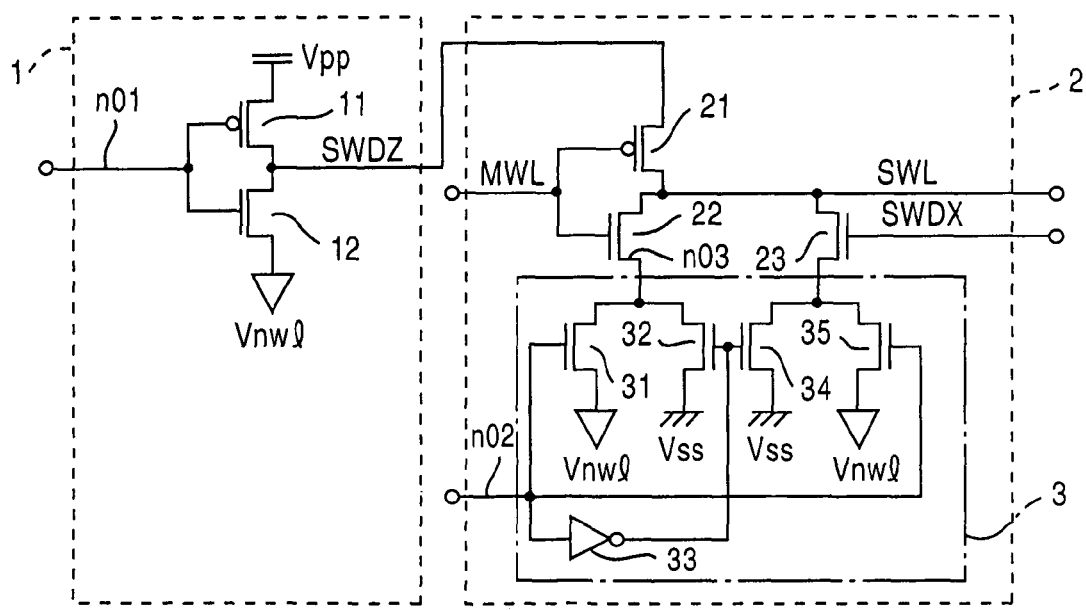
FIG. 6 is a circuit diagram showing the construction of the first embodiment of the present invention.
Figure 7:
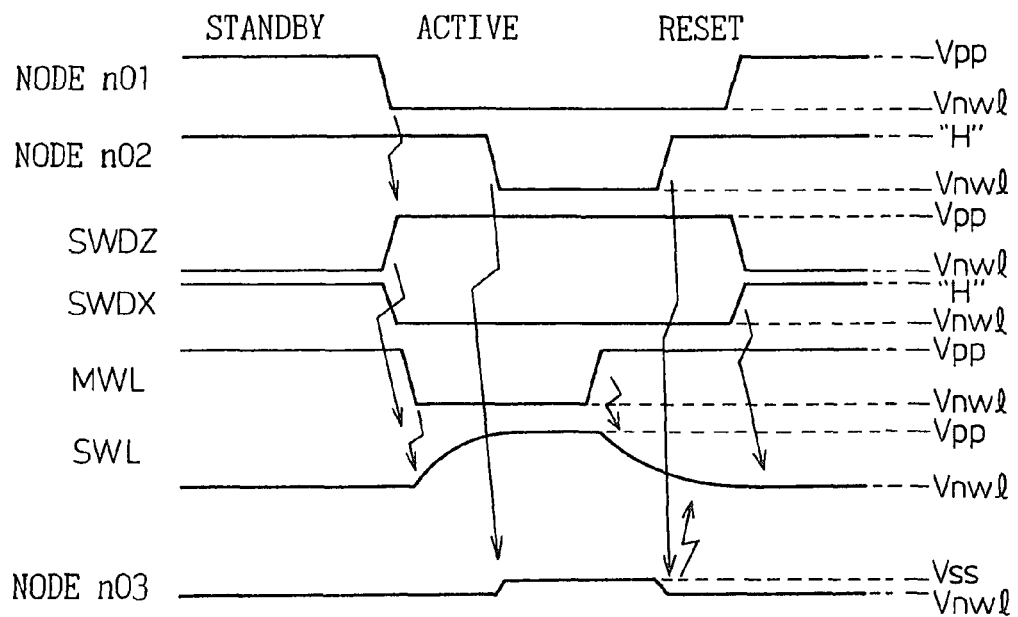
FIG. 7 is a timing chart useful for explaining the operation of the embodiment shown in FIG. 6.

FIG. 6 is a circuit diagram showing the construction of the first embodiment of the present invention, and FIG. 7 is a timing chart useful for explaining the operation of the embodiment shown in FIG. 6. In this case, too, however, the circuit construction for driving the word line in the semiconductor device is shown in the drawings so as to simplify the explanation.

In the first embodiment shown in FIG. 6, there is disposed a word line drive circuit 2 for supplying a drive signal SWL of a predetermined voltage level to the word line connected to the gate of the cell transistor in the memory cell. This word line drive circuit 2 includes an inverter, that comprises a P-channel transistor 21 and an N-channel transistor 22 and outputs the drive signal SWL on the basis of the selection signal MWL, and an N-channel transistor 23 for clamping the word line at a reset potential on the basis of a reset control signal SWDX.

Figure 1:
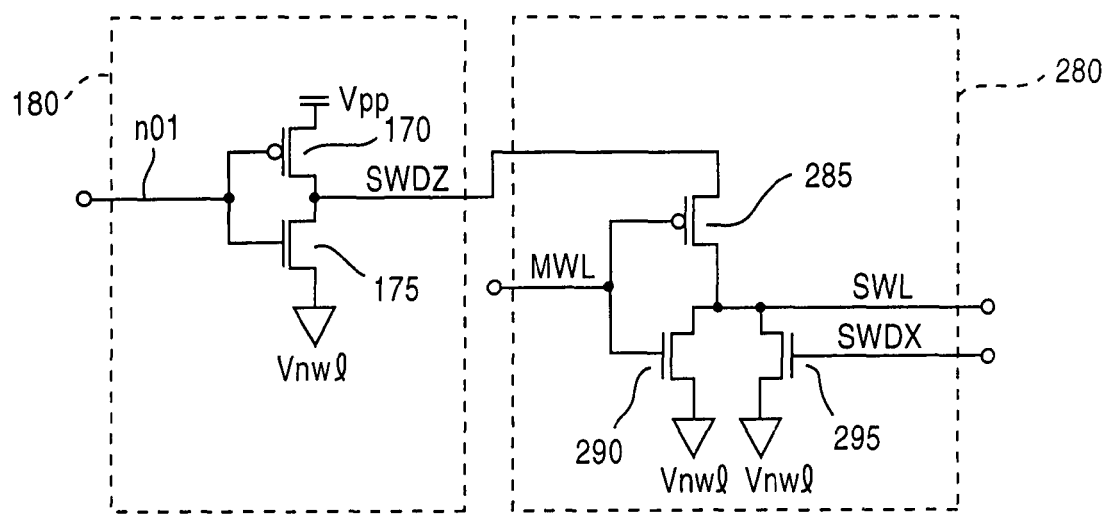
FIG. 1 is a circuit diagram showing the first example of the construction of a semiconductor device having a function of setting a reset potential to a negative potential according to the prior art.
Figure 2:
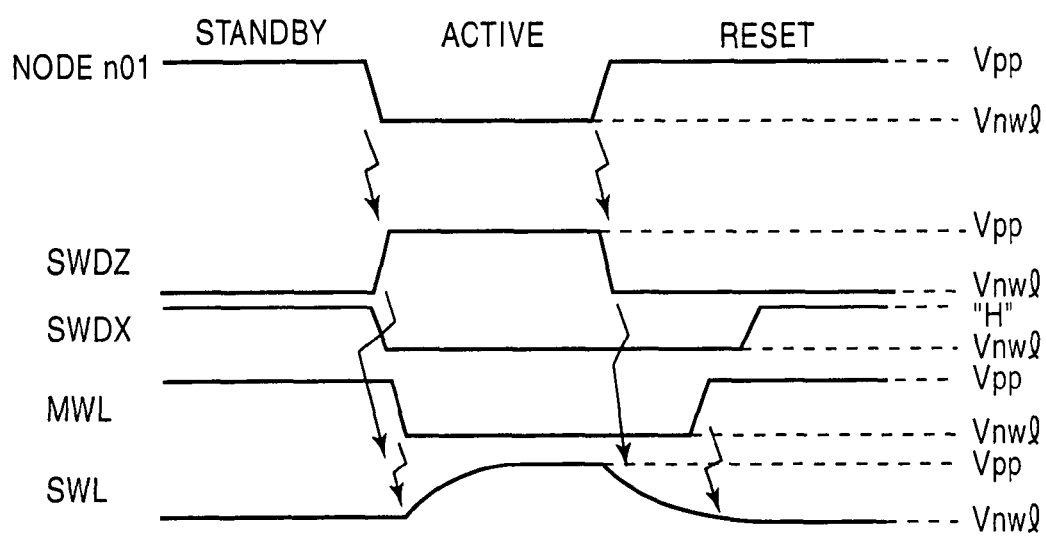
FIG. 2 is a timing chart useful for explaining the operation of the prior art device shown in FIG. 1.
Figure 3:
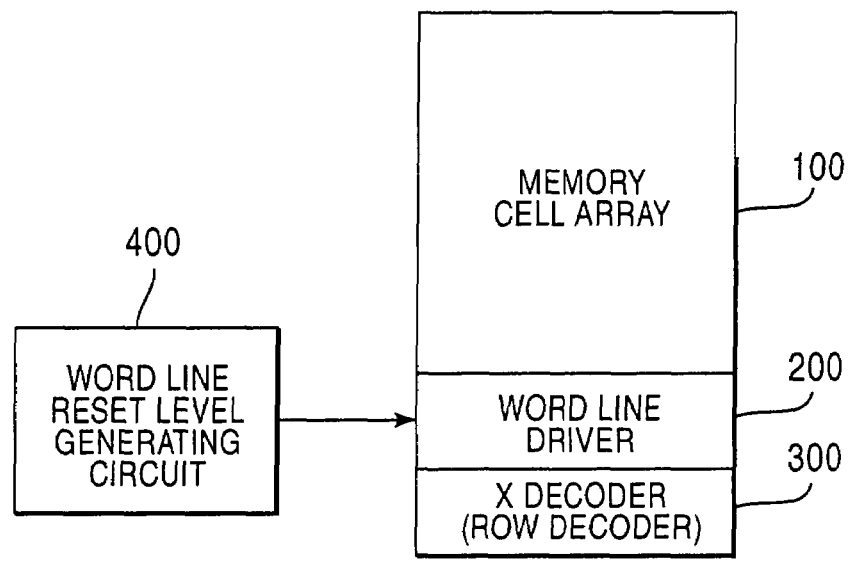
FIG. 3 is a schematic view showing the second example of the basic construction of a DRAM for setting the reset level of a word line to a negative level according to the prior art.

The P-channel transistor 21, the N-channel transistor 22 and the N-channel transistor 23 inside the word line drive circuit 2 substantially correspond to the P-channel transistor 285, the N-channel transistor 290 and the N-channel transistor 295 of the word line drive circuit 280 according to the prior art example (shown in FIG. 1), respectively.

The embodiment shown in FIG. 6 includes further a word line drive control circuit 1 for controlling the voltage level of the drive signal SWL by supplying the high voltage side power source signal SWDZ to the source of the P-channel transistor 21 of the word line drive circuit 2. This word line drive control circuit 1 includes an inverter comprising a P-channel transistor 11 and an N-channel transistor 12. The source of the P-channel transistor 11 is connected to a power source of a boosting voltage Vpp (step-up power source) while the source of the N-channel transistor 12 is connected to a negative power source of a negative voltage Vnwl. Here, the step-up voltage Vpp or the high voltage side power source signal SWDZ of the negative voltage Vnwl is supplied to the high voltage side power source of the word line drive circuit 2 on the basis of the control signal inputted from a node n01 on the input side of the inverter.

The P-channel transistor 11 and the N-channel transistor 12 in the word line drive circuit 1 substantially correspond to the P-channel transistor 170 and the N-channel transistor 175 in the word line drive control circuit 180 of the aforementioned prior art example (shown in FIG. 1), respectively.

In the embodiment shown in FIG. 6, further, a reset level switch circuit unit 3 for switching a potential of the ground level Vss of the reset level and a potential of the negative voltage Vnwl (that is, switching of the reset potential) is disposed in the word line drive circuit 2. This reset level switch circuit unit 3 includes N-channel transistors 31 and 32 for switching the potential of the source of the N-channel transistor 22 connected to the node of the word line, between the ground voltage Vss and the negative voltage Vnwl, and an inverter 33 connected between the gate of the N-channel transistor 31 and the gate of the N-channel transistor 32. Further, the reset level switch circuit unit 3 includes N-channel transistors 34 and 35 for switching the source potential of the N-channel transistor 23 connected to the node of the word line, between the ground voltage Vss and the negative voltage Vnwl.

When the reset operation of the word line is executed, the level of the node n03 of the N-channel transistor 22 of the word line drive circuit 2 (that is, the reset level) is set to the potential of the ground voltage Vss (the first potential), or to the potential of the negative voltage Vnwl (the second potential) in accordance with the reset potential switch control signal supplied from the node n02 to the gates of the N-channel transistors 31 and 35. When the reset operation of the word line is commenced, the control signal of the "L" level is first supplied from the node n02. In consequence, the N-channel transistor 32 becomes operative and the reset level reaches the potential of the ground voltage Vss. After the level of the word line (that is, the level of the drive signal SWL) sufficiently drops, the control signal of the "H" level is supplied from the node n02. Consequently, the N-channel transistor 31 becomes operative and the reset level is switched to the potential of the negative voltage Vnwl.

The operation of the embodiment shown in FIG. 6 is illustrated in the timing chart of FIG. 7. As can be seen clearly from FIG. 6, the signal level at each of the nodes n01, n02 and n03 and at each portion is under the following state when the memory cell is in a standby state, in the first place.

Signal level at the node n01=Vpp ("H" level), the signal level at the node n02=Vii ("H" level), the high voltage side power source signal SWDZ=Vnwl (the low voltage level ("L" level) the selection signal MWL=Vpp, and the reset control signal SWDX=Vii ("H" level). Therefore, the drive signal SWL=Vnwl. Here, symbol Vii represents the voltage of the step-down power source inside the DRAM, as described already.

Next, when the memory cell starts the active operation and enters the activated state, the memory cell is driven so that signal level at the node n01 is equal to the negative voltage Vnwl and the level of the high voltage side power source signal reaches the step-up voltage Vpp. Control is made at the same timing in such a fashion that the reset control signal SWDX becomes equal to Vnwl. Furthermore, as the level of the selection signal MWL is set to the negative voltage Vnwl, the drive signal SWL reaches the step-up voltage Vpp.

The reset operation of the word line is executed in order to return the activated state of the memory cell to the stand by state. In this case, the reset operation of the word line is executed by setting the selection signal MWL to Vpp and extracting the charge, to the power source of the ground voltage Vss, through the N-channel transistors 22 and 32 of the word line drive circuit 2. At this time, the level of the signal at the node n02 has already become the negative voltage Vnwl. Such a level change at the node n02 can be accomplished by executing the control so that the word line potential reaches the step-up voltage Vpp and the operation mode enters the activated state.

The charges that are charged to the word line are then absorbed by the power source of the ground voltage Vss through the N-channel transistors 22 and 32 of the word line drive circuit 2 (refer to the waveform of the driving signal SWL). After the potential of the word line corresponding to the level of the drive signal SWL has sufficiently dropped, control is made so that the potential of the node n02="Vii". The route of the charge absorption is switched to the negative power source of the negative voltage Vnwl by turning OFF the N-channel transistor 32 and turning On the N-channel transistor 31, and then the reset potential of the word line is clamped at the negative power source. The following methods may be employed as a method of bringing the potential of the node n02 to "Vii" after the potential of the word line has sufficiently dropped; ① a method that simulates and controls the time, in which the potential of the word line drops sufficiently, by a timing circuit, and ② a method that monitors the word line potential in the semiconductor device and automatically changes the potential of the node n02. Concrete circuit constructions for accomplishing these controlling methods will be later described with reference to FIGS. 17 to 20.

As to the flow of the charges when the reset operation of the word line is executed in the first embodiment described above, the charges flow from the word line→N-channel transistor 22→N-channel transistor 32→power source of ground voltage Vss, at the start of the reset operation. When the potential of the word line has sufficiently dropped, the charges flow from the word line →N-channel transistor 22→N-channel transistor 31→power source of negative voltage Vnwl. In other words, at the start-of the reset operation of the word line, the major proportion of the charges that the node of the word line hold are allowed to first escape to the power source of the ground voltage Vss, and in this way, the quantity of the charges escaping to the negative power source having low power source efficiency decreases drastically. In consequence, power consumption in the semiconductor device can be drastically saved.

Figure 8:
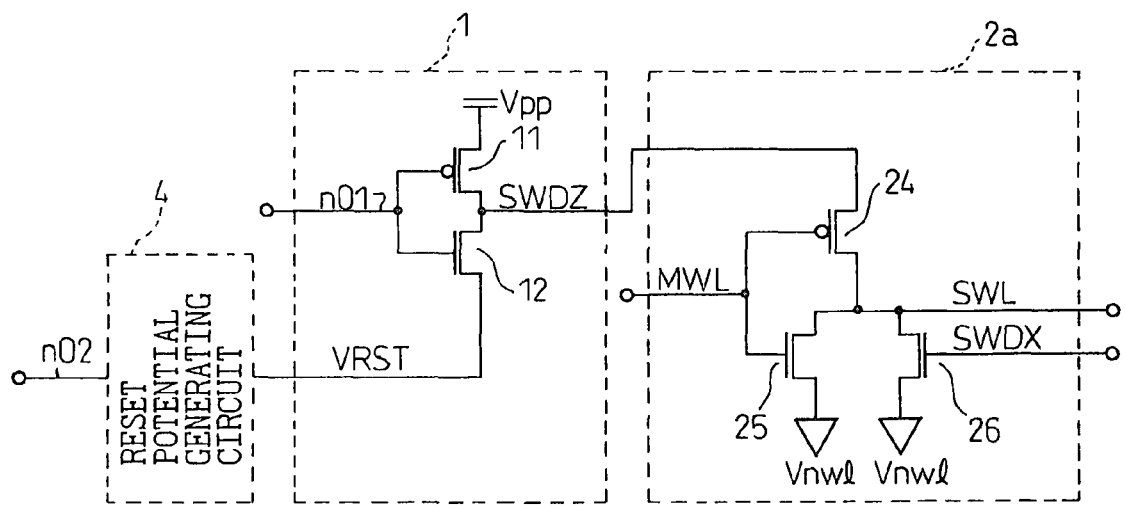
FIG. 8 is a circuit diagram showing the construction of the second embodiment of the present invention.
Figure 9:
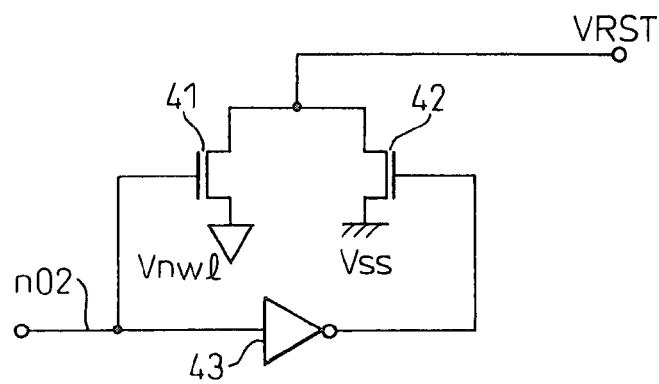
FIG. 9 is a circuit diagram showing the detailed construction of a reset potential generating circuit in the embodiment shown in FIG. 8.
Figure 10:
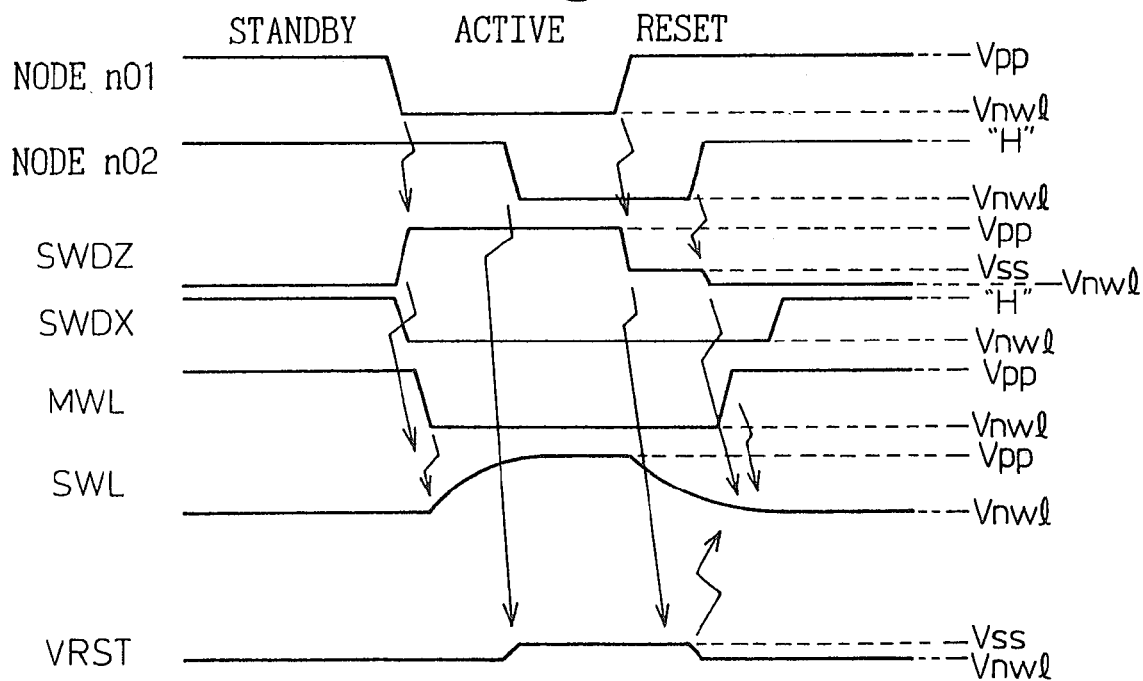
FIG. 10 is a timing chart useful for explaining the operation of the embodiment shown in FIG. 8.

FIG. 8 is a circuit diagram showing the construction of the second embodiment and FIG. 9 is a circuit diagram showing the detailed construction of a reset potential generating circuit in the embodiment shown in FIG. 8. FIG. 10 is a timing chart for explaining the operation of the embodiment shown in FIG. 8. In this case, too, the circuit construction for driving the word line inside the semiconductor device is shown in the drawings so as to simplify the explanation. Like reference numerals will be used hereinafter to identify like constituent elements described already.

In the second embodiment shown in FIG. 8, there is disposed a word line drive circuit 2a for supplying a drive signal SWL of a predetermined voltage level to the word line connected to the gate of the cell transistor inside the memory cell. This word line drive circuit 2a includes an inverter comprising a P-channel transistor 24 and-an N-channel transistor 25, for outputting the drive signal SWL on the basis of the selection signal MWL, and an N-channel transistor 26 for clamping the word line at a predetermined reset potential on the basis of the reset control signal SWDX. The sources of the N-channel transistors 25 and 26 are connected to the power source of the negative voltage Vnwl (negative power source) for resetting the word line.

The P-channel transistor 24, the N-channel transistor 25 and the N-channel transistor 26 inside the word line drive circuit 2a substantially correspond to the P-channel transistor 285, the N-channel transistor 290 and the N-channel transistor 295 in the word line drive circuit 280 of the prior art example (see FIG. 1), respectively.

In the embodiment shown in FIG. 8, a word line drive controlling circuit 1 is provided so as to control the voltage level of the drive signal SWL by supplying the high voltage side power source signal SWDZ to the source of the P-channel transistor 24 of the word line drive circuit 2a in the same way as in the first embodiment (see FIG. 6). This word line drive control circuit 1 has an inverter comprising a P-channel transistor 11 and an N-channel transistor 12 in the same way as in the first embodiment. The source of the P-channel transistor 11 is connected to the power source of the step-up voltage (step-up power source) and the source of the N-channel transistor 12 is connected to the output terminal of the reset potential generating circuit 4. The reset power source supply signal VRST is supplied from the output terminal of this reset potential generating circuit 4 to the source of the N-channel transistor 12.

In this case, the reset potential generating circuit 4 has the function of a reset level switch circuit for switching the first and second potentials of the reset level of the word line drive circuit 2a, and is disposed separately from the word line drive circuit 2a.

FIG. 9 shows the detailed construction of the reset potential generating circuit 4. Here, the reset potential generating circuit 4 includes two N-channel transistors 41 and 42 and an inverter connected between the gate of one (41) of the N-channel transistors and the gate of the other N-channel transistor 42. In order to execute the reset operation of the word line, the level of the reset power source supply signal VRST (that is, the reset level) is set to the potential of the ground voltage Vss and to the potential of the negative voltage Vnwl in accordance with the reset potential switch control signal supplied from the node n02 to the gates of the N-channel transistors 41 and 42. When the reset operation of the word line is started, the control signal of the "L" level is first supplied from the node n02, so that the transistor 42 is ON and the reset level reaches the potential of the ground voltage Vss. After the level of the word line (that is, the level of the drive signal SWL) has sufficiently dropped, the control signal of the "H" level is supplied from the node n02. In consequence, the N-channel transistor 41 is turned ON and the reset level is switched to the potential of the negative voltage Vnwl.

The operation of the embodiment shown in FIGS. 8 and 9 is illustrated in the timing chart of FIG. 10. As is obvious from FIG. 8, when the memory cell is in a standby state, the levels of the signals of the nodes n01 and n02 and at each portion are as follows. The signal level at the node n01=Vpp ("H" level), the signal level at the node n02=Vii ("H" level), the high voltage side power source signal SWDZ=Vnwl (low voltage level ("L" level), the selection signal MWL=Vpp, and the reset control signal SWDX=Vii. Accordingly, the drive signal SWL=Vnwl.

Next, when the memory cell starts the active operation and enters the activated state, the level of the signal at the node n01 is equal to the negative voltage Vnwl and the level of the high voltage side power source signal SWDZ reaches the step-up voltage Vpp. At the same timing, control is made so that the reset control signal SWDX is equal to Vnwl. Furthermore, as the level of the selection signal MWL is set to the negative voltage Vnwl, the drive signal rises to the step-up voltage Vpp.

The reset operation of the word line is executed when the activated state of the memory cell is returned to the standby state. In this case, the reset operation of the word line is executed by setting the level of the signal at the node n01 to the boosting voltage Vpp and by extracting the charges to the power source of the ground voltage Vss inside the reset potential generating circuit 4 through the P-channel transistor 24 of the word line drive circuit 2a. By this time, the level of the signal at the node n02 has already become the negative voltage Vnwl. Such a level change at the node n02 can be accomplished by executing the control so that the potential of the word line rises to the step-up voltage Vpp during the activated state.

In this way, the charges stored by the word line are absorbed by the power source of the ground voltage Vss through the N-channel transistor 12 of the word line drive controlling circuit 1 and through the N-channel transistor 42 of the reset potential generating circuit 4 (refer to the waveform of the drive signal SWL). After the potential of the word line, that corresponds to the level of the drive signal SWL, has sufficiently dropped, the control is made so that the node n02 becomes equal to "Vii". The N-channel transistor 31 is turned OFF while the N-channel transistor 41 is turned ON, thereby switching the route of charge absorption to the negative power source having the negative voltage Vnwl, and the reset potential of the word line is clamped at the negative power source.

Since the P-channel transistor 24 of the word line drive circuit 2a is interposed into this route, the potential comes close to the threshold voltage of the P-channel transistor, and the charges cannot be sufficiently absorbed by the negative power source of the negative voltage Vnwl. To avoid such a problem, the selection signal MWL and the reset control signal SWDX are set to the "H" level at a suitable timing, and the reset potential of the word line is clamped to the negative power source.

According to this circuit construction, the quantity of the charges Q that must be absorbed by the negative power source (the negative voltage Vnwl) during the reset operation of the word line becomes by far smaller [Q={(Vnwl+Vthp)−Vnwl}×Cswl]. Here, symbol Cswl represents the total capacitance of the nodes of the word line and symbol Vthp does the threshold voltage between the gate and the source of the P-channel transistor 24 of the word line drive circuit 2a. In this case, the potential of the source of the P-channel transistor 24 drops only to Vnwl+Vthp.

The control methods for attaining the relation, i.e. node n02="Vii", after the potential of the word line has sufficiently dropped, may be the same as those of the first embodiment, that is, ① the method that simulates and controls the time in which the word line potential sufficiently drops, by a timing circuit, and ② the method that supervises the word line potential inside the semiconductor device and automatically changes the potential of the node n02.

As to the flow of the charges when the reset operation of the word line is carried out in the second embodiment described above, the charges flow from the word line→P-channel transistor 24→N-channel transistor 12→signal line of reset power source supply signal VRST→N-channel transistor 42→ground voltage Vss, at the start of the reset operation. When the potential of the word line has sufficiently dropped, the charges flow from the word line→P-channel transistor 24→N-channel transistor 12→signal line of reset power source supply signal VRST→N-channel transistor 41→power source of negative voltage Vnwl.

In the first embodiment described above, the charges are directly extracted from the word decoder comprising the word line drive circuit but in this second embodiment, the charges are extracted through the P-channel transistor.

In the first embodiment described above, further, the reset level switch circuit unit is disposed inside the word decoder but in this second embodiment, only the reset level switch circuit (for example, the reset potential generating circuit 4) is disposed independently of the word decoder.

In the drawings of the word decoders in general, the width is determined in such a manner as to correspond to the pitch of the word line connected to the memory cells. Therefore, the increase in the number of constituent elements such as the reset level switch circuit unit, etc, results in the increase of the length of the word decoder. Recently, methods that dispose a plurality of word decoders and divide the word line into short segments have often been employed in order to reduce the influences of the resistance of the word line. Therefore, the increase in the number of devices that constitute the word decoder directly results in the increase in the chip area.

To solve such a problem, the second embodiment separates the reset level switch circuit from the word decoder portion having a large number of limitations, disposes it at a portion having a small number of limitations and thus prevents the increase of the area of the semiconductor chip.

On the other hand, the non-activation signal of the sense amplifier can be used for switching the reset level without using any specific control signal. The activation timing and the non-activation timing of the sense amplifier are as follows. Activation is effected when the word line rises, the charge stored in the cell capacitor propagates through the bit lines and a potential difference is generated between the bit line pair, whereas non-activation is effected when the rewrite operation to the memory cell is executed, the potential of the word line is lowered and the cell transistor enters the non-activated state. Therefore, the operation timing of the control signal desired in the semiconductor device according to the present invention coincides with the control timing of the activation signal and the non-activation signal of the existing sense amplifier. The increase in the number of the control signals results in an increase of the number of the control circuits and results eventually and undesirably in an increase in consumed power due to the circuit operations.

Figure 11:
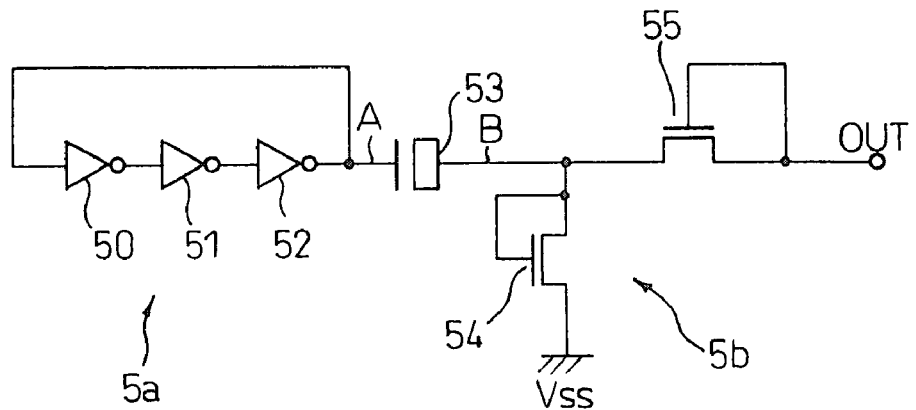
FIG. 11 is a circuit diagram showing the detailed construction of a negative potential generating circuit used in the embodiment of the present invention.
Figure 12:
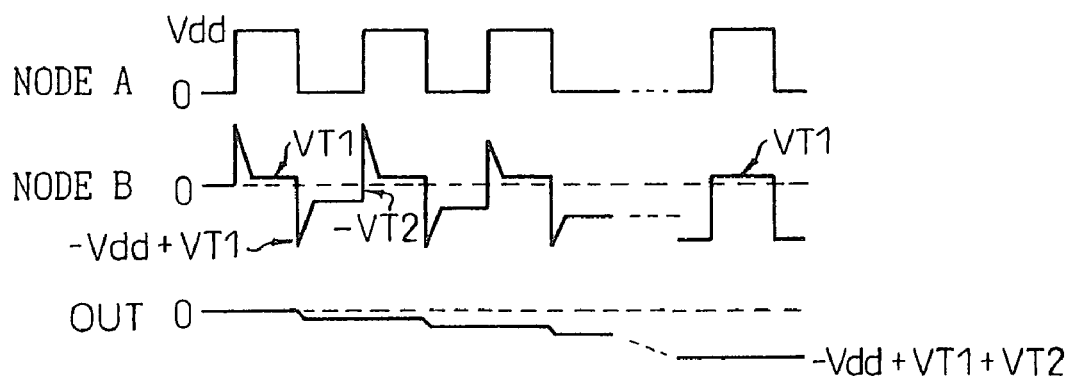
FIG. 12 is a timing chart useful for explaining the operation of the negative potential generating circuit shown in FIG. 11.

FIG. 11 is a circuit diagram showing the detailed construction of the negative potential generating circuit used in the embodiment of the present invention, and FIG. 12 is a timing chart useful for explaining the operation of the negative potential generating circuit shown in FIG. 11.

A circuit comprising the oscillation circuit unit 5a and the pump circuit unit 5b and using the potential of the ground voltage Vss as the reference, as shown in FIG. 11, is generally known as the negative potential generating circuit used for switching the reset level, to the negative potential. The oscillation circuit unit 5 is constituted by connecting three inverters 50 to 52 in the ring form. The pump circuit unit 5b includes a pumping capacitor 53 and two N-channel transistors 54 and 55. The oscillation signal of the square wave outputted from the oscillation circuit unit 5a has the negative potential which is generated by the pumping operation of the pumping capacitor 53 and the N-channel transistors 54 and 55.

The operation of the negative potential generating circuit of FIG. 11 is shown in FIG. 12. As is obvious from FIG. 12, the oscillation signal of the square wave having a voltage Vdd is outputted from the inverter 52 (node A) of the last stage of the oscillation circuit unit 5a. Further, a pulse-like voltage waveform containing three voltages, i.e. Vdd, VT1 and −VT2, is obtained from the node B of the pumping capacitor 53. These three voltages are overlapped with one another in accordance with the pumping operation by the N-channel transistors 54 and 55, and a negative potential having a voltage level of −Vdd+VT1+VT2 is generated. Generally speaking, the negative power source generated by such a negative potential generating circuit has low power source efficiency and large consumed power.

In the embodiment of the present invention, the major proportion of the charges held by the node of the word line at the start of the reset operation of the word line are first allowed to escape to the power source of the ground voltage Vss, and consumed power is minimized by decreasing drastically the quantity of the charges escaping to the negative power source having low power source efficiency.

Figure 13:
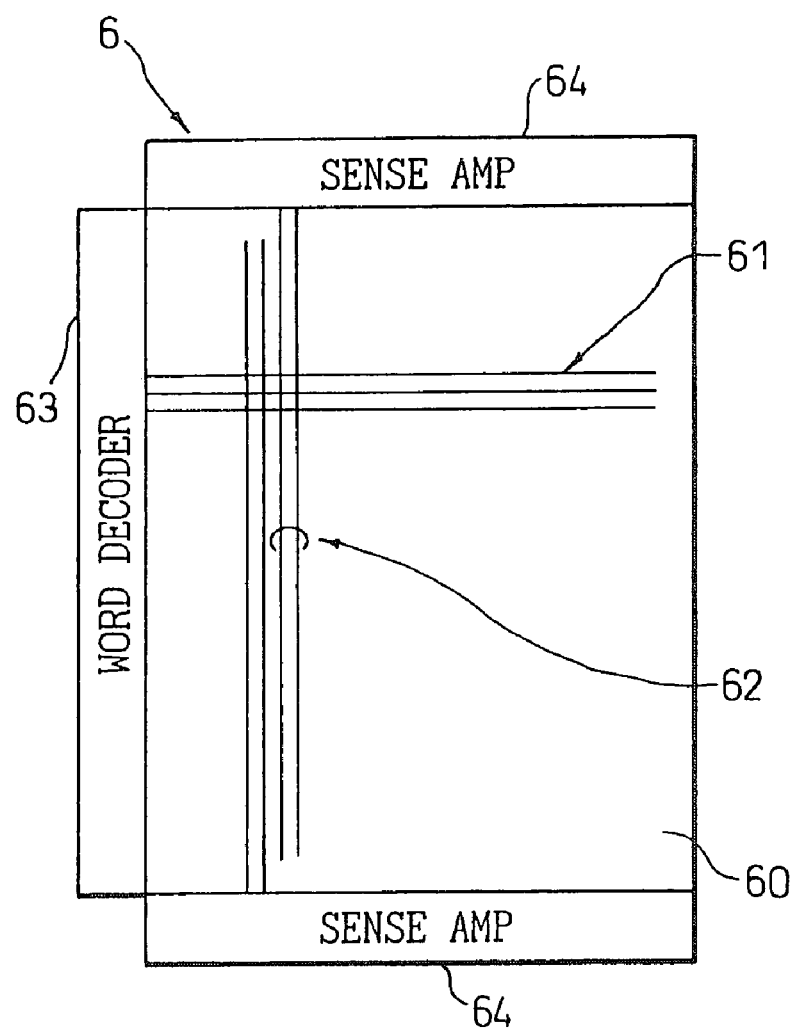
FIG. 13 is a plan view showing the schematic construction of a semiconductor memory used in the embodiment of the present invention.

FIG. 13 is a plan view showing the schematic construction of the semiconductor memory used in this embodiment of the present invention. As shown in FIG. 13, the semiconductor memory 6 such as the DRAM includes a plurality of word lines 61 and a plurality of bit line pairs 62 crossing orthogonally the word lines 61 that are disposed for the cell array 60 containing a plurality of memory cells disposed in matrix. A word decoder 63 comprising the word line drive circuit is connected to a plurality of word lines 61 and a sense amplifier 64 used during the data read operation is connected to a plurality of bit line pairs 62. A drive signal for bringing the selected memory cell into the activated state or for returning the activated state to the standby state is supplied from the word decoder 63 to a plurality of word lines. Recently, means for disposing a plurality of word decoders and dividing the word lines into short segments has been employed in order to reduce influences of the resistance of the word lines.

Figure 14:
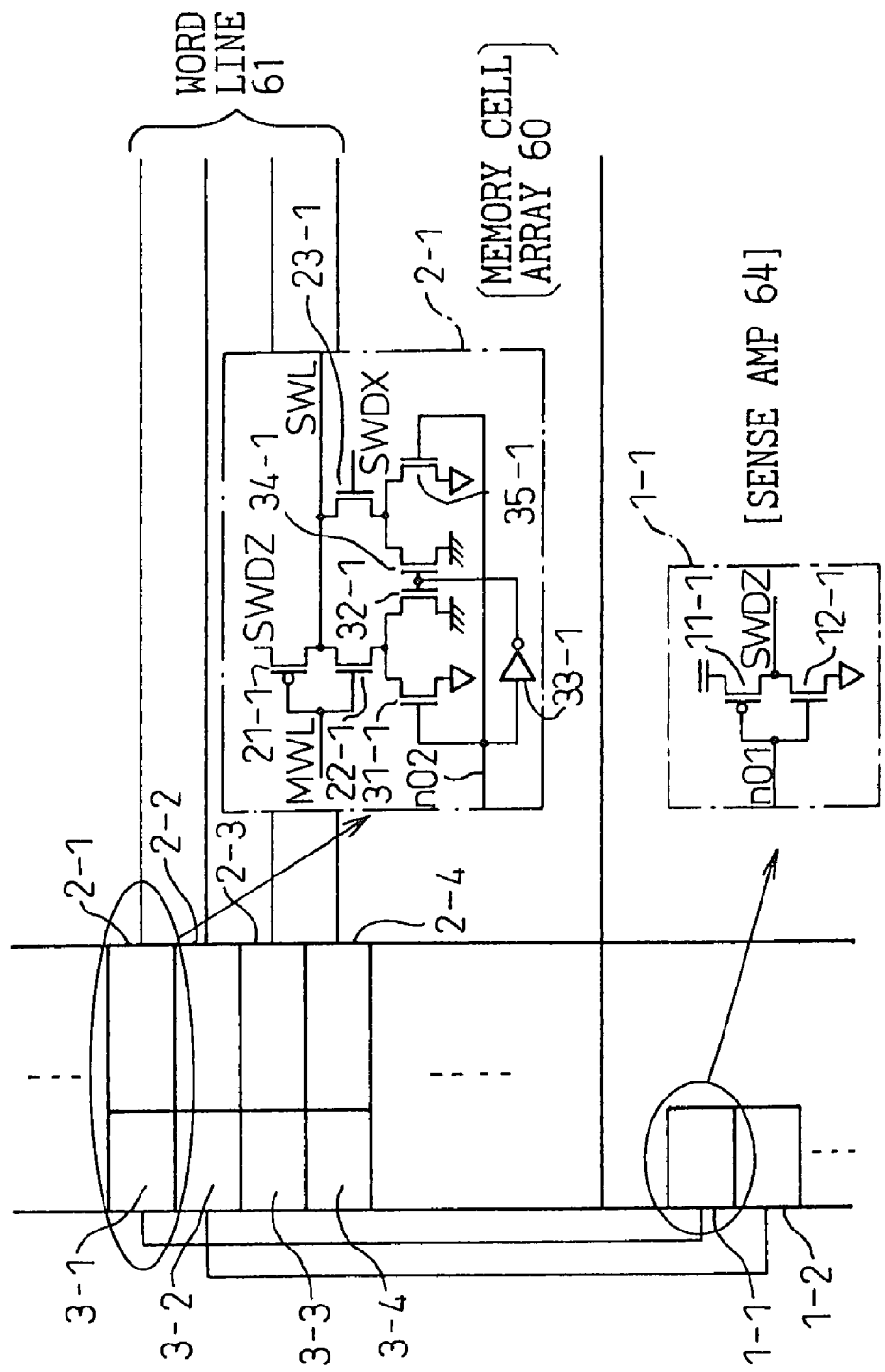
FIG. 14 is a block circuit diagram showing the construction of principal portions of a semiconductor memory according to the first embodiment of the present invention.

FIG. 14 is a block circuit diagram showing the construction of the principal portions of the semiconductor memory according to the first embodiment of the present invention. The drawing typically illustrates the construction of the semiconductor memory formed by incorporating the word line drive controlling circuit 1, the word line drive circuit 2 and the reset level switch circuit unit 3 shown in FIG. 6.

In the semiconductor memory according to the first embodiment shown in FIG. 14, a plurality of reset level switch circuit units 3-1 to 3-*n* (where n is an arbitrary positive number of 2 or more than 2) are disposed inside a plurality of word decoders 2-1 to 2-*n*, respectively. In this case, one reset level switch circuit unit is provided to each word decoder. Furthermore, a plurality of control circuits 1-1 to 1-*n* for supplying the high voltage side power source signal of these word decoders are disposed independently of a plurality of word decoders 2-1 to 2-*n*. These control circuits 1-1 to 1-*n* are disposed at positions in which a plurality of word decoders 2-1 to 2-*n* and the sense amplifier 64 are not disposed.

The construction of a plurality of word decoders 2-1 to 2-*n* (for example, the first word decoder 2-1) in the semiconductor memory shown in FIG. 14 is the same as the construction of the word line drive circuit 2 shown in FIG. 6. The explanation will be given in further detail. The first decoder 2-1 includes an inverter circuit unit comprising a P-channel transistor 21-1 and an N-channel transistor 22-1, for outputting the drive signal SWL on the basis of the selection signal MWL, and an N-channel transistor 23-1 for clamping the word line 61 at the reset potential on the basis of the reset control signal SWDX.

In the semiconductor memory shown in FIG. 14, there is further disposed a first control circuit 1-1 for controlling the voltage level of the drive signal SWL by supplying the high voltage side power source signal SWDZ to the source of the P-channel transistor 21-1 of the first word decoder 2-1. This first control circuit 1-1 includes an inverter comprising a P-channel transistor 11-1 and an N-channel transistor 12-1. The source of the P-channel transistor 11-1 is connected to the power source of the step-up voltage Vpp and the source of the N-channel transistor 12-1 is connected to the negative power source having the negative voltage Vnwl. Here, the step-up voltage Vpp or the high voltage side power source signal SWDZ of the negative voltage Vnwl is supplied to the high voltage side power source of the first word decoder 2-1 on the basis of the control signal inputted from the node n01 on the input side of the inverter.

In the semiconductor memory shown in FIG. 14, a first reset level switch circuit unit 3-1 for switching the potential of the ground voltage Vss of the reset level and the potential of the negative voltage Vnwl is disposed inside the word line drive circuit 2 described above. This first reset level switch circuit unit 3-1 includes N-channel transistors 31-1 and 32-1, that switch the source potential of the N-channel transistor 22-1 connected to the node of the word line 61 between the ground voltage Vss and the negative voltage Vnwl, and an inverter 33-1 connected between the gate of the N-channel transistor 31-1 and the gate of the N-channel transistor 32-1. The first reset level switch circuit 3-1 further includes N-channel transistors 34-1 and 35-1 for switching the source potential of the N-channel transistor 23-1 connected to the node of the word line 61 between the ground voltage Vss and the negative voltage Vnwl.

Figure 15:
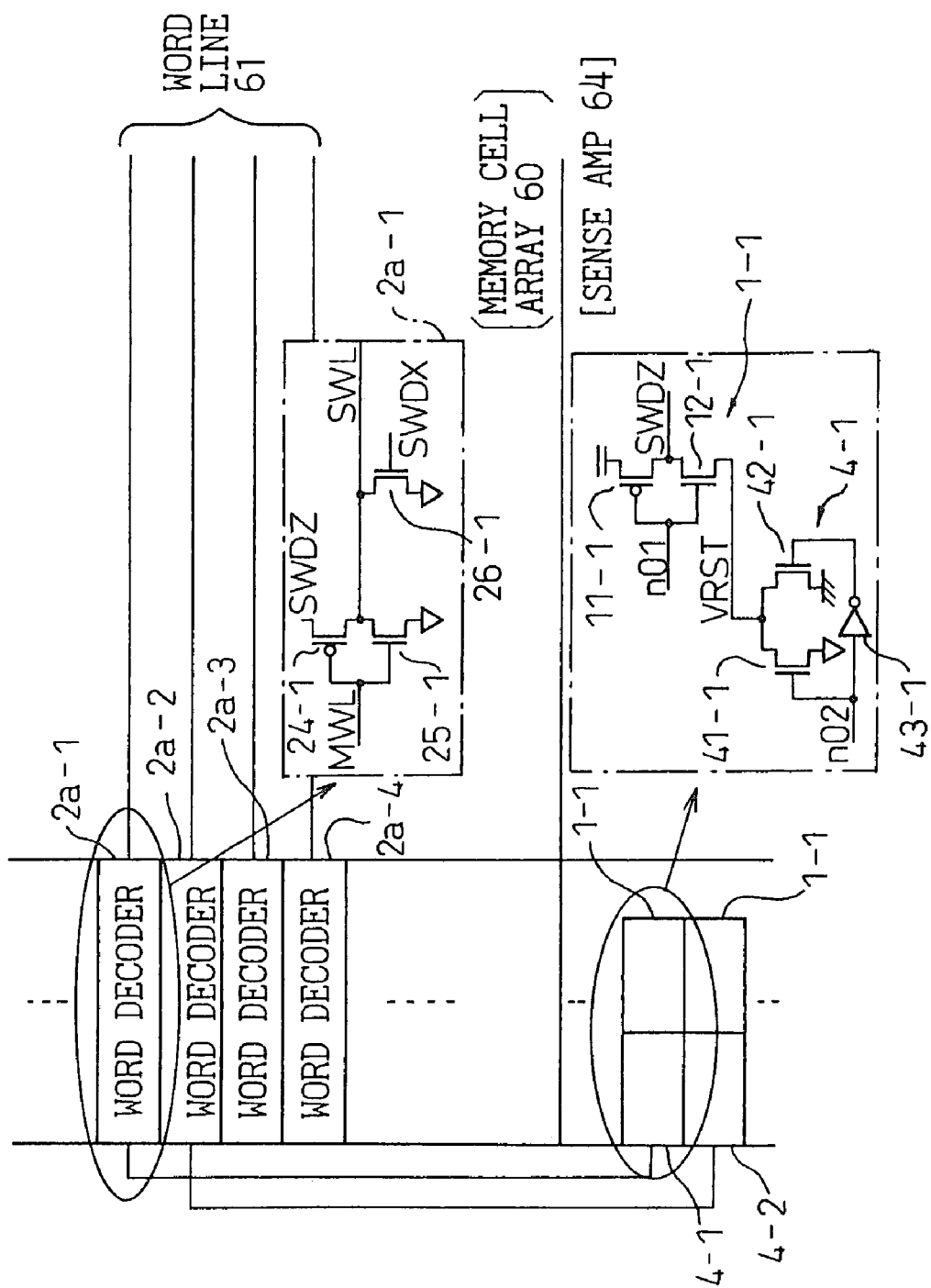
FIG. 15 is a block circuit diagram showing the construction of principal portions of a semiconductor memory according to the second embodiment of the present invention.

FIG. 15 is a block circuit diagram showing the construction of the principal portions of the semiconductor memory according to the second embodiment of the present invention. The drawing typically illustrates the construction of the semiconductor memory formed by incorporating the word line drive circuit 1, the word line drive circuit 2*a* and the reset potential generating circuit (that is, the reset level switch circuit) 4.

In the semiconductor memory according to the second embodiment shown in FIG. 15, a plurality of reset potential generating circuits 4-1 to 4-*n* (where n is an arbitrary positive number of 2 or more than 2) are separated from a plurality of word decoders 2*a*-1 to 2*a*-*n*, and they are disposed at the same positions as those of a plurality of control circuits 1-1 to 1-*n*. In this case, too, each word decoder is provided with one reset potential generating circuit, that is, the reset level switch circuit.

The construction of each of a plurality of word decoders 2*a*-1 to 2*a*-*n* in the semiconductor memory shown in FIG. 15 (for example, the first word decoder 2*a*-1) is the same as the construction of the aforementioned word line drive circuit 2*a* shown in FIG. 8. The explanation will be given in further detail. The first word decoder 2*a*-1 includes an inverter comprising a P-channel transistor 24-1 and an N-channel transistor 25-1, for outputting the drive signal SWL on the basis of the selection signal MWL, and an N-channel transistor 26-1 for clamping the word line at a predetermined reset potential on the basis of the reset control signal SWDX. The sources of these N-channel transistors 25-1 and 26-1 are connected to the power source of the negative voltage Vnwl for resetting the word line.

In the semiconductor memory shown in FIG. 15, there is further disposed a first control circuit 1-1 for controlling the voltage level of the drive signal VWL by supplying the high voltage side power source signal SWDZ to the source of the P-channel transistor 24-1 of the first word decoder 2*a*-1, in the same way as in the case of FIG. 14. This first control circuit 1-1 includes an inverter comprising a P-channel transistor 11-1 and an N-channel transistor 12-1 in the same way as in the case of FIG. 14. The source of the P-channel transistor 12-1 is connected to the output terminal of the first reset potential generating circuit 4-1. The reset power source signal VRST of the word line is supplied from the output terminal of this first reset potential generating circuit 4-1 to the source of the N-channel transistor 12-1.

In this case, the first reset potential generating circuit 4-1 has the function of the reset level switch circuit that switches the reset level of the first word decoder 2*a*-1. The first reset potential generating circuit 4-1 is disposed separately from the first word decoder 2*a* and at the same position as the position of the first reset potential generating circuit 4-1.

Figure 16:
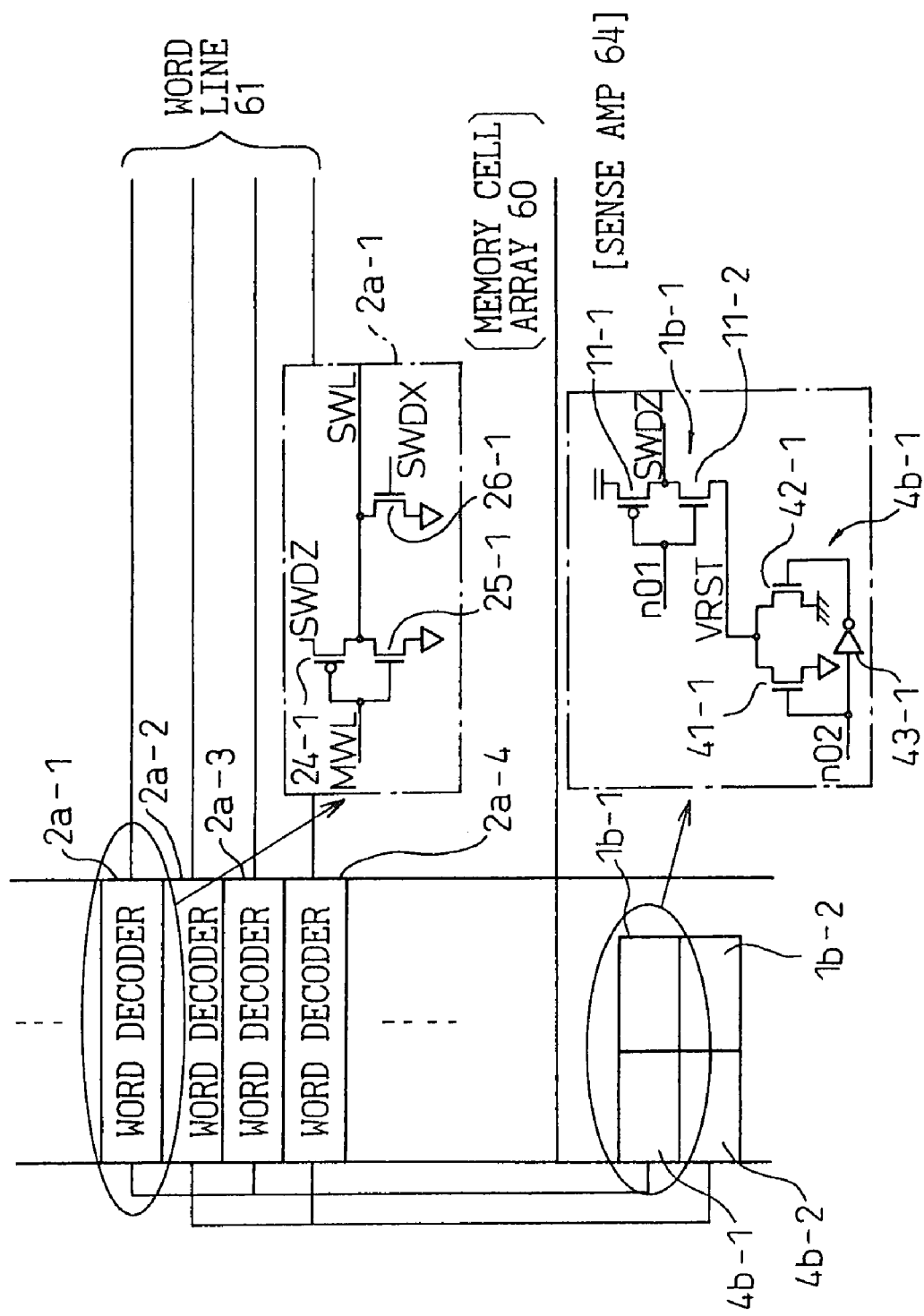
FIG. 16 is a block circuit diagram showing the construction of principal portions of a semiconductor memory according to the third embodiment of the present invention.

FIG. 16 is a block circuit diagram showing the construction of the principal portions of the semiconductor memory according to the third embodiment of the present invention.

In the semiconductor memory according to the third embodiment shown in FIG. 16, a plurality of reset potential generating circuits (that is, the reset level switch circuits) 4*b*-1 to 4*b*-*n*/2 are separated from a plurality of word decoders 2*a*-1 to 2*a*-*n*, and they are disposed at the same positions as the positions of a plurality of control circuits 1*b*-1 to 1*b*-*n*/2. The basic construction and the operation are the same as those of the semiconductor memory shown in FIG. 15. In this case, however, a plurality of word decoders of a certain unit (for example, two word decoders) share one reset level switch and execute, collectively, switching of the reset level by the reset level switch circuits on the basis of the unit described above. Here, the selection of the word decoders that share the switch circuit is made from other series by the selection signal MWL, or the like.

The construction of each word decoders 2a-1 to 2a-n in the semiconductor memory shown in FIG. 16 (for example, the first word decoder 2a-1) is the same as the construction of the word decoder shown in FIG. 15. Further, the construction of each of a plurality of control circuits 1b-1 to 1b-n/2 is the same as the construction of the aforementioned control circuit 1-1 shown in FIG. 10, and the construction of each of a plurality of reset level switch circuits 4b-1 to 4b-n/2 (for example, the first reset level switch circuit 4b-1) is the same as the construction of the reset level switch circuit 4-1 shown in FIG. 15. Therefore, the detailed explanation of the word decoder, the control circuit and the reset level switch circuit will be hereby omitted.

In the semiconductor memory according to the third embodiment of the present invention, the switching operations of the reset level by the reset level switch circuits are collectively executed for a plurality of word decoders. Therefore, the number of the reset level switch circuits can be reduced and unnecessary power consumption can be restricted.

Figure 17:
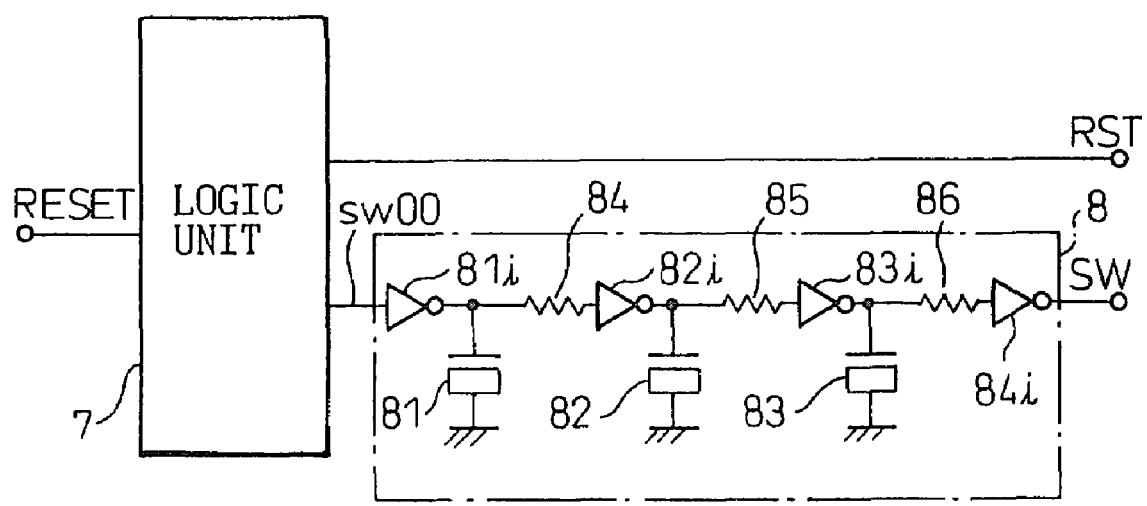
FIG. 17 is a block circuit diagram showing the construction of a reset level switching control timing circuit used in the embodiment of the present invention.
Figure 18:
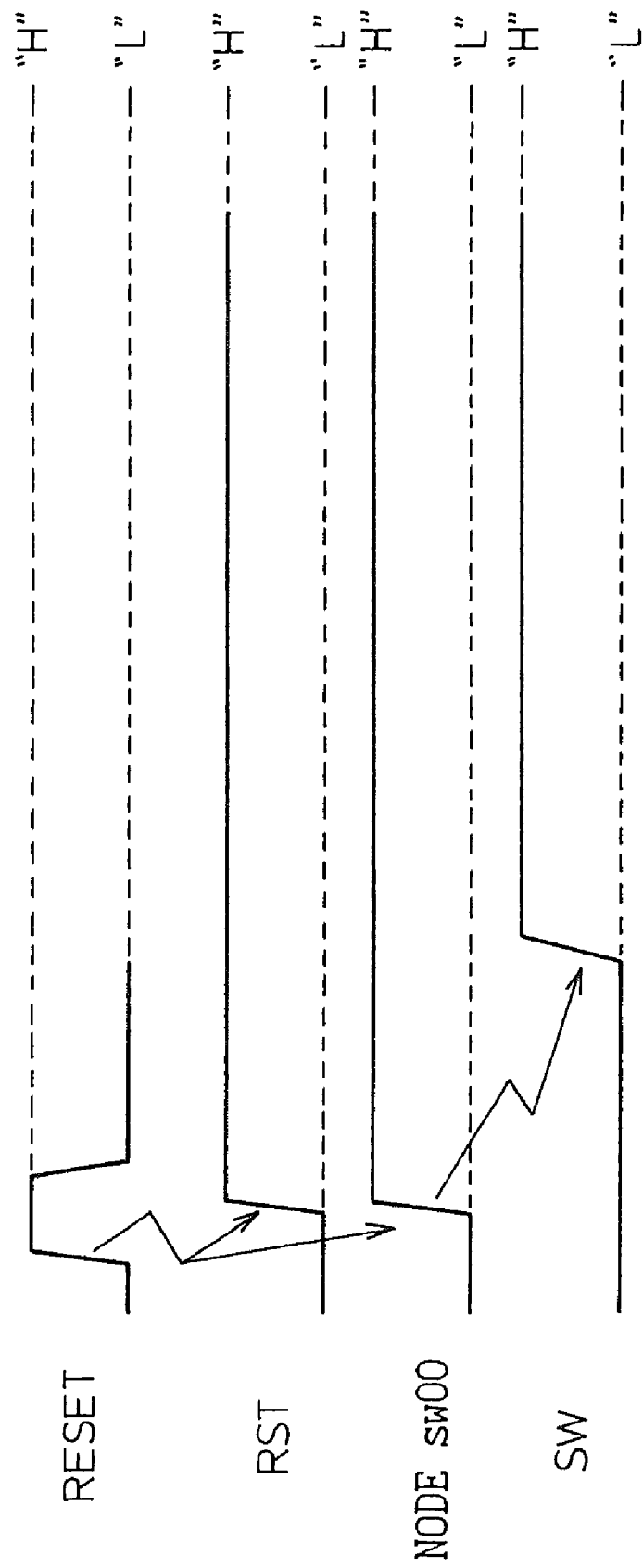
FIG. 18 is a timing chart useful for explaining the operation of the reset level switching control timing circuit shown in FIG. 17.

FIG. 17 is a block circuit diagram showing the construction of the reset level control timing circuit used in the embodiment of the present invention, and FIG. 18 is a timing chart useful for explaining the operation of the reset level switch control timing circuit shown in FIG. 17.

FIG. 17 shows the construction of the reset level switch control timing circuit for executing a method which simulates and controls the period in which the potential of the word line drops sufficiently, as the first method of executing the control so as to attain the relation node n02="Vii" at the time of the reset operation after the potential of the word line has sufficiently dropped. FIG. 18 shows the signal waveform at each portion of the reset level switch control timing circuit shown in FIG. 17.

In FIG. 17, further, symbol RESET represents the signal that is outputted when the semiconductor device receives the reset command, symbol RST represents the signal as a trigger for resetting the word line drive circuit which is specifically handled in the present invention (for example, the select signal MWL in FIG. 6, and the signal at the node n01 in FIG. 8), and symbol SW represents the reset level switch signal. The reset level switch control timing circuit shown in FIG. 17 includes a logic unit 7 to which the signal RESET is inputted, and a control signal delay unit 8 which imparts a predetermined delay to the control signal outputted from the node sw00 of this logic unit. This control signal delay unit 8 imparts a desired delay amount to the control signal by the combination of inverters 81i to 84i, capacitors 81 to 83 and resistors 84 to 86.

As is obvious from the timing chart of FIG. 18, when the signal RESET is inputted to the logic unit 7 shown in FIG. 17, the logic unit 7 executes various logic operations and outputs the signal RST, so that the reset operation of the word line is started. At the same time, the control signal is outputted from the node sw00 of the logic unit 7, which passes through the control signal delay unit 8 that is set in advance to the period in which the level of the word line sufficiently drops. The control signal propagating to the control signal delay unit 8 is outputted as the switch signal SW of the reset level switch circuit. The switch signal SW outputted in this way is supplied as the reset potential switch control signal to the node n02 shown in FIG. 6 or 8.

Figure 19:
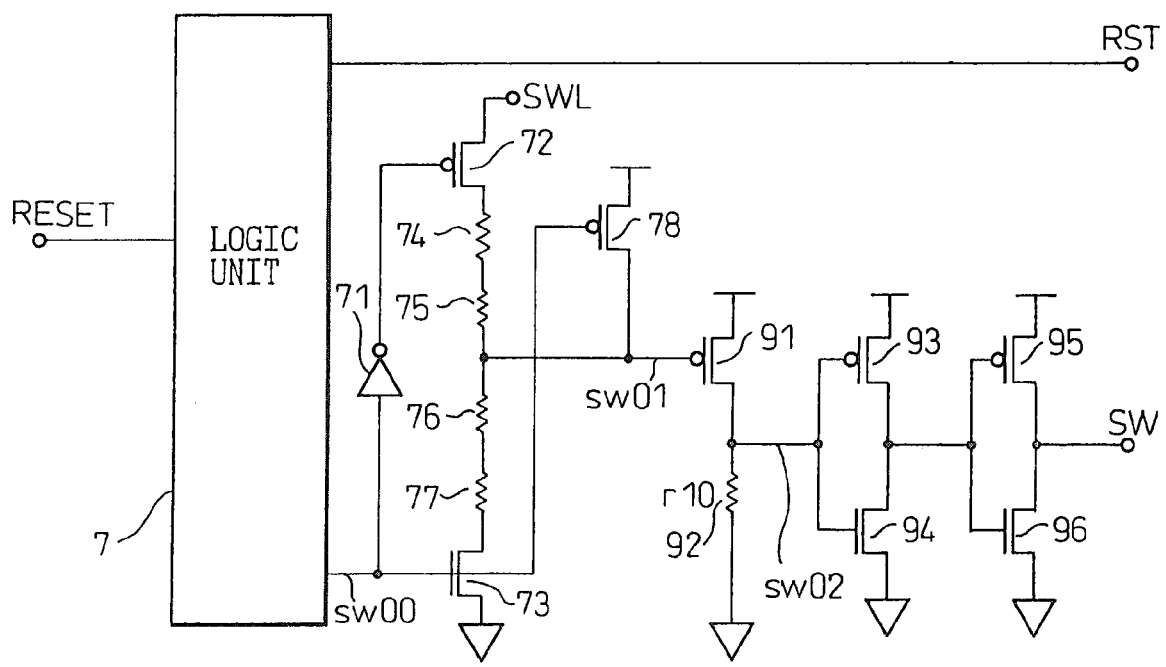
FIG. 19 is a block circuit diagram showing the construction of a word line potential judging circuit used in the embodiment of the present invention.
Figure 20:
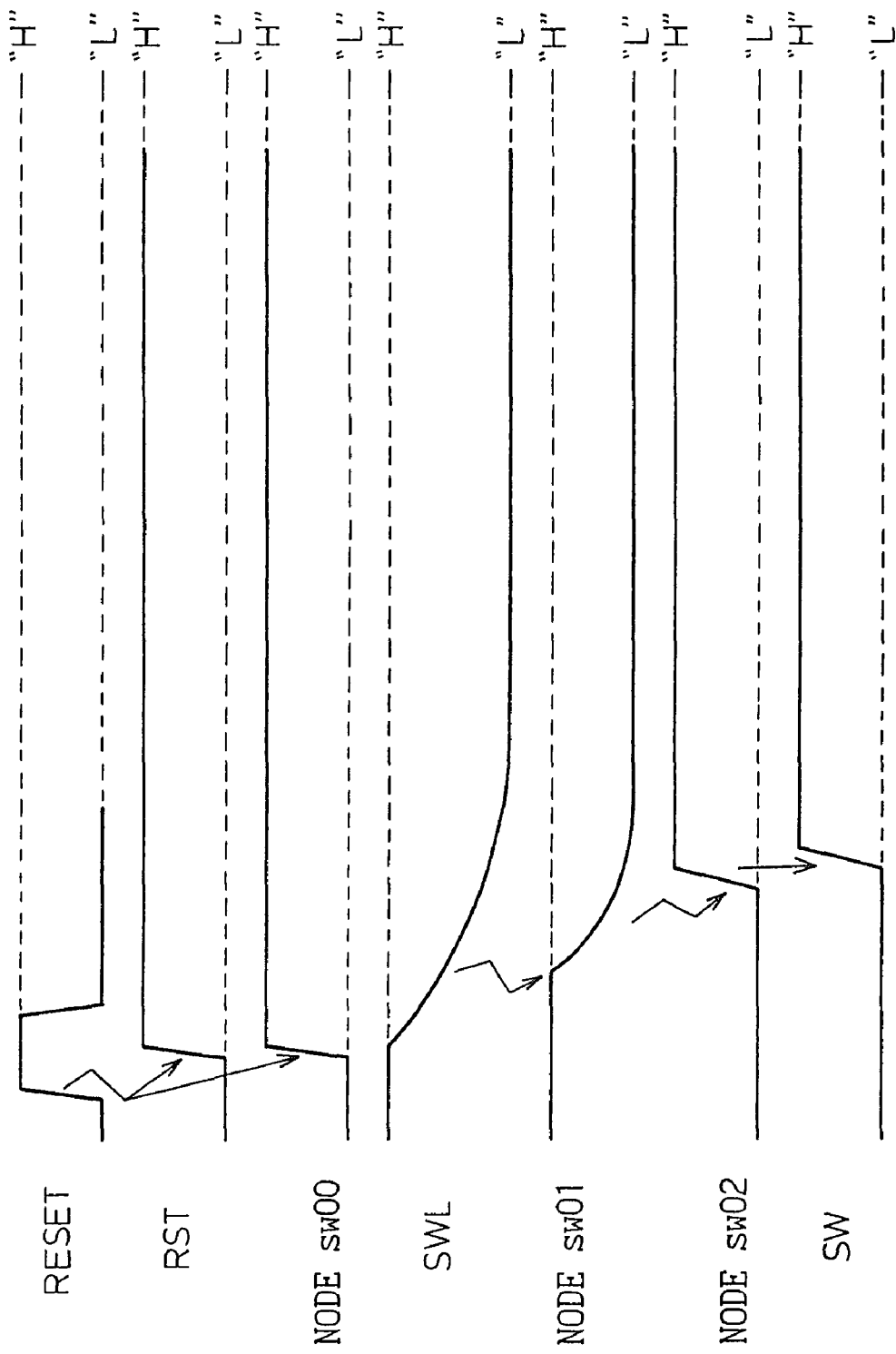
FIG. 20 is a timing chart useful for explaining the operation of the word line potential judging circuit shown in FIG. 19.

FIG. 19 is a block circuit diagram showing the construction of the word line potential judging circuit used for the embodiment of the present invention, and FIG. 20 is a timing chart useful for explaining the operation of the word line potential judging circuit shown in FIG. 19.

FIG. 19 shows the construction of the word line potential judging circuit for executing the method, that automatically changes the potential of the node n02 by supervising the potential of the word line in the semiconductor device, as the second method for executing the control so as to attain the relation node n02="Vii" during the reset operation of the word line after the potential of this word line has sufficiently dropped. FIG. 20 shows the signal waveform of each portion of the word line potential judging circuit shown in FIG. 19.

The word line potential judging circuit shown in FIG. 19 includes a logic unit 7 to which the signal RESET is inputted, a frequency dividing circuit unit for frequency-dividing the control signal outputted from the node sw00 of this logic unit and obtaining a signal of a predetermined level, a resistor 92 as the reference of the potential judgement of the word line, three P-channel transistors 91, 93 and 95, and two N-channel transistors 94 and 96. The frequency dividing circuit unit includes four voltage-dividing resistors 74 to 77, a P-channel transistor 72, an N-channel transistor 73, and an inverter 71 interposed between the gate of the P-channel transistor 72 and the gate of the N-channel transistor 73.

As is obvious from the timing chart of FIG. 20, when the signal RESET is inputted to the logic unit 7 shown in FIG. 19, the logic unit 7 executes various logic operations and outputs the signal RST, so that the reset operation of the word line is started. At the same time, the control is outputted from the node sw00 of the logic unit 7 and starts monitoring the potential of the word line. In this case, the potential, the voltage of which is divided by the resistance ratio of the four voltage-dividing resistors 74 to 77, can be obtained at the node sw01.

The potential at the node sw02 can be obtained depending on the resistance ratio between the ON resistance of the P-channel transistor 91, which is controlled by the level of the node sw01, and the resistance (r10) of the resistor 92, and the potential of this node sw02 operates the inverter of the next stage.

Here, when the potential of the word line is high, the node sw01 exists at the level which is recognized as "H". In consequence, the node sw02 is "L" and the switch signal SW is "L", too. Next, when the potential of the word line drops sufficiently, the potential of the node sw01 drops to a level which is recognized as "L", and brings the P-channel transistor 91 of the next stage into the operative state. At this time, the ON resistance of the P-channel transistor 91 is sufficiently smaller than the resistance value r10 of the resistor 92 and the node sw02 is "H". As a result, the switch signal SW changes to "H". The switch signal SW, which changes from "L" to "H" in this way, is supplied as the reset potential switch control signal to the node n02 shown in FIG. 6 or 8.

First, according to the semiconductor devices of the first to third embodiments of the present invention as explained above, the reset level for executing the reset operation of the word line connected to the memory cell is switched between the first potential, such as the ground potential, and the second potential, such as the negative potential. In consequence, the major proportion of the charges held by the node of the word line are allowed to escape to the power source of the ground potential, the amount of the charges allowed to be escape to the power source of the negative potential, which has low power source efficiency, can be drastically reduced, and power consumption can be reduced drastically.

Next, the semiconductor devices of the first to third embodiments of the present invention include the reset level switch circuit unit for switching the first and second potentials of the reset level inside the word line drive circuit. Therefore, the major proportion of the charges held by the node of the word line can be extracted directly to the power source of the ground potential, and the reset operation can be carried out stably without being affected by the threshold voltages of the transistors.

In the semiconductor devices of the first to third embodiments of the present invention, the reset level switch circuit for switching the first and second potentials of the reset level is disposed separately from the word line drive circuit. Therefore, the unoccupied space on the semiconductor chip can be utilized effectively, and the area of the semiconductor chip can be limited to a minimum.

In the fourth place, in the semiconductor devices according to the first to third embodiments, a plurality of word drive circuits share the reset level switch circuit and the switching operation of the first and second potentials of the reset level is collectively executed. Therefore, unnecessary consumption of power by the reset level switch circuit can be restricted.

In the fifth place, in the semiconductor devices according to the first to third embodiments of the present invention, the switching operation to the ground potential of the reset level is executed before the start of the reset operation of the word line and in this way, the major proportion of the charges held by the node of the word line are allowed to escape to the power source of the ground potential. Consequently, power consumption can be drastically saved.

In the sixth place, in the semiconductor devices according to the first to third embodiments of the present invention, the switching operation of the reset level to the negative potential is executed after the level of the word line has dropped sufficiently. Therefore, the amount of the charges caused to escape to the negative power source having low power source efficiency can be drastically decreased and power consumption can be saved drastically.

In the seventh place, according to the first to third embodiments of the present invention, the switching operation of the reset level between the first and second potentials can be executed by using the activation signal and the non-activation signal of the sense amplifier provided to the memory cell array. Therefore, the control signal need not be applied for switching the reset level, and the increase in power consumption resulting from an excessive circuit operation by this control signal, can be restricted.

Next, some preferred embodiments for accomplishing the second object of the present invention will be explained.

When the semiconductor device comprises a plurality of banks, the word line reset level generating circuit comprises a plurality of circuit units, that correspond to a plurality of banks and can operate independently, and these circuit units are selected in accordance with the operation of the memory cell array.

Figure 21:
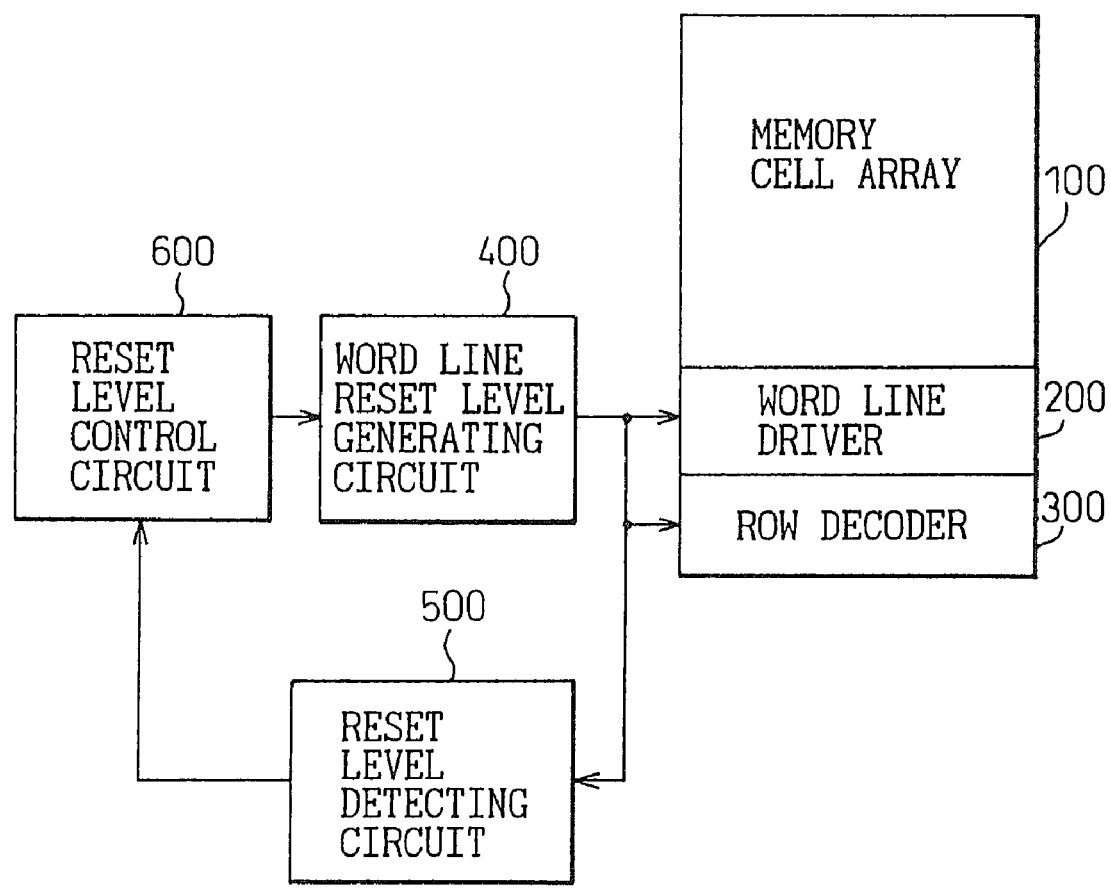
FIG. 21 is a block diagram showing the construction of a basic embodiment on the basis of the basic principle for accomplishing the second object.

It is practically preferred to supervise the output state of the word line reset level generating circuit and to execute the feed-back control. FIG. 21 is a block diagram showing the construction of the basic embodiment based on the principle for accomplishing the second object of this invention. As shown in this drawing, a WL (word line) reset level generating circuit 400 is disposed in addition to the memory cell array 100, the word line driver 200 and the row decoder 300. Furthermore, the semiconductor device of this embodiment is provided with a reset level detecting circuit 500 for detecting the output state of the word line reset level generating circuit and a reset level control circuit 600 for controlling the operation of the word line reset level generating circuit on the basis of the detection result of the reset level detecting circuit. In this case, the reset level control circuit is allowed to operate in such a manner that the operation of the word line reset level generating circuit stops when its output is below a first predetermined voltage, the amount of the current supply of the word line reset level generating circuit becomes maximal when its output exceeds a second predetermined voltage, and the amount of the current supply of the word line reset level generating circuit is controlled in accordance with the access operation to the memory cell array when its output is in between the first and second predetermined voltages.

When the word line reset level generating circuit includes an oscillation circuit, a capacitor and a capacitor drive circuit for driving the capacitor, the high potential side power source potential of the capacitor drive circuit is set to a potential higher than, or equal to, or lower than, the higher potential of the power source of the oscillation circuit in accordance with stability of the external power source, its voltage condition, and so forth. The oscillation signal outputted from the oscillation circuit and applied to the capacitor through the capacitor drive circuit is a single signal, or a plurality of signals in some cases.

When the word line reset level generating circuit includes an oscillation circuit, a capacitor and a capacitor drive circuit for driving the capacitor, the semiconductor device is provided with a power source switch circuit for switching the connection of the power source line of higher potential of the capacitor among a plurality of power source lines having different potentials, and changes the supply amount of the word line reset level generating circuit. In this case, the power source switching circuit is switched between the power source line having a potential higher than the higher potential of the power source of the oscillation circuit and the power source line having a potential equal to the higher potential of the power source, or between the power source line having a potential equal to the higher potential of the power source of the oscillation circuit and the power source having a lower potential.

Another method of changing the amount of the current supply of the word line reset level generating circuit comprises the steps of disposing a plurality of oscillation circuits for outputting oscillation signals having different frequencies and a selection circuit for selecting the oscillation signal from a plurality of oscillation circuits to be supplied to the capacitor drive circuit, and changing the frequency of the capacitor drive signal.

Still another method of changing the amount of the current supply of the word line reset level generating circuit comprises the steps of constituting the capacitor and the capacitor drive circuit into a plurality of units, disposing a switch for switching the input to each capacitor drive circuit unit and switching the switch in accordance with the operation of the memory cell array.

The methods described above can be used in combination as the method of changing the amount of the current supply of the word line reset level generating circuit.

The operation becomes stable if an internal regulator circuit for down-converting the power source voltage supplied from outside is used as the power source for the oscillation circuit.

Figure 22:
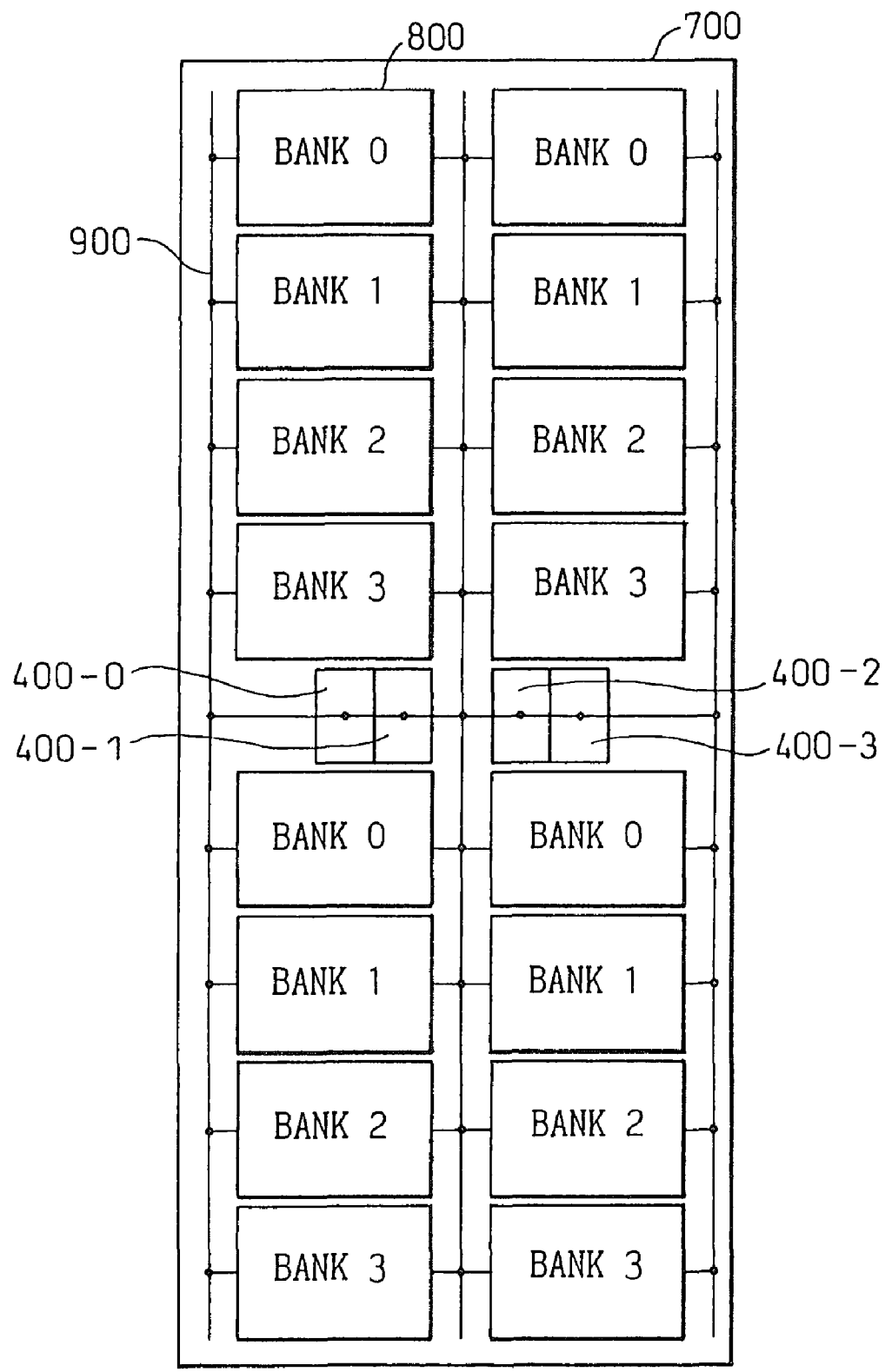
FIG. 22 is a block diagram showing the bank construction of a DRAM according to the fourth embodiment of the present invention.

FIG. 22 is a block diagram showing the bank construction of the DRAM chip 700 of the fourth embodiment of the present invention and the disposition of the WL reset level generating circuit inside the chip 700. As shown in the drawing, the memory cell is divided into 16 blocks. Inside each block are disposed the word line, the bit line, the memory cell, the sense amplifier, the word decoder, the word driver, the column decoder, the data amplifier, the write amplifier, etc., in the same way as in the ordinary DRAM. These sixteen blocks are grouped into four banks, and the blocks of the same bank are accessed in parallel. In this example, therefore, four blocks are accessed in parallel with one another. Since eight memory cells are accessed in parallel in each block, the data width is a 32-bit width.

The WL reset level generating circuit, too, comprises four circuit units 400-0 to 400-3 corresponding to the number of banks, and these circuit units are disposed at the center of the chip 700. The negative potentials generated by the circuit units 400-0 to 400-3 are supplied to each block through a wiring 900. Incidentally, the arrangement illustrated hereby is an example, and various modifications can be made. Furthermore, the number of banks and their arrangement, too, can be modified, and various arrangements can be employed. Incidentally, the reset level detecting circuit and the reset level control circuit are not shown in FIG. 22 but they are disposed in the proximity of the circuit units 400-0 to 400-3 of the WL reset level generating circuit.

Figure 23:
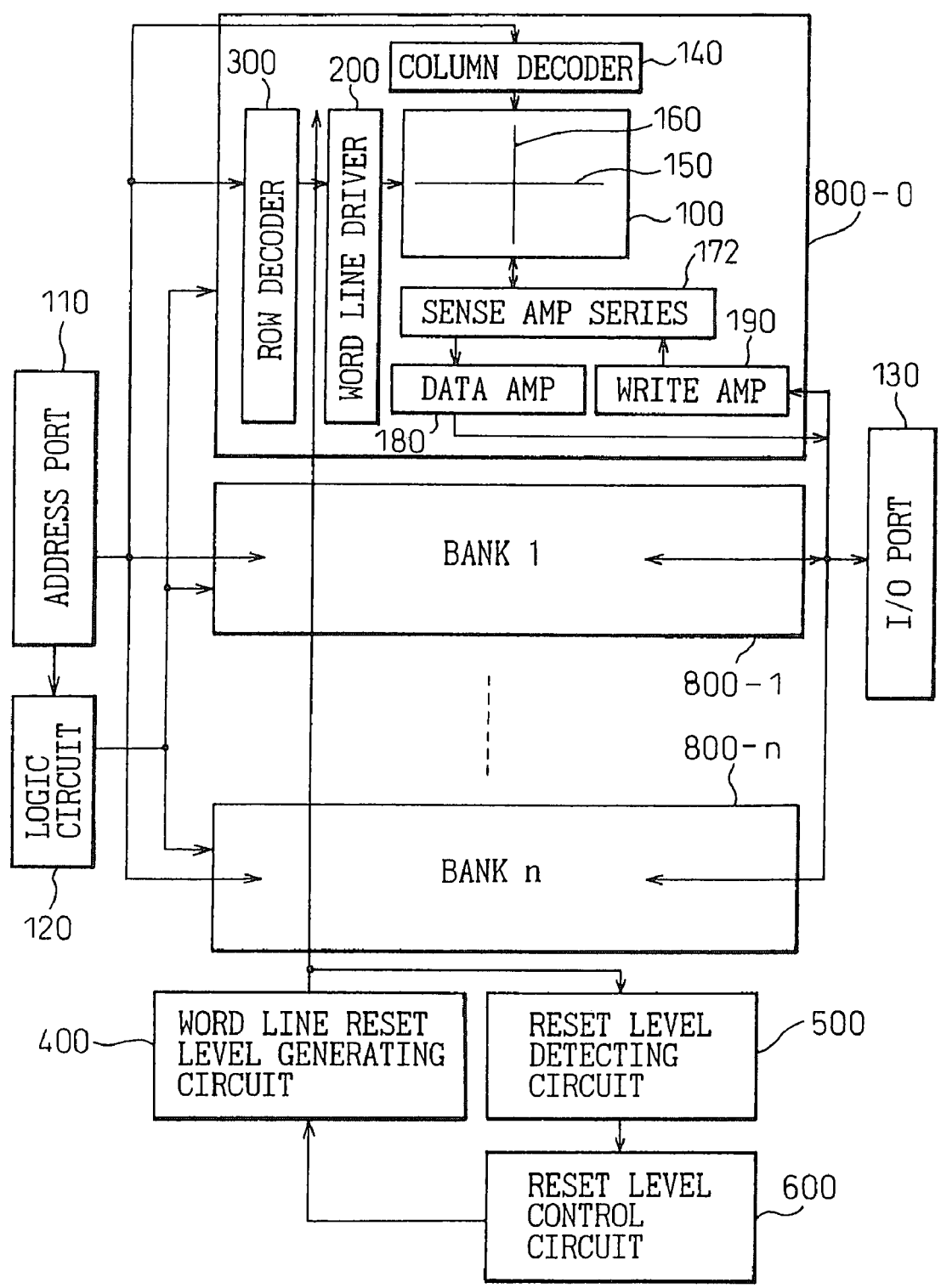
FIG. 23 is a block diagram showing the construction of the DRAM according to the fourth embodiment.

FIG. 23 is a block diagram showing the functional construction of the DRAM according to the fourth embodiment. As shown in the drawing, the address signal inputted from an address port 110 is supplied to the row decoder 300 and the column decoder 140 of each bank. The row selection signal outputted from the row decoder 300 is applied to each word line 150 through the word line driver 200, and activates the word line (selected word line) connected to the memory cell to which access is made. Other word lines (non-selected word lines) are kept under the non-activated state. The column selection signal outputted from the column decoder 140 is applied to the sense amplifier series 172 and activates the sense amplifier connected to the bit line to which the memory cell to be accessed is connected. Other sense amplifiers are kept under the non-activated state. The address signal and the control signal (not shown in the drawing) that are inputted are supplied to the logic circuit 120, and the internal control signals generated in this logic circuit 120 are supplied to each bank. In the data write operation, the write data inputted to the I/O port 130 is supplied to the sense amplifier series 172 through the write amplifier 190, and the sense amplifier so activated sets the bit line to the state corresponding to the write data. The memory cell connected to the selected word line enters the state corresponding to the state of this bit line. In the data read-out operation, the state of the bit line changes in accordance with the state of the memory cell connected to the selected word line, and this state is amplified by the sense amplifier that is activated. The data amplifier 180 outputs this state to the I/O port 130. The explanation given above explains the general construction according to the prior art.

The DRAM according to the fourth embodiment includes the WL (word line) reset level generating circuit 400, the reset level detecting circuit 500 and the reset level control circuit 600, as shown in the drawing. The WL reset level generating circuit 400 supplies the negative potential output to the word line driver 200 and the row decoder 300 of each block. The reset level detecting circuit 500 detects the level of the negative potential output of the WL reset level generating circuit 400 and outputs the detection result to the reset level control circuit 600. The reset level control circuit 600 controls the negative potential generating operation of the WL reset level generating circuit 400 on the basis of the detection result.

Figure 24:
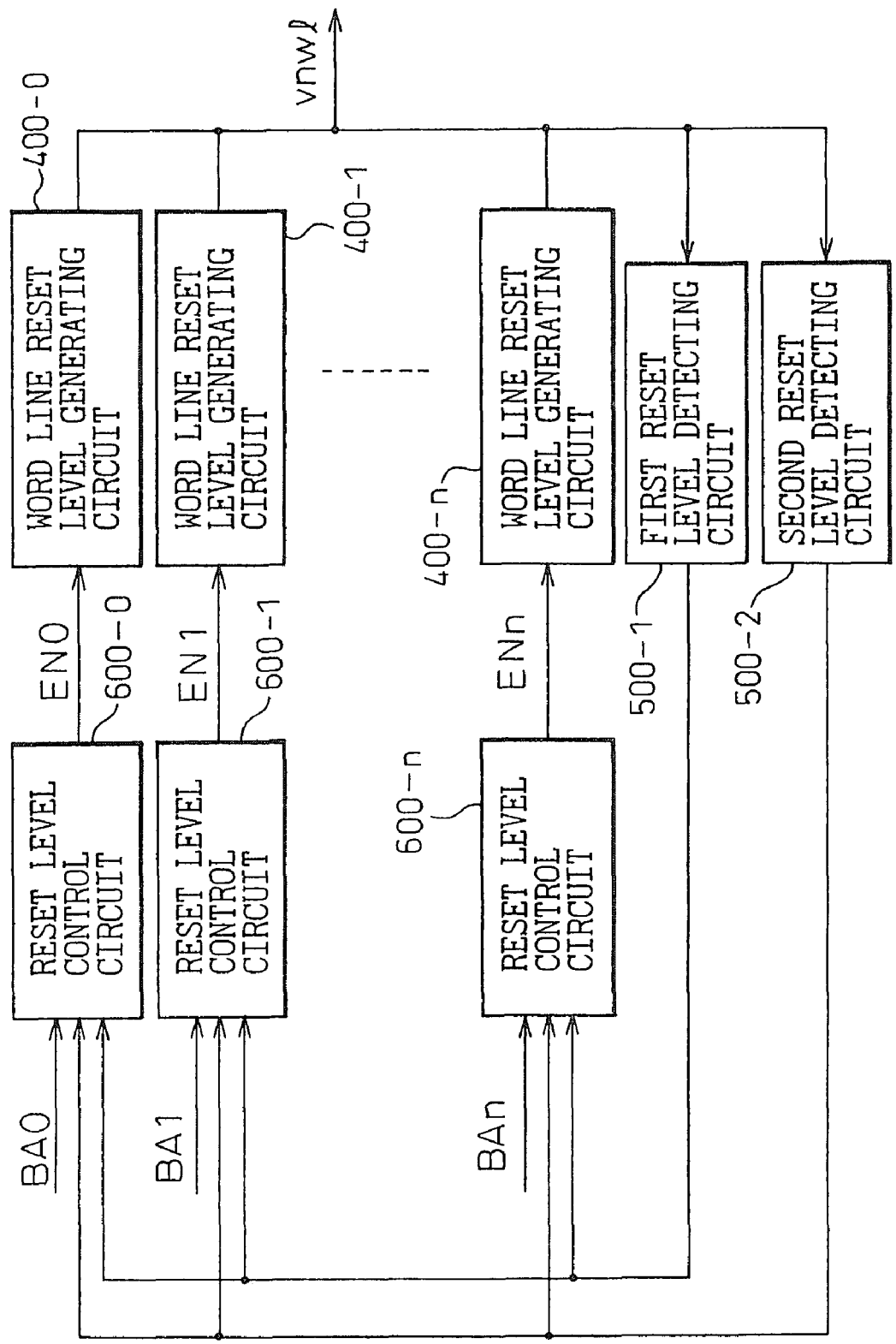
FIG. 24 is a block diagram showing the construction relating to the generation and control of a WL reset level in the fourth embodiment.

FIG. 24 is a block diagram showing in further detail the constructions of the WL reset level generating circuit 400, the reset level detecting circuit 500 and the reset level control circuit 600 of the fourth embodiment. As shown in the drawing, the WL reset level generating circuit 400 comprises n WL reset level generating circuit units (hereinafter referred to as the "generating circuit units") 400-0 to 400-$n$, and the reset level control circuit 600 comprises n reset level control circuit units (hereinafter referred to as the "control circuit units") 600-0 to 600-$n$, too. In the fourth embodiment, n represents the bank number and is, for example, 4. The control circuit units 600-0 to 600-$n$ and the generating circuit units 400-0 to 400-$n$ constitute pairs, respectively, and each control circuit unit 600-0 to 600-$n$ generates the control signal EN0 to ENn that changes over the corresponding generating circuit unit 400-0 to 400-$n$ between the operating state and the non-operating state. The outputs of the generating circuit units 400-0 to 400-$n$ are connected in common, and are outputted as the negative potential output vnwl. The reset level detecting circuit 500 comprises the first reset level detecting circuit 500-1, that detects whether or not the negative potential output vnwl is below the first reference level V4 and outputs the V4 detection signal, and the second reset level detecting circuit 500-2 that detects whether or not the negative potential output vnwl is above the second reference level V5 and outputs the V5 detection signal. The detection results of the first and second reset level detecting circuits 500-1 and 500-2 are inputted to each control circuit unit 600-0 to 600-$n$. Each control circuit unit 600-0 to 600-$n$ generates the control signal EN0 to ENn on the basis of the V4 and V5 detection signals and the bank selection signal BA.

Figure 25:
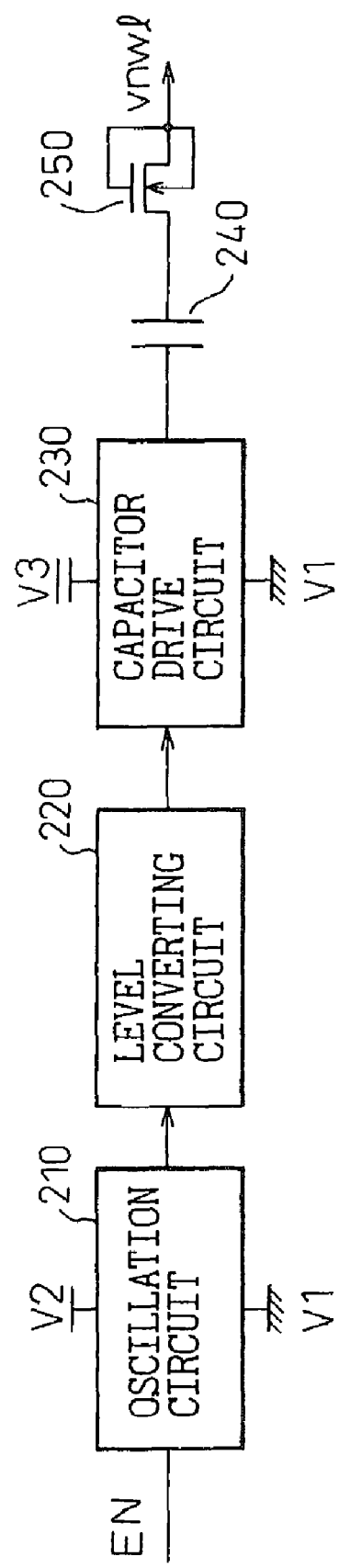
FIG. 25 is a block diagram showing the construction of a WL reset level generating circuit in the fourth embodiment.

FIG. 25 is a block circuit diagram showing the construction of each generating circuit unit 400-0 to 400-$n$. As shown in this drawing, each generating circuit unit includes the oscillation circuit 210, the level converting circuit 220, the capacitor drive circuit 230, the capacitor 240 and the output circuit (transistor) 250. The operation of the oscillation circuit 210 is controlled by the control signal EN from each control circuit unit 600-0 to 600-$n$. A voltage corresponding to the higher potential of the power source of the oscillation circuit 210 is V2 and a voltage corresponding to the higher potential of the power source of the capacitor drive circuit 230 is V3. The voltages of these two circuits are mutually different. For this reason, the level converting circuit 220 is disposed. The power source (V3) of the capacitor drive circuit 230 is the power source supplied from outside, for example, and the power source (V2) of the oscillation circuit 210 is the power source obtained by regulated voltage power source in the chip.

Figure 26A:
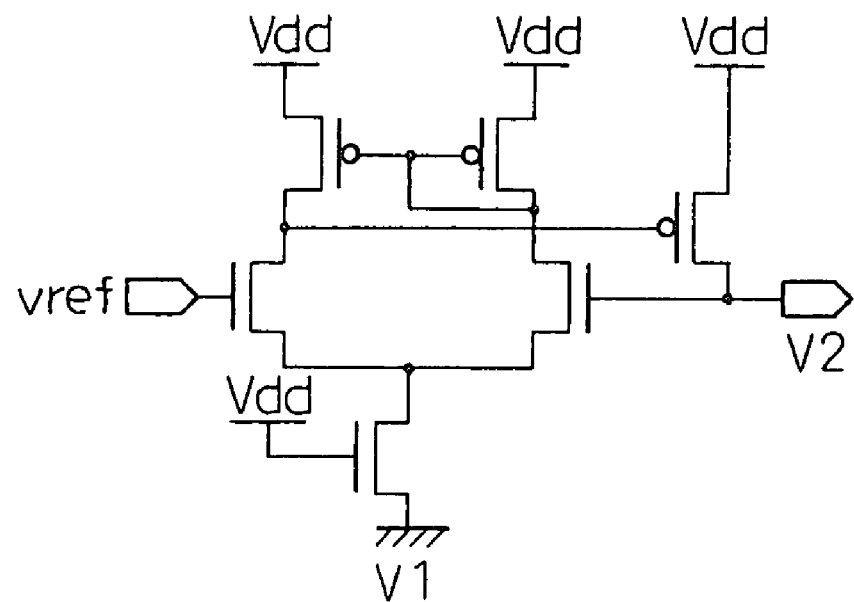
FIGS. 26A and 26B are circuit diagrams each showing a structural example of an internal regulator circuit.
Figure 26B:
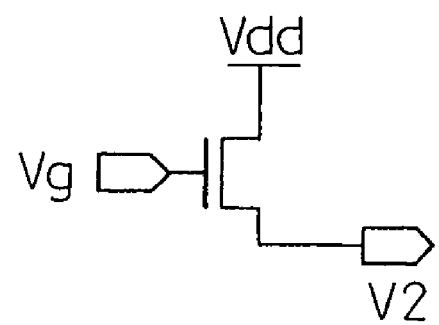

FIGS. 26A and 26B show structural examples of the internal regulator circuit, wherein Vdd represents the external power supply and V2 does the internally regulated voltage. Therefore, Vdd corresponds to V3 in the fourth embodiment. The circuit shown in FIG. 26A uses a negative feedback circuit that uses in turn a driver of a P-channel transistor, and outputs a potential equal to vref as V2. Therefore, if an accurate potential generated by a constant potential power source is used as vref, a stable internally regulated power source (V2) can be obtained even when the external power supply Vdd fluctuates. FIG. 26B shows a regulator circuit using an N-channel transistor. When the gate voltage of the N-channel transistor is Vg, V2 is Vg–Vth (threshold voltage of the transistor). Similarly, if an accurate potential generated by the constant potential is used as Vg, a stable internally regulated voltage V2 can be obtained even when the external power supply Vdd fluctuates. If the internally regulated voltage V2 is stable, the cycle of the oscillation signal generated by the oscillation circuit 210 can be stabilized. Since the voltage V3 is higher than the internally regulated voltage V2, the current supply capacity of the vnwl generating circuit can be increased and the increase of the chip area can be suppressed. Incidentally, the on-chip regulator can be used as V3, too, and furthermore, V2 can be made equal to V3. In this case, the level converting circuit 220 can be omitted.

Figure 27:
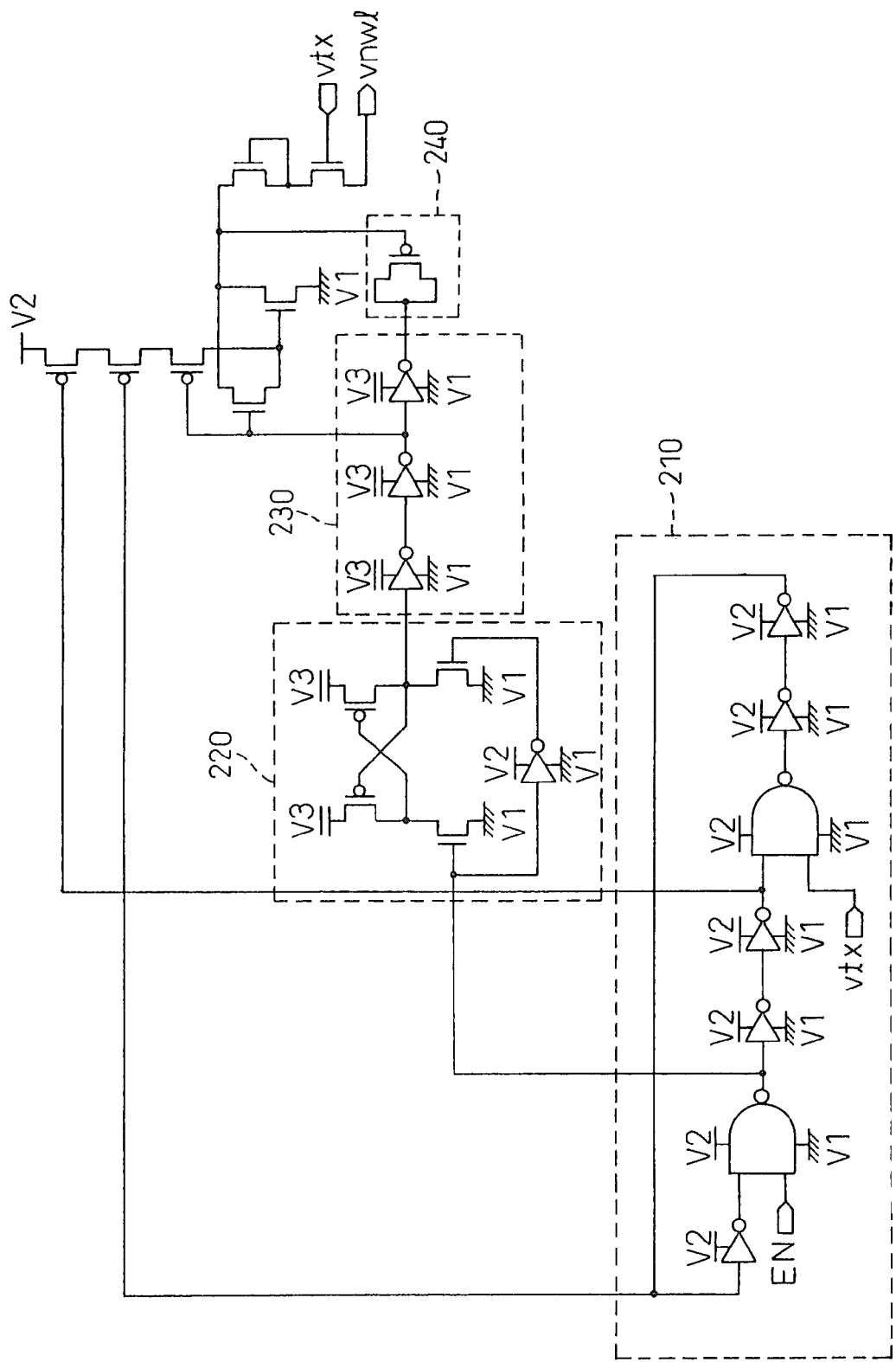
FIG. 27 is a circuit diagram showing a concrete structural example of the WL reset level generating circuit of the fourth embodiment.

FIG. 27 is a circuit diagram showing a concrete circuit construction of the WL reset level generating circuit unit of the fourth embodiment. Because the construction of each of the oscillation circuit 210, the level converting circuit 220, the capacitor drive circuit 230, the capacitor 249 and the output circuit is well known, a detailed description will be omitted. The control signal EN is inputted to the NAND gate of the second stage of the oscillation circuit 210 so that the operation of the oscillation circuit can be controlled. Incidentally, the control signal vtx inputted to the NAND gate of the fifth stage of the oscillation circuit and to the output portion is the external control signal, and is used for compulsively stopping the WL reset level generating circuit irrespective of the EN signal. As shown in the drawing, the power source of the oscillation circuit 210 is V2, and the power source of the capacitor drive circuit 230 is V3 which is higher than V2. Therefore, the oscillation signal of the oscillation circuit 210 is converted by the level converting circuit 220 to the level corresponding to V3 and is then applied to the capacitor drive circuit 230.

Figure 28:
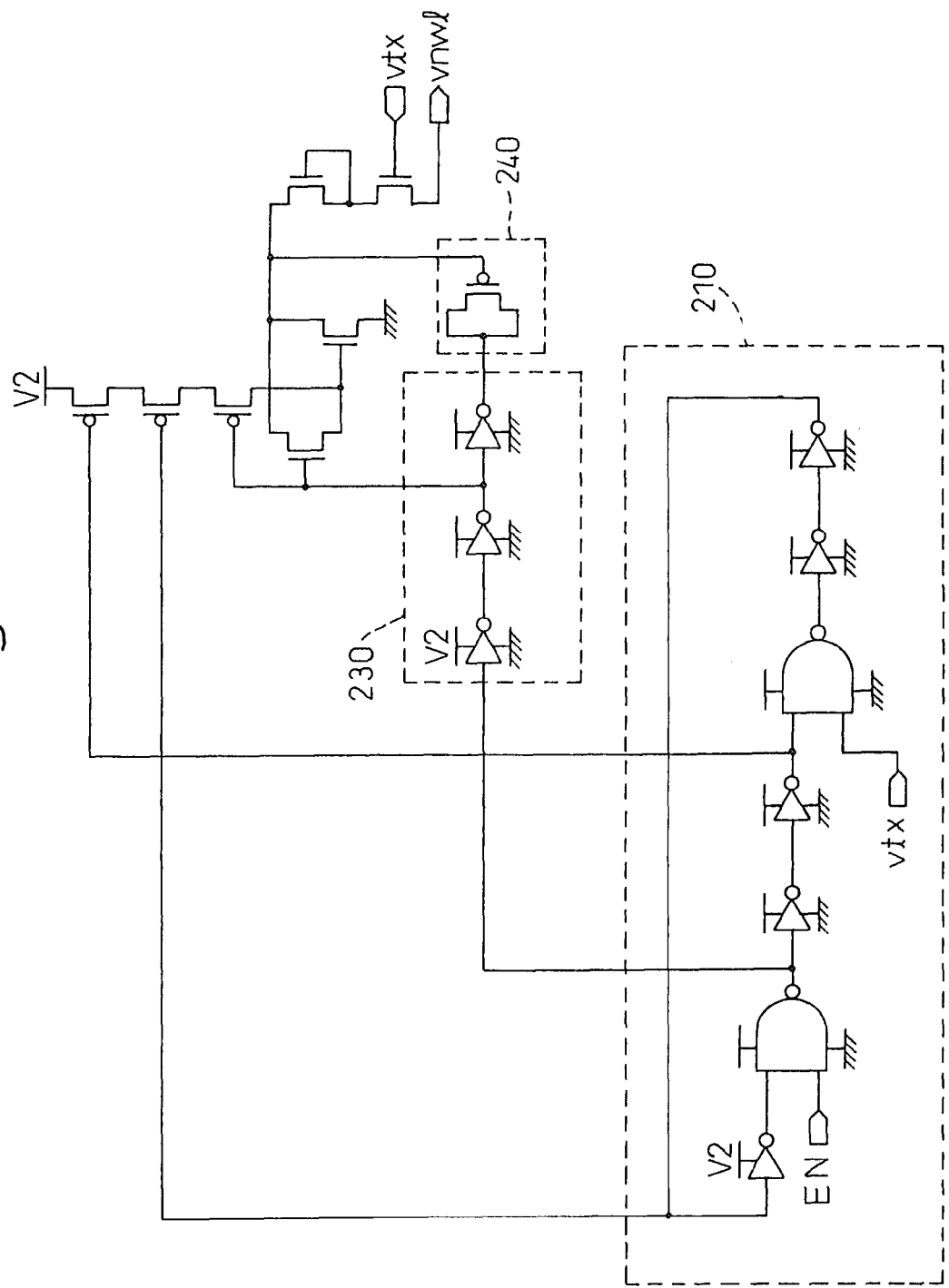
FIG. 28 is a circuit diagram showing another structural example of the WL reset level generating circuit of the fourth embodiment.

FIG. 28 is a circuit diagram showing the circuit construction of a modified example of the WL reset level generating circuit unit. The circuit shown in FIG. 28 uses in common the internally regulated power source (V2) for both the oscillation circuit 210 and the capacitor drive circuit 230. The level converting circuit 220 is deleted because it is not necessary. The rest of the constructions are the same as those shown in FIG. 27.

Figure 29:
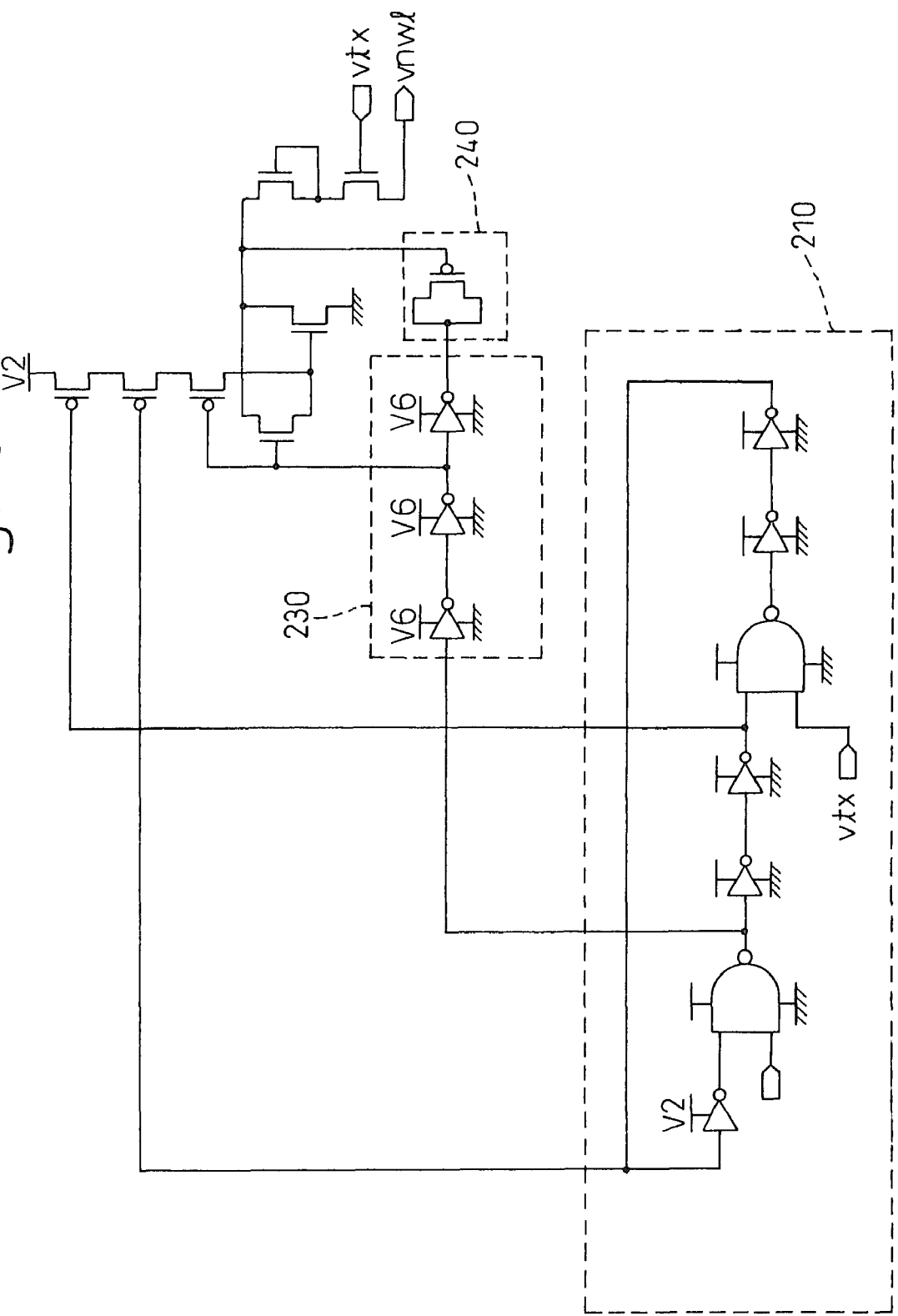
FIG. 29 is a circuit diagram showing another structural example of the WL reset level generating circuit of the fourth embodiment.
Figure 30A:
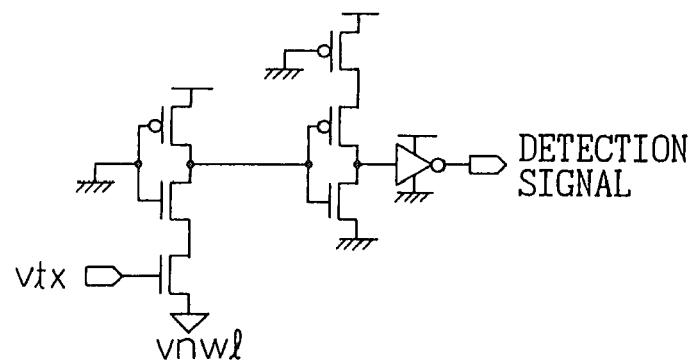
FIGS. 30A, 30B, 30C and 30D are circuit diagrams each showing a structural example of a WL reset level detecting circuit.
Figure 30B:
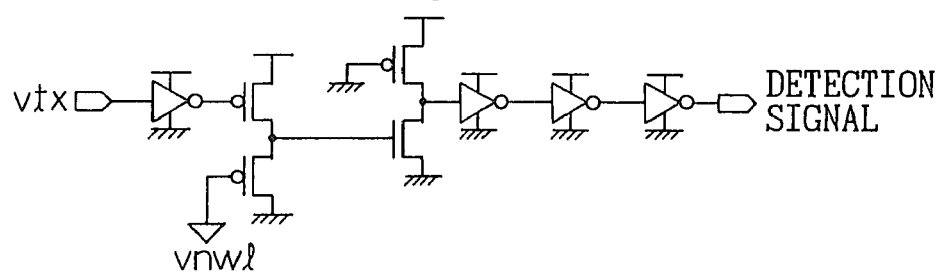
Figure 30C:
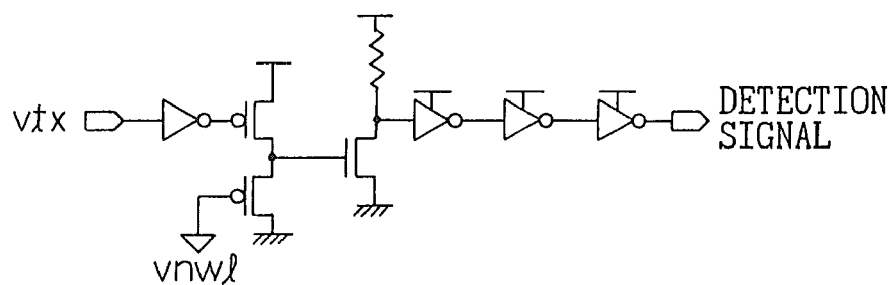
Figure 30D:
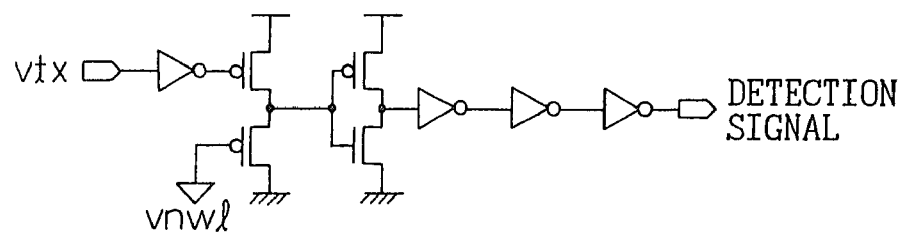

FIG. 29 is a circuit diagram showing the circuit construction of another modified example of the WL reset level generating circuit unit. The circuit shown in FIG. 29 uses a power source (V6) lower than the power source (V2) of the oscillation circuit 210 as the power source of the capacitor drive circuit 230. Since V6 is lower than V2, the capacitor drive circuit 230 can be driven by the output of the oscillation circuit 210 without using the level converting circuit 220. The rest of the constructions are the same as those shown in FIG. 27.

FIGS. 30A to 30D show the circuit constructions of the WL reset level detecting circuit. Any of the circuits shown in FIGS. 30A to 30D can detect whether the negative potential output vnwl is higher, or lower, than a predetermined level. Since this predetermined level varies with the size of the transistors that constitute the circuit, the circuit can be constituted into the first reset level detecting circuit 500-1 for detecting whether or not the negative potential output vnwl is below the first reference level V4, or into the second reset level detecting circuit 500-2 for detecting whether or not the negative potential vnwl is higher than the second reference level V5. Incidentally, the control signal vtx for compulsively stopping the circuit from outside is inputted to this circuit, too.

Figure 31:
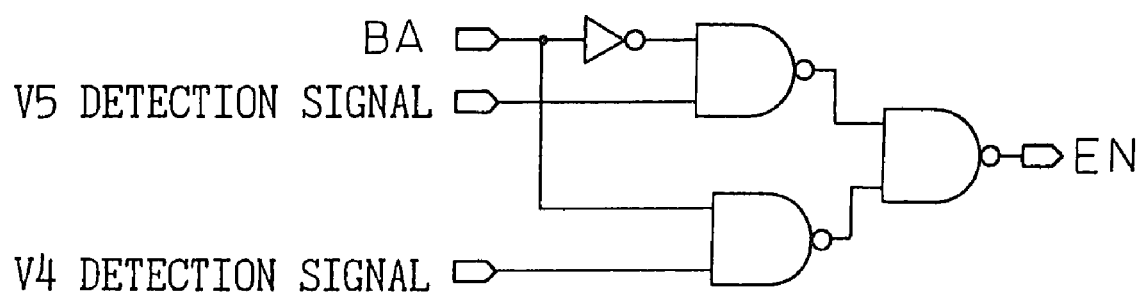
FIG. 31 is a circuit diagram showing the construction of the reset level control circuit of the fourth embodiment.
Figure 32:
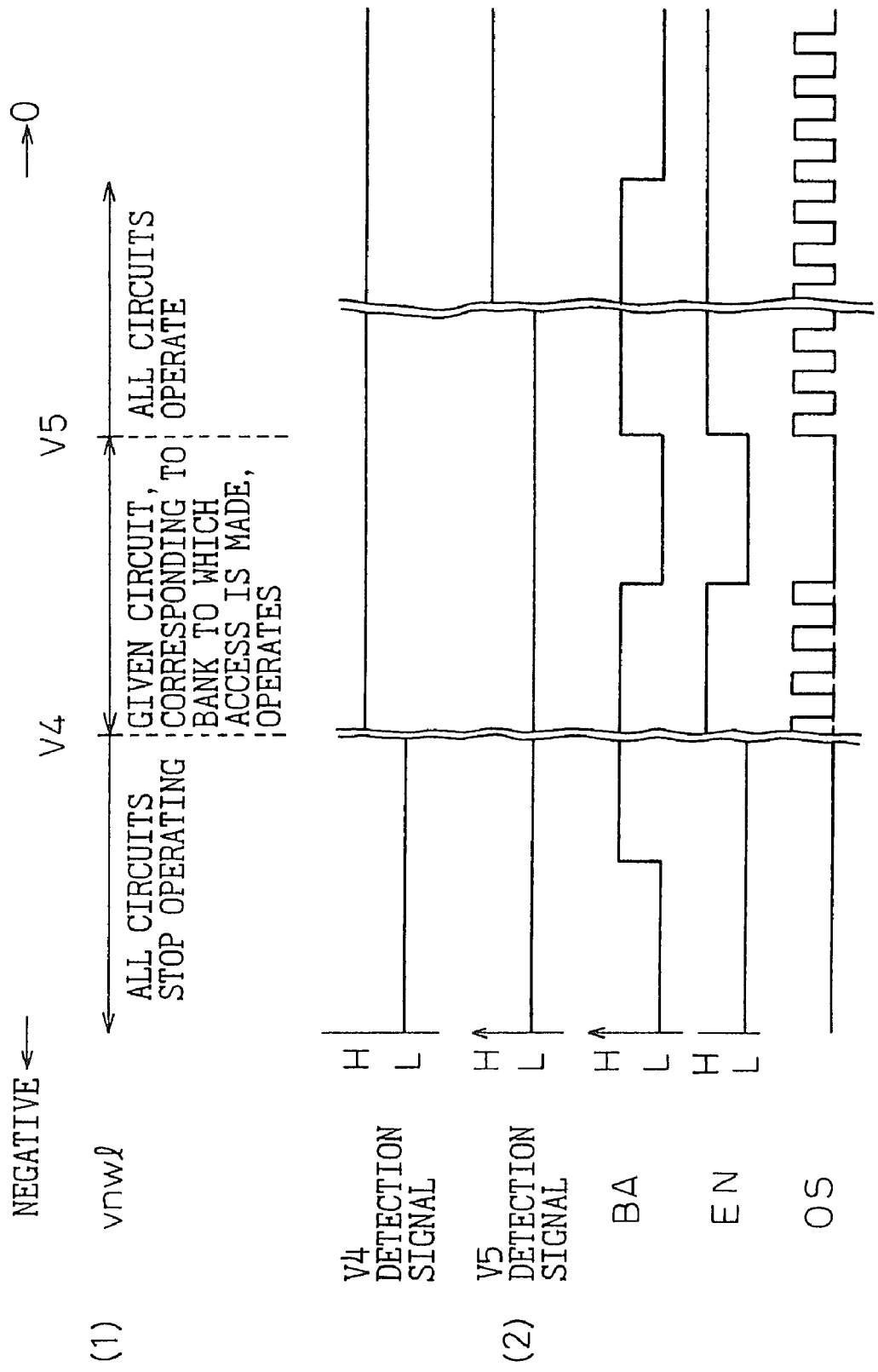
FIG. 32 is a timing chart useful for explaining a reset level controlling method in the fourth embodiment.

FIG. 31 is a circuit diagram showing the circuit construction of the reset level control circuit units 600-0 to 600-n, and FIG. 32 is a timing chart useful for explaining the control operation of the WL reset level control circuit unit. As shown in a portion (1) of FIG. 32, the level of the negative potential is sufficient when the negative potential vnwl is lower than V4. Since the voltage need not be generated any more, the operations of all the generating circuit units 400-0 to 400-n are stopped. Since the level of the negative potential is insufficient when the negative potential vnwl is higher than V5, all the generating circuit units 400-0 to 400-n are operated. Since the level of the negative potential vnwl is neither insufficient nor sufficient when the negative potential vnwl is higher than V4 and lower than V5, the generating circuit unit corresponding to the bank, to which access is made, is operated in accordance with the access operation of the memory cell array, or more concretely, in accordance with the access operation of the bank. As shown in a portion (2) of FIG. 32, both V4 and V5 are "L" when the negative potential vnwl is lower than V4, EN is "L" irrespective of the bank selection signal BA, and the oscillation signal OS is not outputted from the oscillation circuit 210. When the negative potential output vnwl is higher than V4 and lower than V5, V4 is "H" while V5 is "L". When the bank selection signal BA is "H", EN is "H". When BA is "L", EN is "L", and the oscillation signal OS is outputted from the oscillation circuit 210 in accordance with BA. When the negative potential vnwl is higher than V5, both V4 and V5 are "H", EN is "H" irrespective of the bank selection signal BA, and the oscillation signal OS is outputted from the oscillation circuit 210.

As described above, in the fourth embodiment, the reset level generating circuit 400 is constituted by a plurality of units, and the amount of the current supply of the negative potential of the word line reset level generating circuit 4 is varied depending on how many units are operated. All the units are caused to stop in accordance with the level of vnwl or a part of them is operated in accordance with the access operation of the memory cell array. Therefore, the unnecessary operation of generating the negative potential is inhibited while the necessary negative potential is maintained, and power consumption can be reduced.

Figure 33:
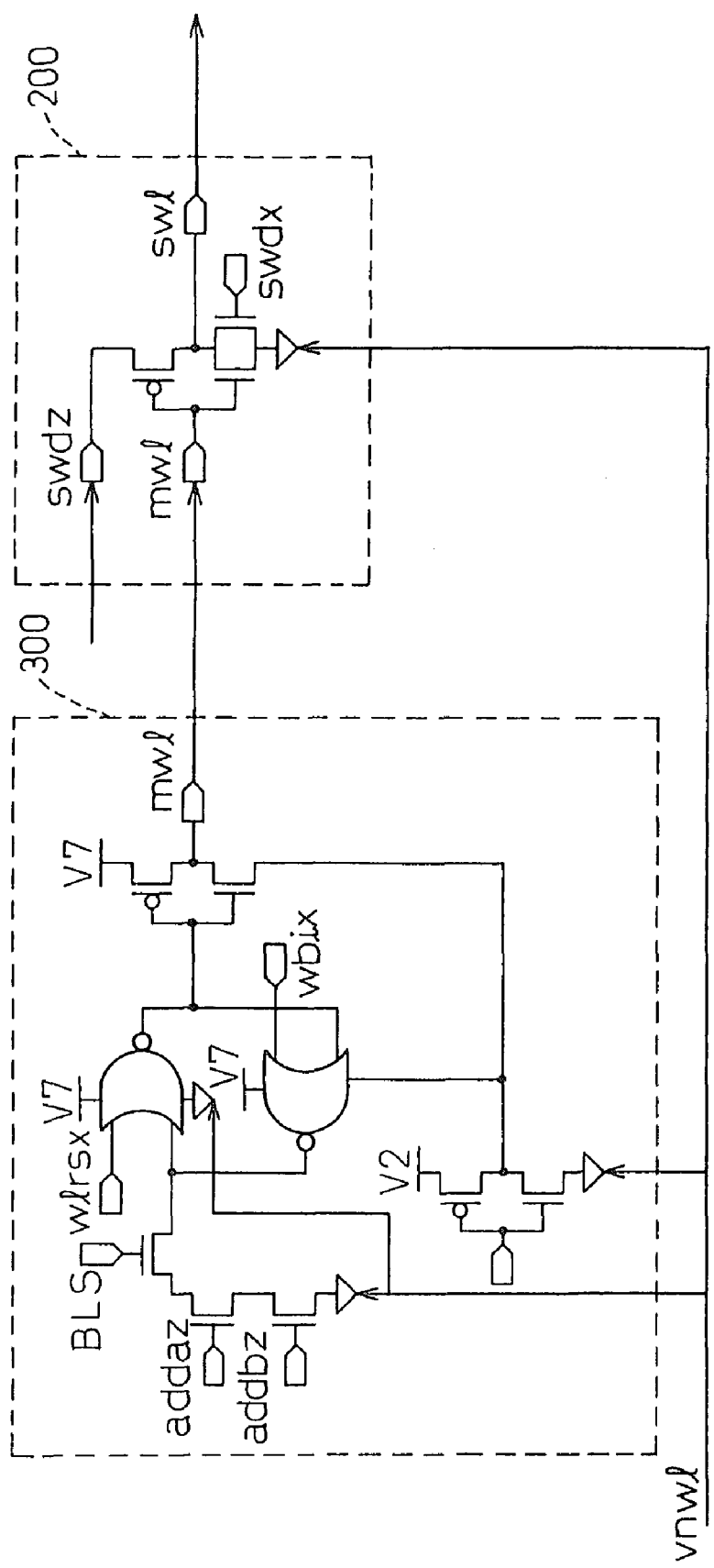
FIG. 33 is a circuit diagram showing the construction of a row decoder and a WL driver in the fourth embodiment.

The negative potential vnwl generated in the manner described above is supplied to the word line driver 200 and to the row decoder 300. FIG. 33 is a circuit diagram showing the circuit construction of the word line driver 200 and the row decoder 300 in the fourth embodiment. This circuit employs a hierarchical word line scheme for selecting one of a plurality of swl for one mwl. In the row decoder 300, one main word line mwl is selected by the row address signals addaz and addbz and by the block selection signal BLS. In the word line driver 200, on the other hand, one sub-word line swl is selected by the signal swdz for one selected main word line mwl, and the word line WL to be activated is decided. The negative potential vnwl is used for the lower potential of the power source of the word line driver 200 and the row decoder 300. In this case, mwl and swl have mutually opposite polarities, and both have negative potential vnwl on the lower potential.

Figure 34:
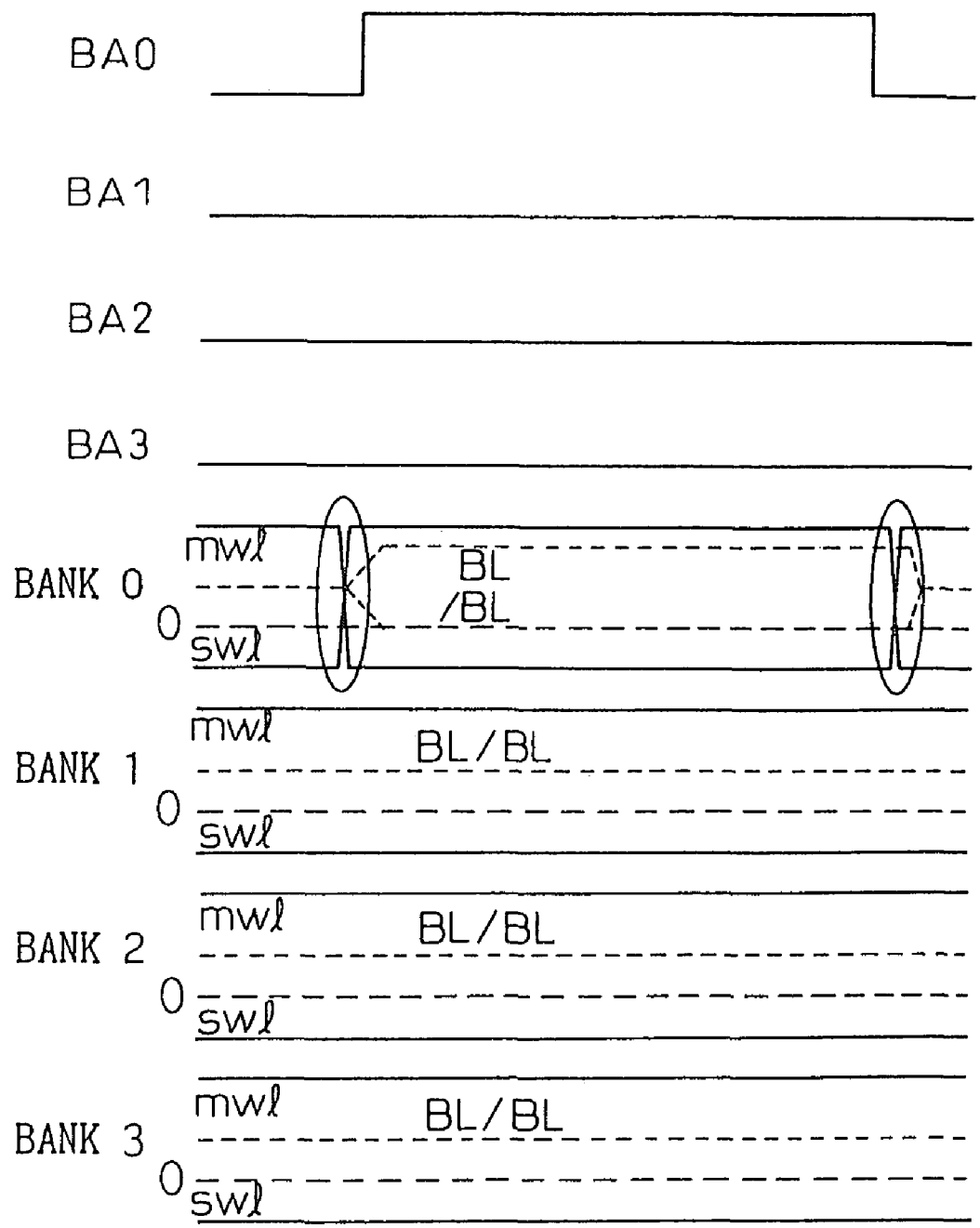
FIG. 34 is a timing chart (when one bank operates) showing the level change of the word line and the bit line in the fourth embodiment.
Figure 35:
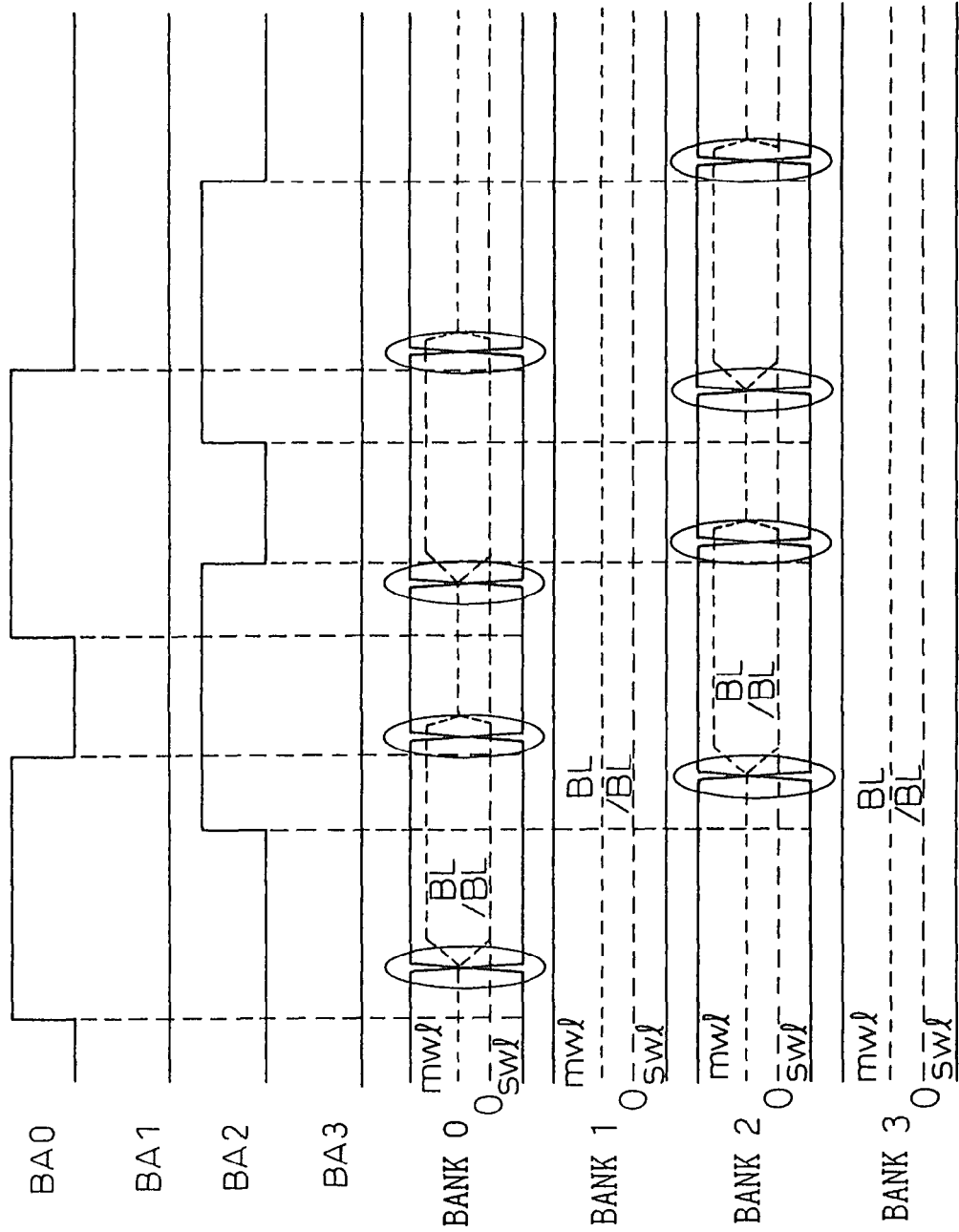
FIG. 35 is a timing chart (when two banks operate) showing the level change of the word line and the bit line in the fourth embodiment.
Figure 36:
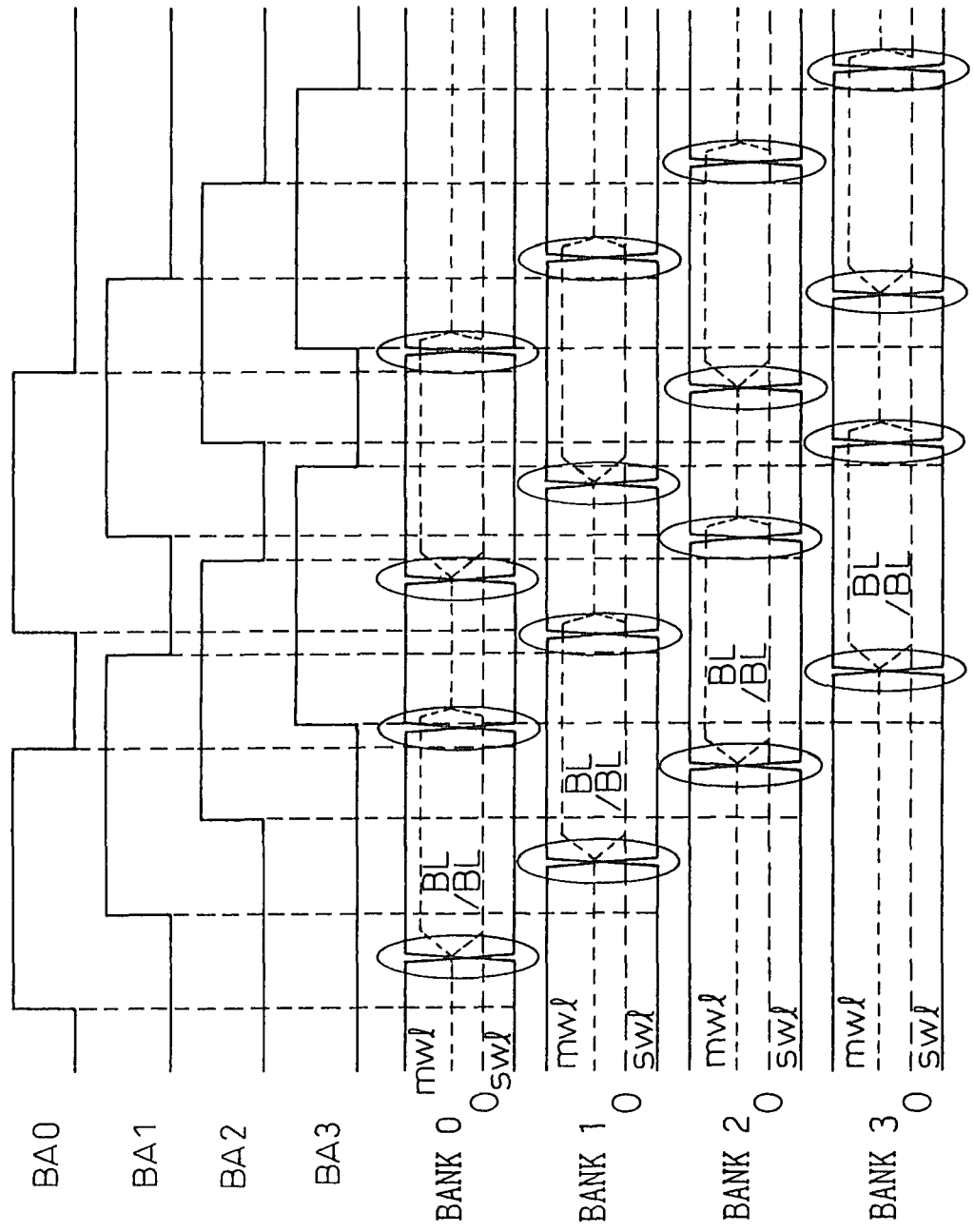
FIG. 36 is a timing chart (when four banks operate) showing the level change of the word line and the bit line in the fourth embodiment.

FIGS. 34 to 36 are timing charts showing the operation of the DRAM of the fourth embodiment. FIG. 34 shows the case where access is made to only one bank 0, FIG. 35 shows the case in which access is made to two banks, for example, the banks 0 and 2, and FIG. 36 shows the case in which access is made to four banks 0 to 3. As shown in these drawings, the potential of the accessed bit line on the lower potential is zero and the potential of the non-selected word lines is a negative potential lower than zero. In the timing charts, since the signal relating to the negative potential output vnwl shifts at the timings represented by ellipses, the current which merely charges and discharges the load of the word line (here, the main-word lines and sub-word lines) flows through the power source line of the negative potential vnwl. Therefore, the WL reset level generating circuit 400 must have a capacity sufficient to absorb only this current. However, only the minimum time is set to the bank activation period but the maximum time is not stipulated. Therefore, the difference occurs in the necessary current, and also occurs between the case in which only one bank is activated so as to activate the word line and the case in which four banks are activated to activate the word lines in parallel. Since a large current difference exists, depending on the internal operating condition, it is effective to employ the scheme in which the generating circuit unit is disposed for each bank and the operation is controlled in accordance with the bank selection signal BA as in this embodiment.

Incidentally, in the control system shown in FIG. 32, the control operation can be executed by disposing only one of the first and second word line reset level detecting circuits and by setting only one of V4 and V5. Such a control may be executed for only a part of a plurality of sets of generating circuit units and control circuit units. In other words, a part of the control circuit units 600-0 to 600-*n* is omitted and the bank selection signal BA is directly inputted to the generating circuit unit for the omitted portion or the generating circuit unit is always kept under the operating condition.

If the access operation to any of the banks is always executed and the amount of the current supply of the negative potential vnwl, that is practically necessary, is proportional to the number of banks accessed in the control operation described above, the first and second reset level detecting circuits 500-1 and 500-2 and the control units 600-0 to 600-*n* shown in FIG. 24 need not be disposed, and the bank selection signals BA0 to Ban are directly inputted to the generating circuit units 400-0 to 400-*n* in place of the control signals EN0 to ENn.

Figure 37:
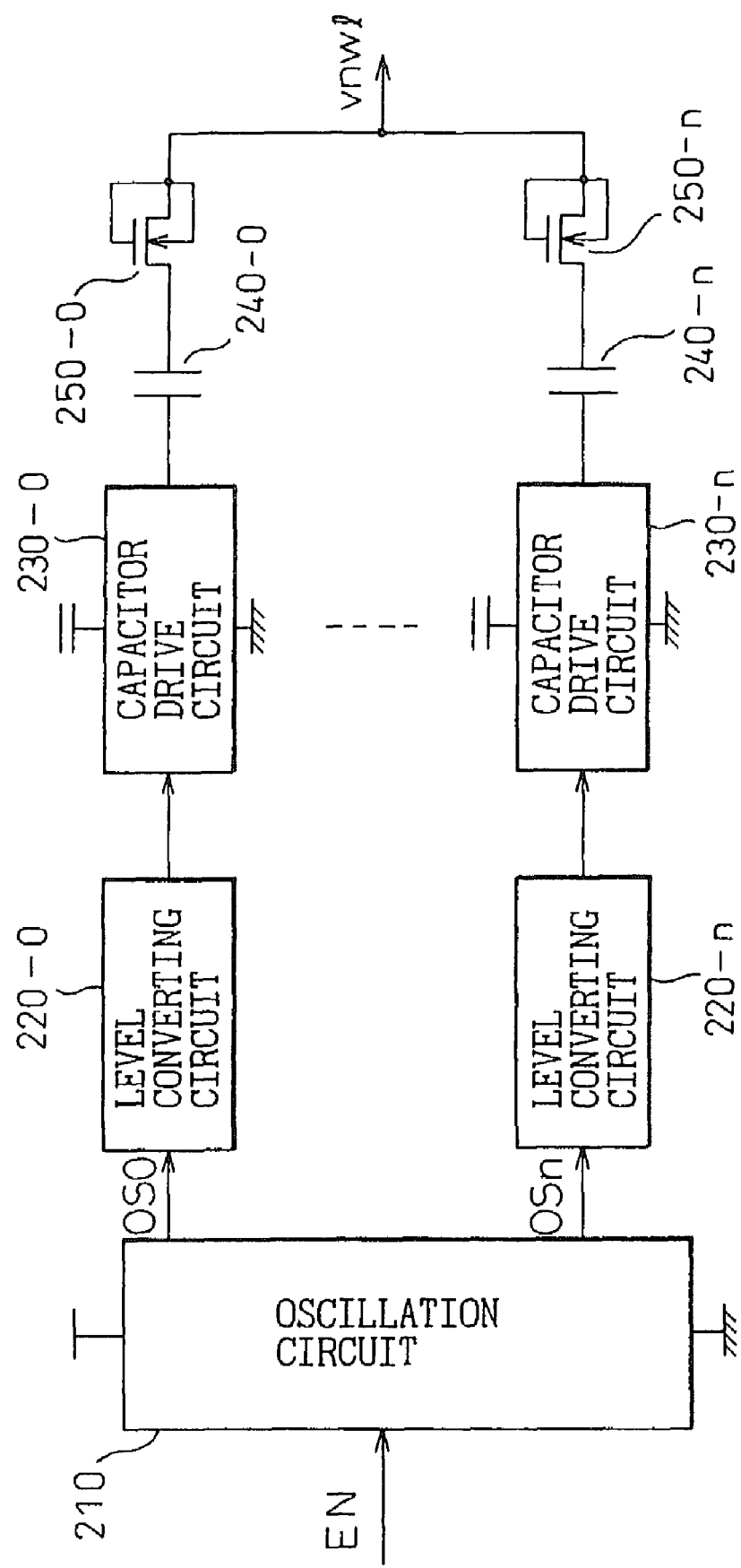
FIG. 37 is a block circuit diagram showing the basic construction of a WL reset level generating circuit in a modified embodiment of the fourth embodiment.

FIG. 37 is a block circuit diagram showing the construction of a modified example of the WL reset level generating circuit in the fourth embodiment. In the construction shown in FIG. 25, this modified example divides the level converting circuit 220 into a plurality of level converting circuit units 220-0 to 220-*n*, the capacitor drive circuit 230 into a plurality of capacitor drive circuit units 230-0 to 230-*n*, the capacitor 240 into a plurality of capacitor units 240-0 to 240-*n* and the output circuit 250 into a plurality of output circuit units 250-0 to 250-*n*, respectively, and combines the divided circuit units into n sets. The oscillation signals OS0 to OSn having different phases are supplied from the common oscillation circuit 210 to each set. The output of each set is connected in common. This modified example is effective when the pumping capacity 240 is large with respect to the cycle of the oscillation signal. When the cycle of the oscillation signal becomes short, a large capacitor cannot be charged sufficiently and current supply efficiency drops. In consequence, the cycle of the oscillation signal cannot be much reduced. It is preferred, on the other hand, to shorten the cycle of the oscillation signal in order to restrict the increase of the area of the negative potential generating circuit and to restrict the increase of its current consumption. If the output of each set is connected in common and the oscillation signal having a different phase is inputted to each set as in this modified example, current supply efficiency does not deteriorate even when the cycle of the oscillation signal becomes so short as only a small capacitor has to be charged in a short period, since the current is supplied with other sets alternately.

Figure 38:
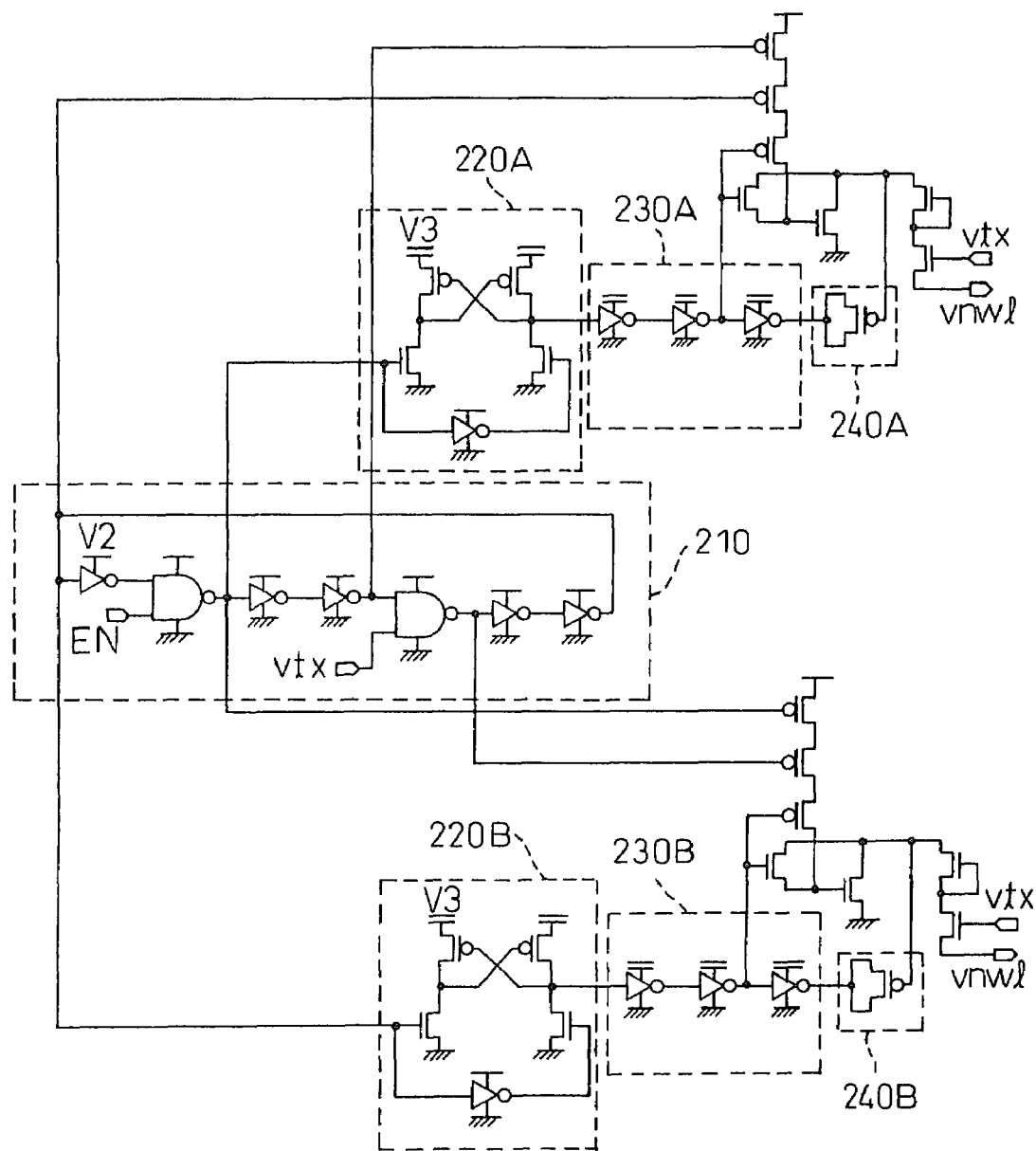
FIG. 38 is a circuit diagram showing the construction of the WL reset level generating circuit of the modified embodiment of the fourth embodiment.

FIG. 38 is a circuit diagram showing the circuit construction of the WL reset level generating circuit unit embodying the modified example described above, and shows the example of division into two sets. As shown in the drawing, this circuit includes the oscillation circuit 210, two level converting circuits 220A and 220B, two capacitor drive circuits 230A and 230B, two capacitors 240A and 240B, and two output circuits. In other words, the circuit of FIG. 38 corresponds to the case where two generating circuit units shown in FIG. 27 are disposed, the oscillation circuit 210 is used in common, and two oscillation signals having different phases from the oscillation circuit 210 are inputted to the capacitor drive circuits 230A and 230B. According to this circuit construction, two capacitors 240A and 240B are driven by two oscillation signals having substantially opposite phases, and because the outputs of two sets of generating circuit units are connected in common, ripples of the outputs corresponding to the capacitor dumping can be reduced much more than in the construction shown in FIG. 27. Incidentally, it is also possible to drive the capacitor by three or more different oscillation signals by disposing three or more sets of the level converting circuit, the capacitor drive circuit, the capacitor and the output circuit.

The construction in which a plurality of sets of the capacitor drive circuit, the capacitor and the output circuits are disposed and the oscillation circuit is used in common as shown in FIG. 38 can be applied to any of the circuits shown in FIGS. 27, 28 and 29.

Figure 39:
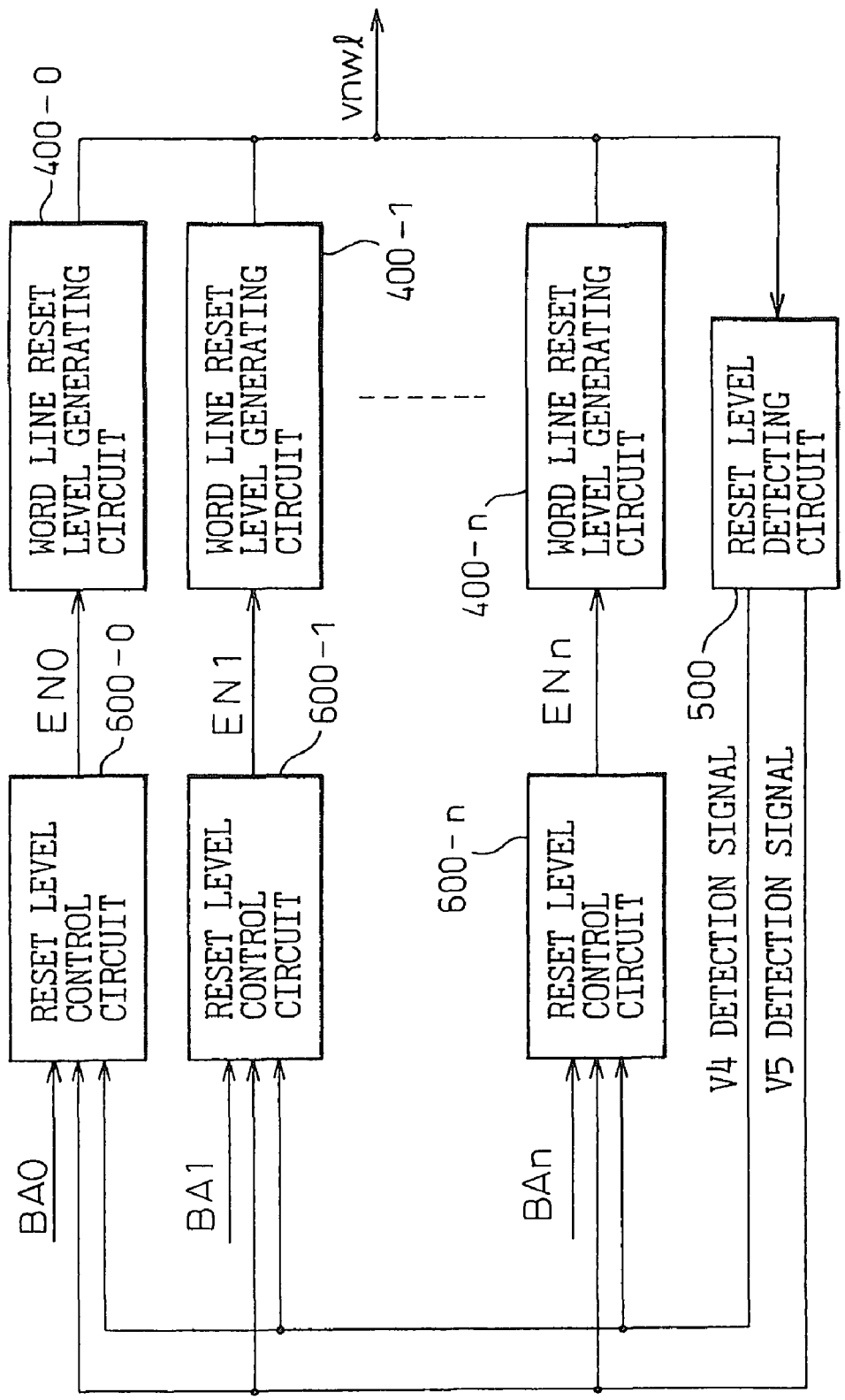
FIG. 39 is a block circuit diagram showing the construction relating to the generation and control of the WL reset level in the fifth embodiment of the present invention.
Figure 40A:
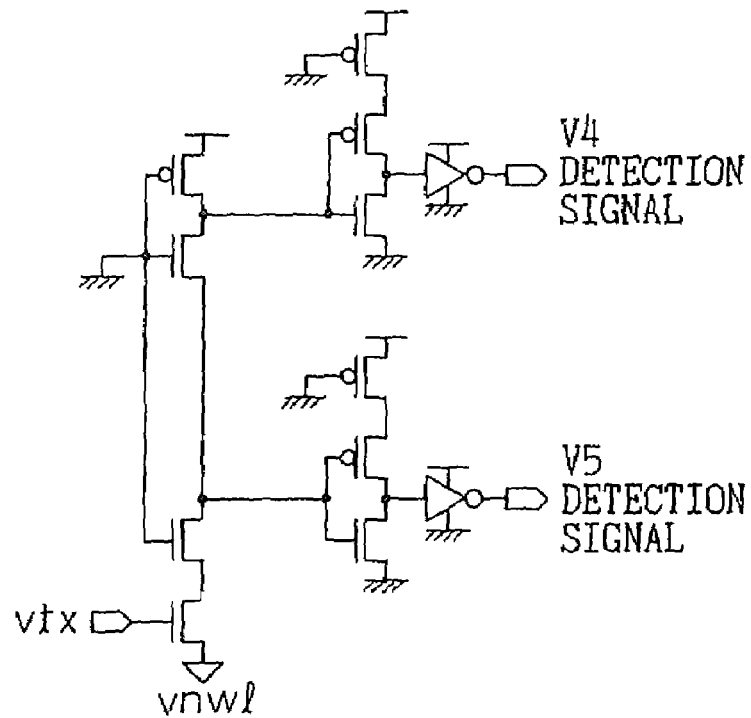
FIGS. 40A and 40B are circuit diagrams each showing a structural example of the WL reset level detecting circuit of the fifth embodiment.
Figure 40B:
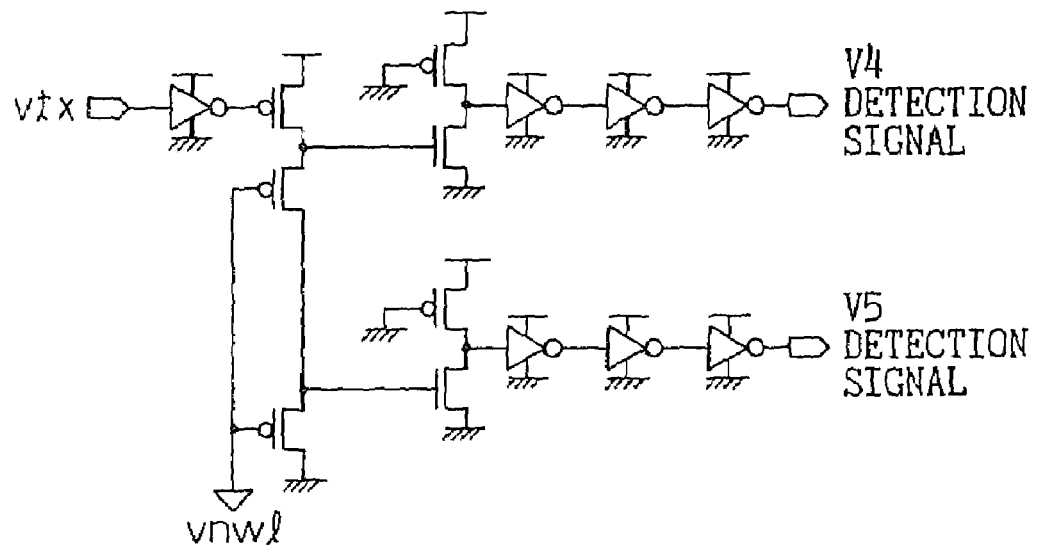
Figure 41A:
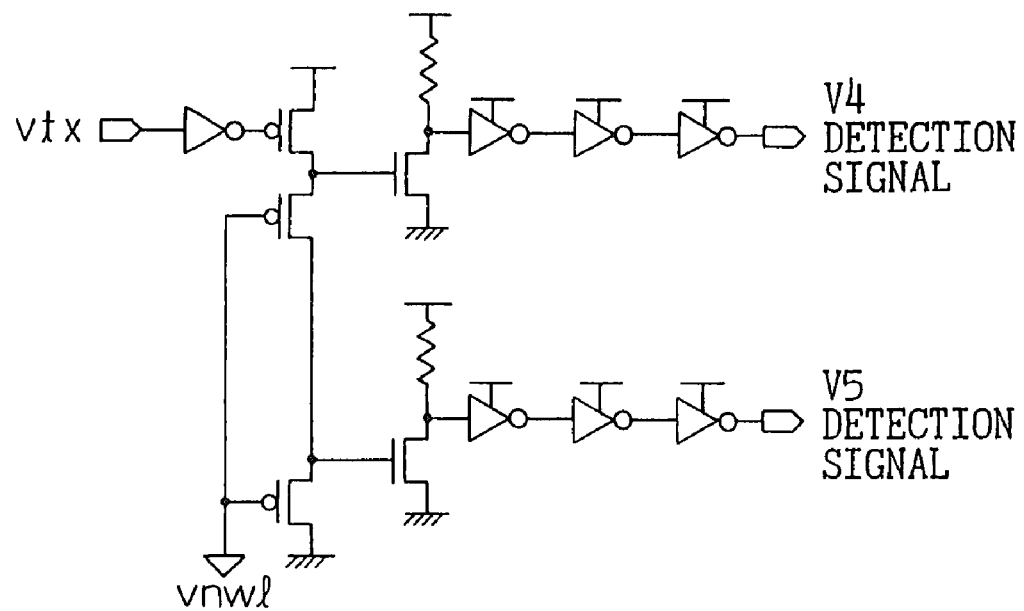
FIGS. 41A and 41B are circuit diagrams each showing another structural example of the WL reset level detecting circuit of the fifth embodiment.
Figure 41B:
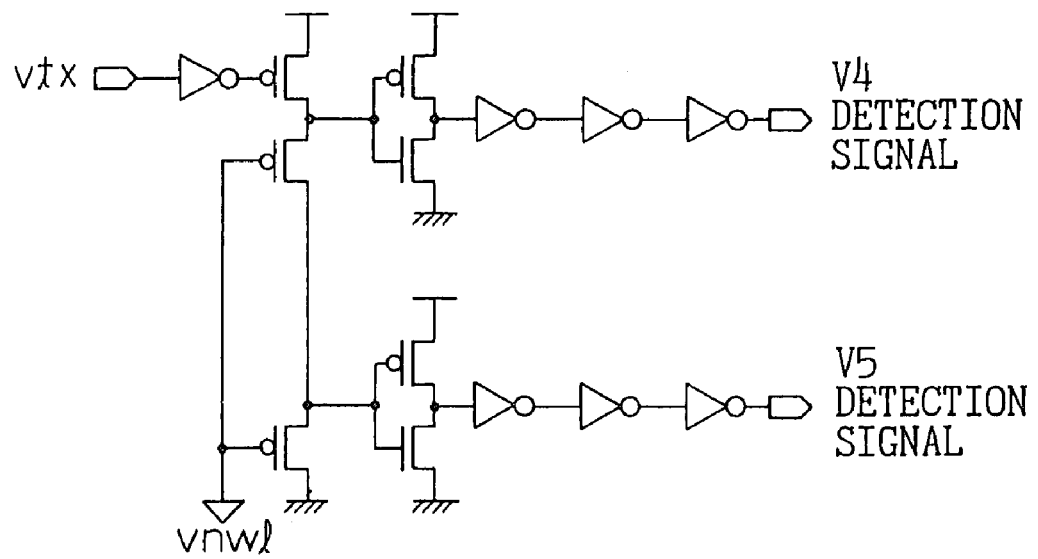

FIG. 39 is a block circuit diagram showing the construction of each of the WL reset level generating circuit 400, the reset level detecting circuit 500 and the reset level control circuit 600 according to the fifth embodiment. The construction of this fifth embodiment is different from that of the fourth embodiment in that the reset level detecting circuit 500 is not divided. The reset level detecting circuit 500 detects whether the negative potential vnwl is lower than V4 or higher than V5. The reset level detecting circuit 500 of the fifth embodiment collectively executes, in a sense, the functions of the first and second reset level detecting circuits 500-1 and 500-2 of the fourth embodiment. The rest of portions are the same as those of the fourth embodiment.

FIGS. 40A, 40B, 41A and 41B are circuit diagrams showing the structural examples of the reset level detecting circuit 500 in the fifth embodiment. These circuits, too, can adjust the levels of V4 and V5 by adjusting the sizes of the transistors, and the explanation in further detail will be omitted.

In the fourth and fifth embodiments, the reset level generating circuit 400 comprises a plurality of units, and the amount of the current supply of the negative potential of the reset level generating circuit 400 is variable depending on how many units are operated. Various other methods are available to vary the amount of the current supply of the negative potential of the reset level generating circuit 400, such as a method that changes the power source potential of the capacitor drive circuit, a method that changes the cycle of the oscillation signal for driving the capacitor, a method that changes the size of the capacitor, and so forth. These methods can be applied to the whole, or a part, of a plurality of reset level generating circuit units of the fourth and fifth embodiments. Hereinafter, some embodiments applying these methods will be explained.

FIG. 42 is a circuit diagram showing the basic construction of the WL reset level generating circuit of the sixth embodiment. This embodiment represents the example in which the negative potential current supply is made variable by applying a method, that changes the power source potential of the capacitor drive circuit, to the WL reset level generating circuit having a similar construction to the construction shown in FIG. 37. As shown in the diagram, each capacitor drive circuit 230-0 to 230-n is connected to two power sources having different potentials through the transistor operating as a switch. Here, it is connected to the external power supply V3 and to the internal power source V2 obtained by down-converting the above external power supply V3. The switch signal VSW is applied to the transistor operating as the switch, and any of the transistors becomes conductive. Since the power supply V3 is higher than V2, when the capacitor drive circuit is connected to V3, the amplitude of the capacitor drive signal is larger than in the case of capacitor drive circuit being connected to V2. Therefore, the current supply of the WL reset level generating circuit becomes increased without increasing the area.

Figure 43A:
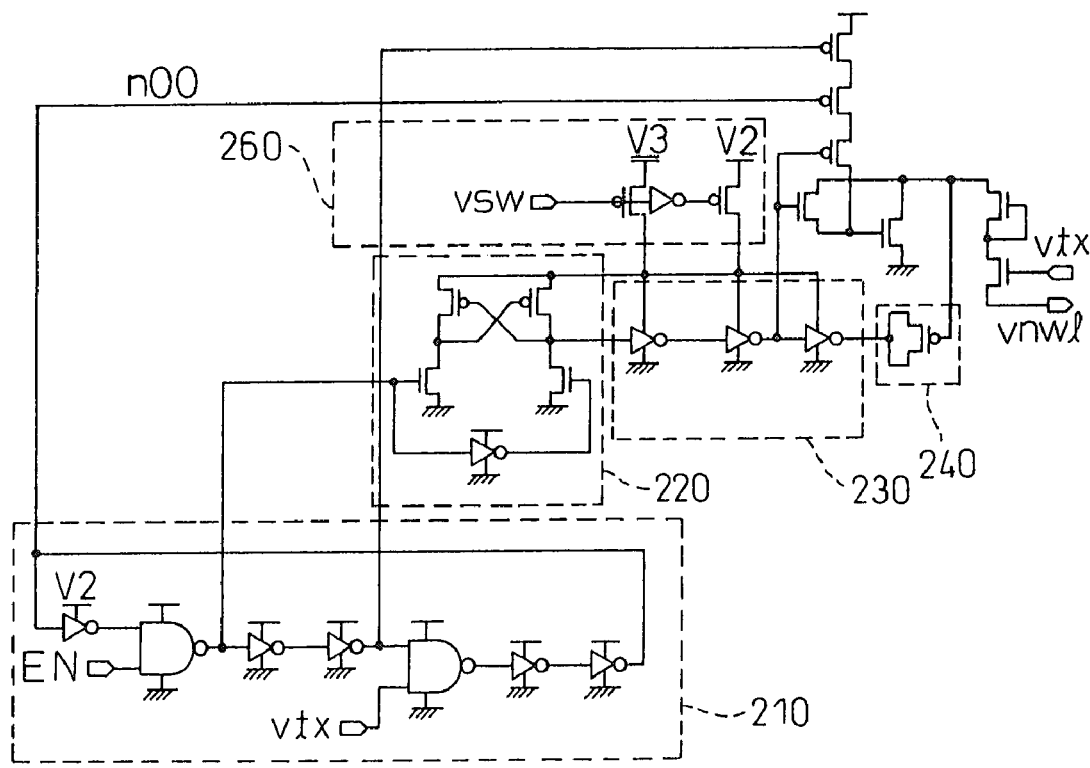
FIGS. 43A and 43B are diagrams showing the construction and operation of the WL reset level generating circuit in the sixth embodiment.
Figure 43B:
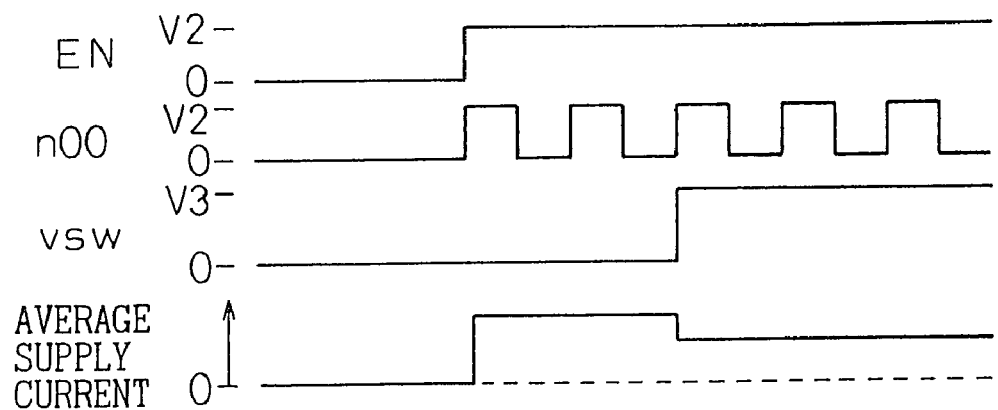

FIGS. 43A and 43B are a circuit diagram and a timing chart showing the concrete circuit construction of the WL reset level generating circuit of the sixth embodiment and its operation. As shown in FIG. 43A, this embodiment disposes a circuit 260 for switching the power source of the capacitor drive circuit 230 in the circuit of the fourth embodiment shown in FIG. 27. As shown in. FIG. 43B, the negative potential is generated when the control signal EN is "H" and the oscillation signal n00 is generated. Since the power source V3 is connected when the switch signal VSW is "L", the mean supply current (or average supply current) of this WL reset level generating circuit is great, but when the switch signal VSW is "H", the power source V2 is connected. Therefore, the mean supply current of this WL reset level generating circuit becomes small.

Incidentally, the method that switches the power source of the capacitor drive circuit 230 of the sixth embodiment can be applied also to the circuits shown in FIGS. 28 and 29.

Figure 44:
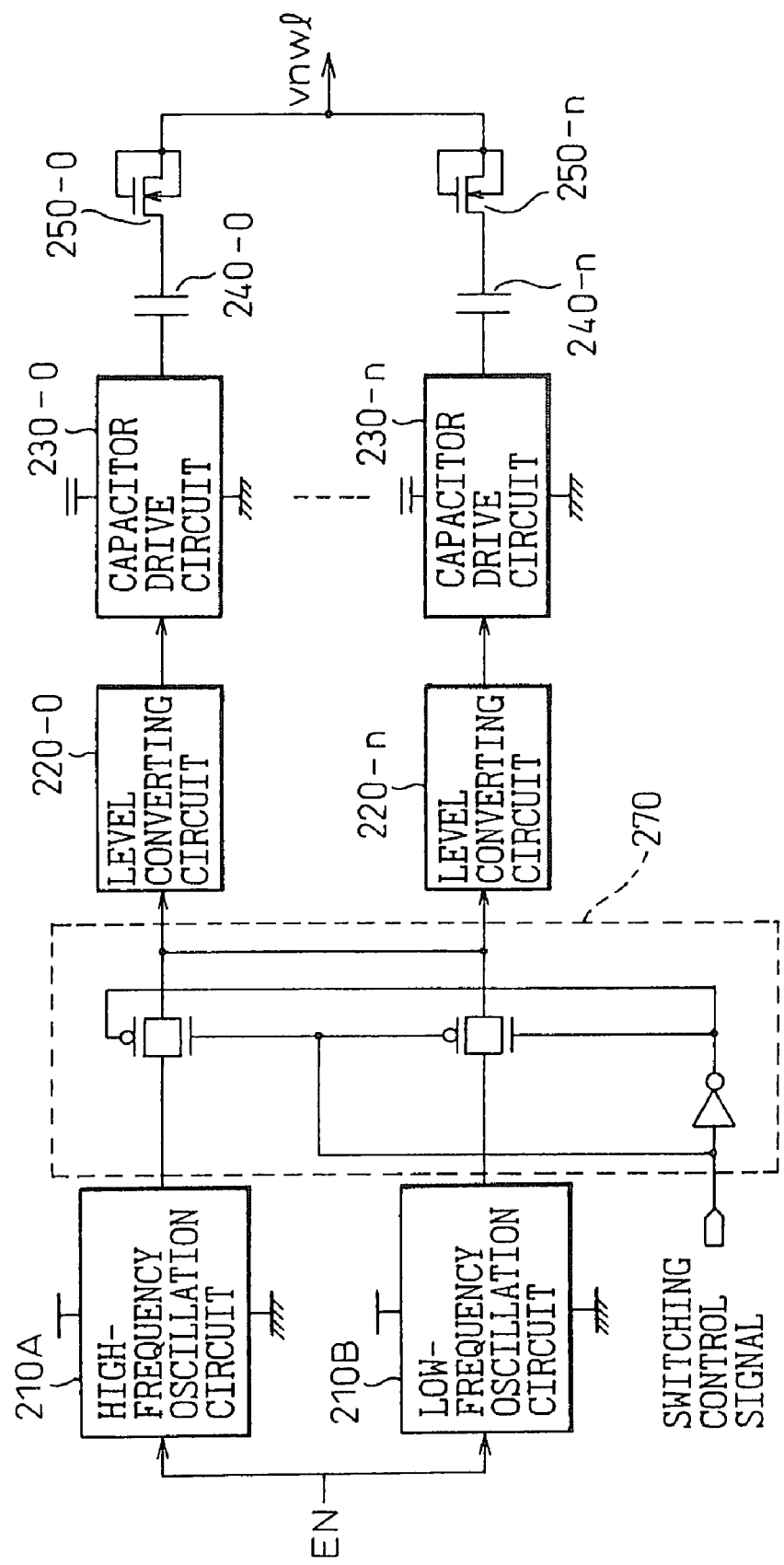
FIG. 44 is a block circuit diagram showing the basic construction of the WL reset level generating circuit in the seventh embodiment of the present invention.

FIG. 44 is a block circuit diagram showing the basic construction of the WL reset level generating circuit of the seventh embodiment. This embodiment represents the example in which the method of changing the cycle of the oscillation signal for driving the capacitor is applied to the WL reset level generating circuit having a similar construction to the construction shown in FIG. 37 so as to make the current supply of the negative potential variable. As shown in the drawing, a high-speed oscillation circuit 210A for outputting a high-frequency oscillation signal and a low-speed oscillation circuit 210B for outputting a low-frequency oscillation signal are disposed in place of the oscillation circuit 210, and the output of which circuit is inputted to each level converting circuit 220-0 to 220-n is selected by the transfer gate circuit 270. The transfer gate is controlled by the switch control signal. As described above, the shorter becomes the cycle of the oscillation signal that drives the capacitor, the larger becomes the mean supply current. Therefore, when the high-frequency oscillation signal is inputted to each level converting circuit 220-0 to 220-n, the mean supply current becomes large.

Figure 45:
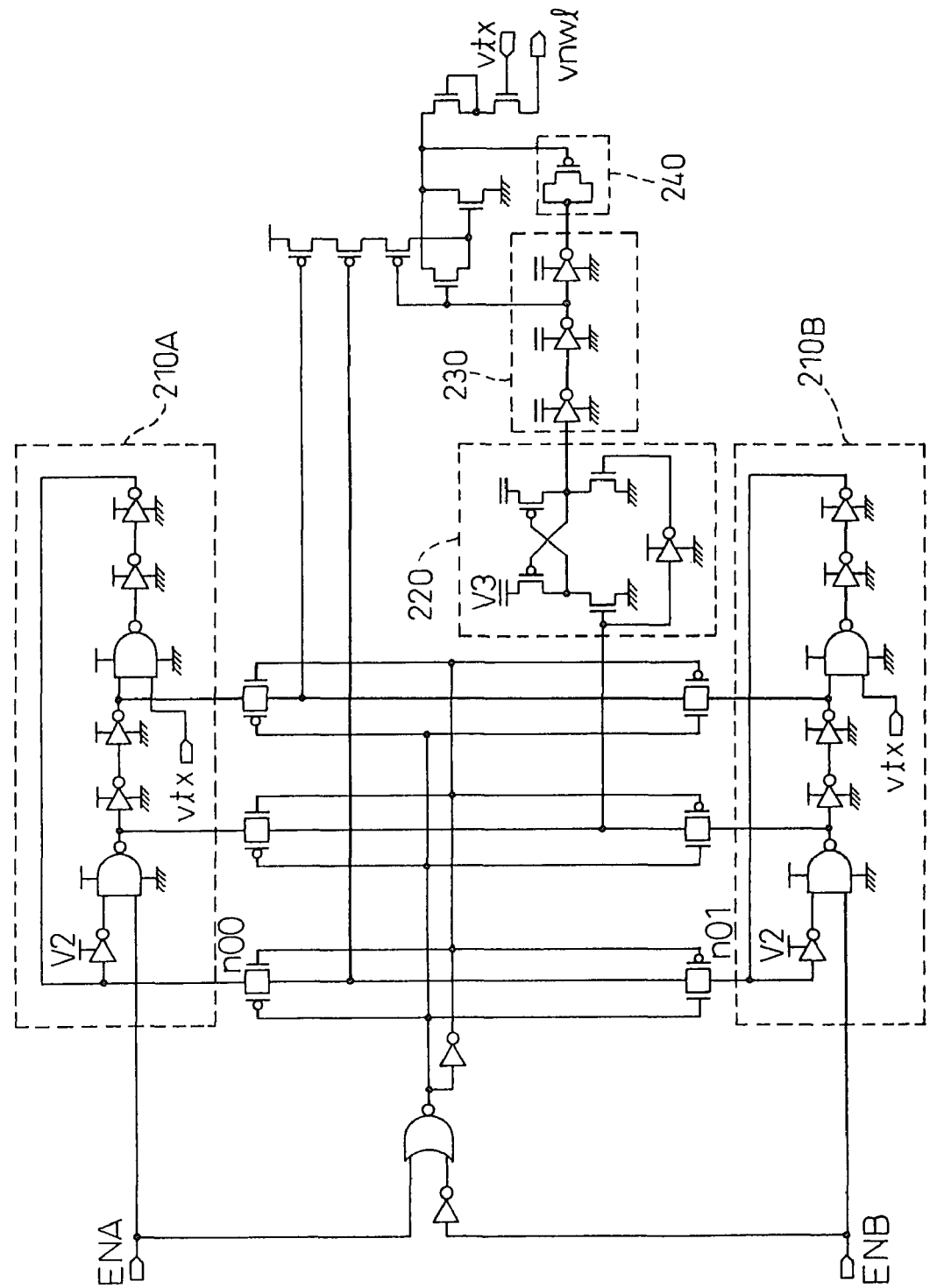
FIG. 45 is a circuit diagram showing the construction of the WL reset level generating circuit of the seventh embodiment.
Figure 46:
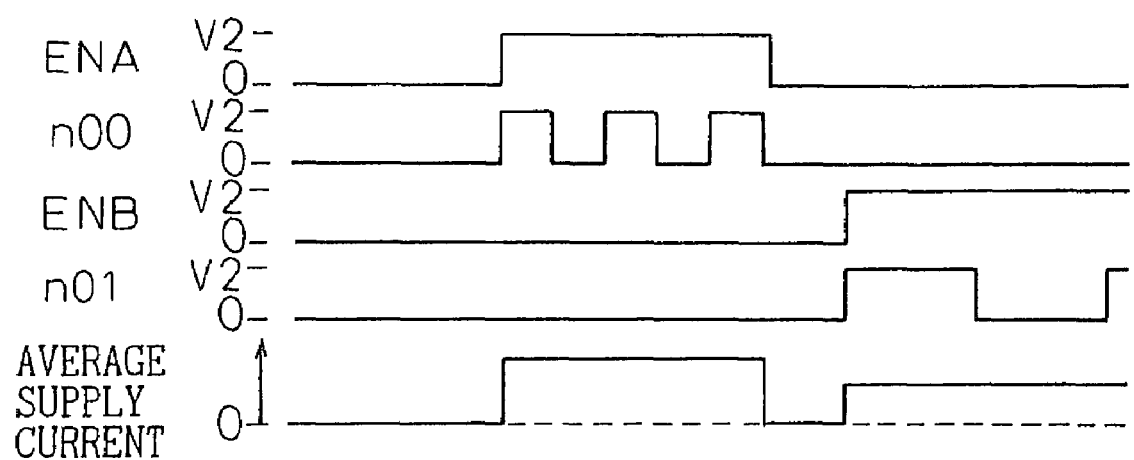
FIG. 46 is a timing chart showing the operation of the WL reset level generating circuit in the seventh embodiment.

FIG. 45 is a circuit diagram showing the concrete circuit construction of the WL reset level generating circuit of the sixth embodiment and FIG. 46 is a timing chart showing the operation of this circuit. As shown in FIG. 45, this embodiment disposes a high-speed oscillation circuit 210A and a low-speed oscillation circuit 210B in place of the oscillation circuit 210 in the circuit of the fourth embodiment shown in FIG. 27. The control signal EN, too, comprises a control signal ENA for controlling the operation of the high-speed oscillation circuit 210A and a control signal ENB for controlling the operation of the low-speed oscillation circuit 210B, and these control signals ENA and ENB are used also as the switch control signal. As shown in FIG. 46, the high-speed oscillation circuit 210A generates a high-frequency oscillation signal n00 when the control signal ENA is "H" and the control signal ENB is "L", and this signal n00 is inputted to the level converting circuit 220. Since the low-speed oscillation circuit 210B does not operate at this time, the low-frequency oscillation signal n01 is not generated. Because the capacitor is driven by the high-frequency oscillation signal n00, the mean supply current of the WL reset level generating circuit is large. The low-speed oscillation circuit 210B generates a low-frequency oscillation signal n01 when the control signal ENA is "L" and ENB is "H", and this signal is inputted to the level converting circuit 220. Since the high-speed oscillation circuit 210A does not operate at this time, the high-frequency oscillation signal n00 is not generated. Because the capacitor is driven by the low-frequency oscillation signal n01, the mean supply current of the WL reset level generating circuit is small, and the consumed current becomes small.

Incidentally, the method of changing the cycle of the oscillation signal for driving the capacitor according to the seventh embodiment can be applied also to the circuits shown in FIGS. 28 and 29.

Figure 47:
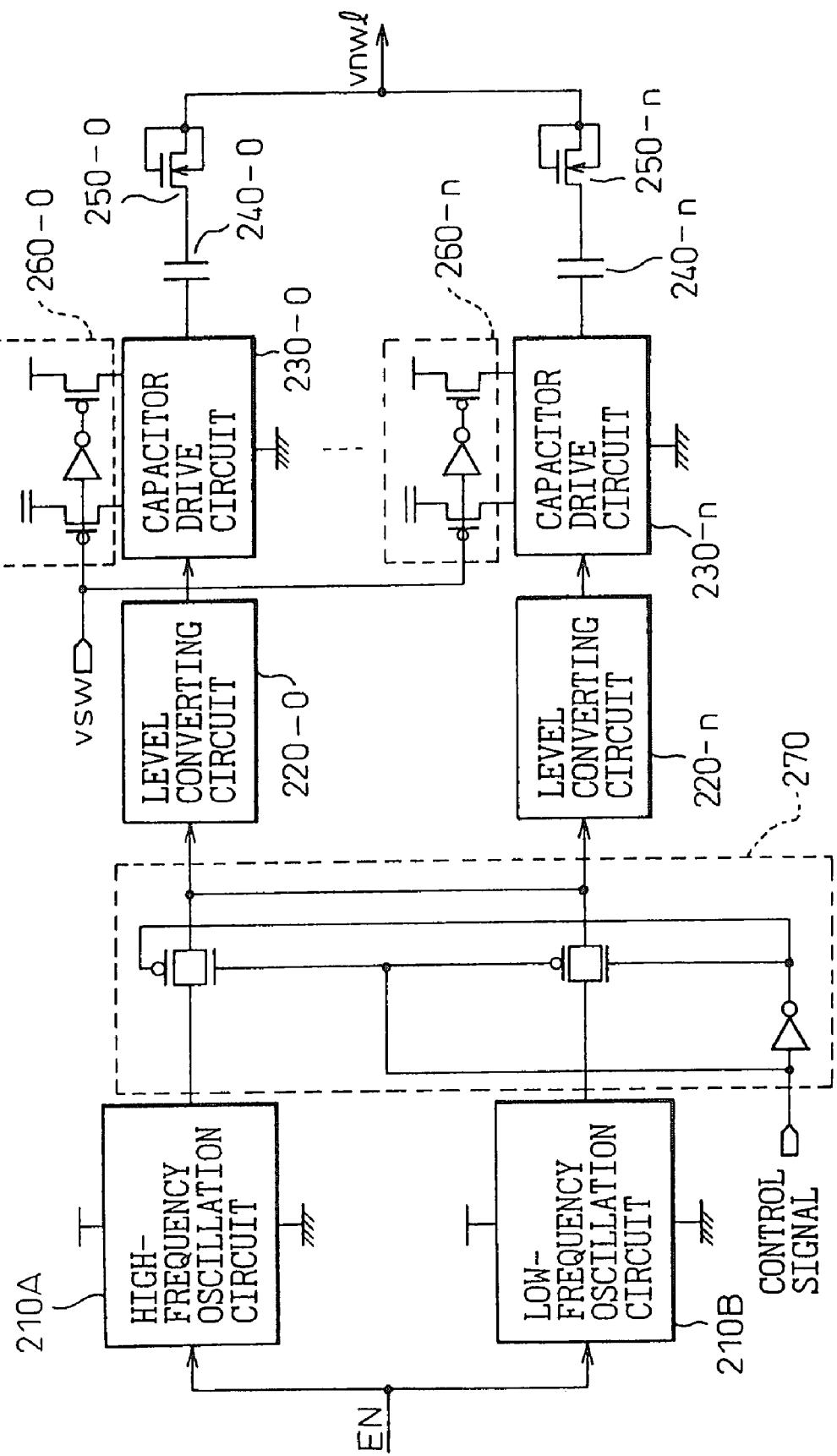
FIG. 47 is a block circuit diagram showing the operation of the WL reset level generating circuit in the eighth embodiment.
Figure 48:
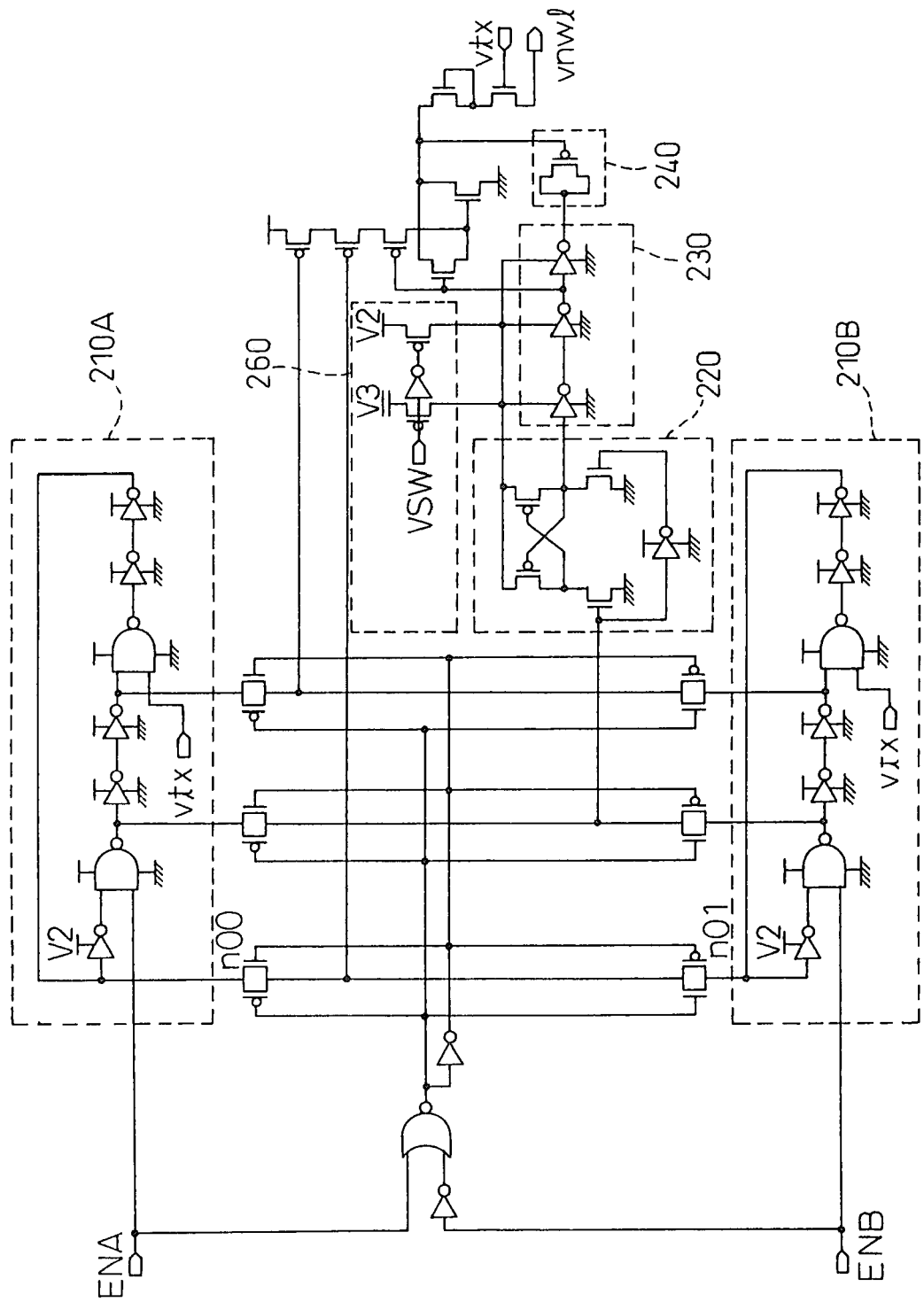
FIG. 48 is a circuit diagram showing the construction of-the WL reset level generating circuit of the eighth embodiment.
Figure 49:
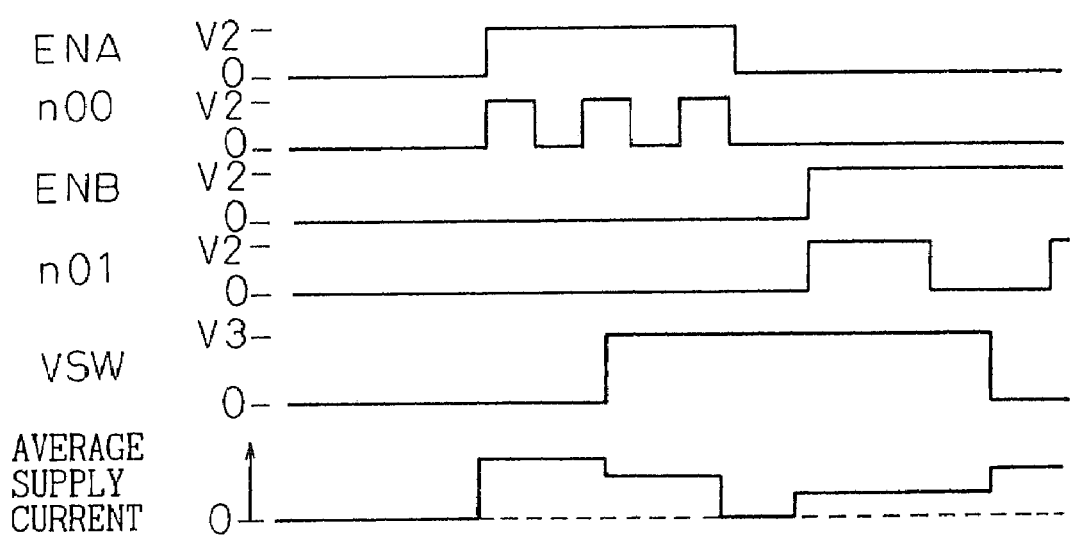
FIG. 49 is a timing chart showing the operation of the WL reset level generating circuit of the eighth embodiment.

FIG. 47 is a circuit diagram showing the basic construction of the WL reset level generating circuit according to the eighth embodiment. This embodiment represents the example that makes the power source potential of the capacitor drive circuit in the sixth embodiment variable by combining the method that changes the power source potential of the capacitor drive circuit in the sixth embodiment, with the method that changes the cycle of the oscillation signal for driving the capacitor in the seventh embodiment. FIG. 48 is a circuit diagram showing the concrete circuit construction of the eighth embodiment, and FIG. 49 is a timing chart showing its operation. The explanation in detail will be omitted. The method of the eighth embodiment can be applied also to the circuits shown in FIGS. 28 and 29.

Figure 50:
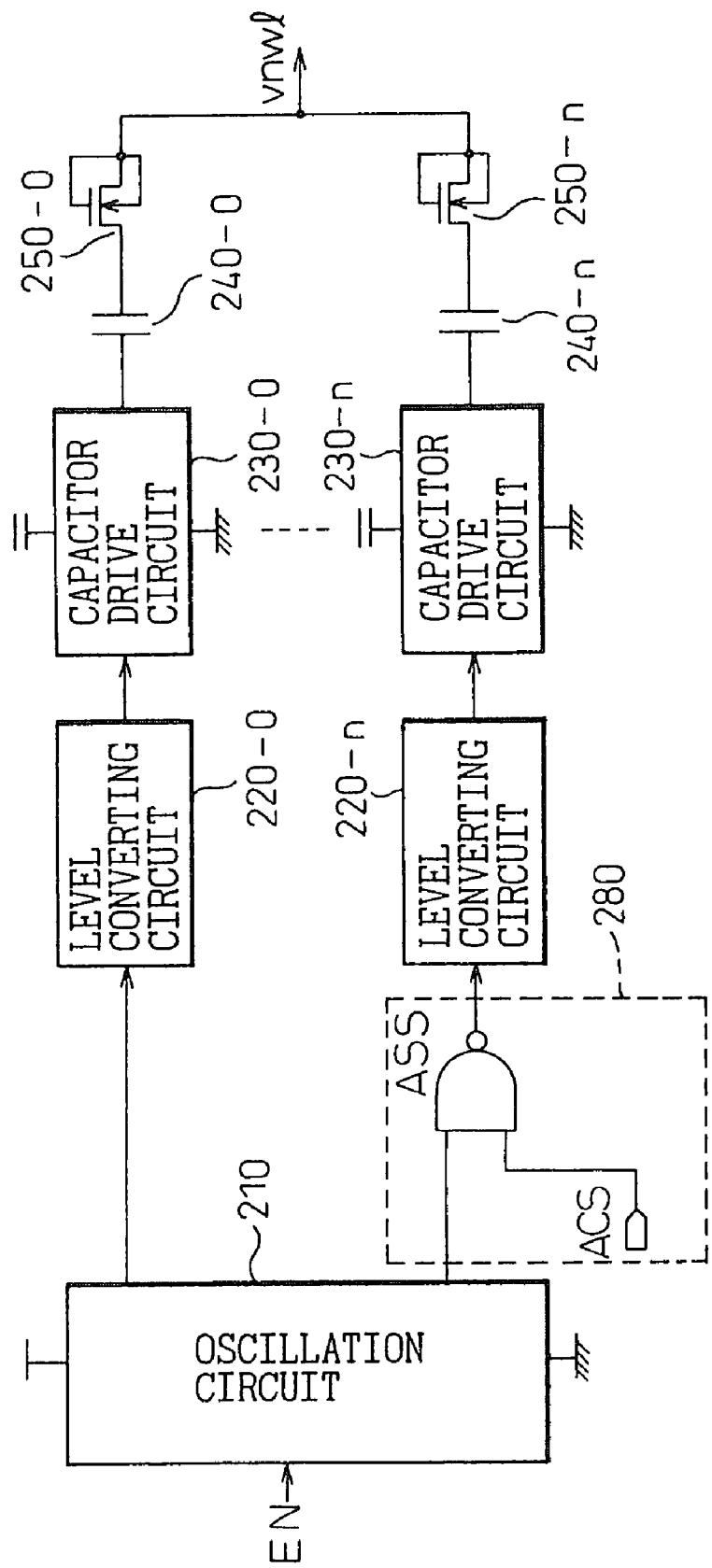
FIG. 50 is a block circuit diagram showing the basic construction of the WL reset level generating circuit of the ninth embodiment.

FIG. 50 is a circuit diagram showing the basic construction of the WL reset level generating circuit according to the ninth embodiment. This embodiment represents the example in which the amount of the current supply of the negative potential is made variable by applying the method, that changes the size of the capacitor, in the WL reset level generating circuit shown in FIG. 37. As shown in the drawing, there is disposed a switch circuit 280 for inhibiting the input of the oscillation signal to a part of the level converting circuit so as to inhibit the operation of the set of a part of the units. According to this circuit construction, the size of the capacitor used substantially changes, and the mean supply current changes. The switch circuit 280 is controlled by a capacitor area control signal ACS. Incidentally, if the same oscillation signal is used, it is possible to use in common the level converting circuit and to dispose the switch circuit at the input portion of each capacitor drive circuit.

Figure 51:
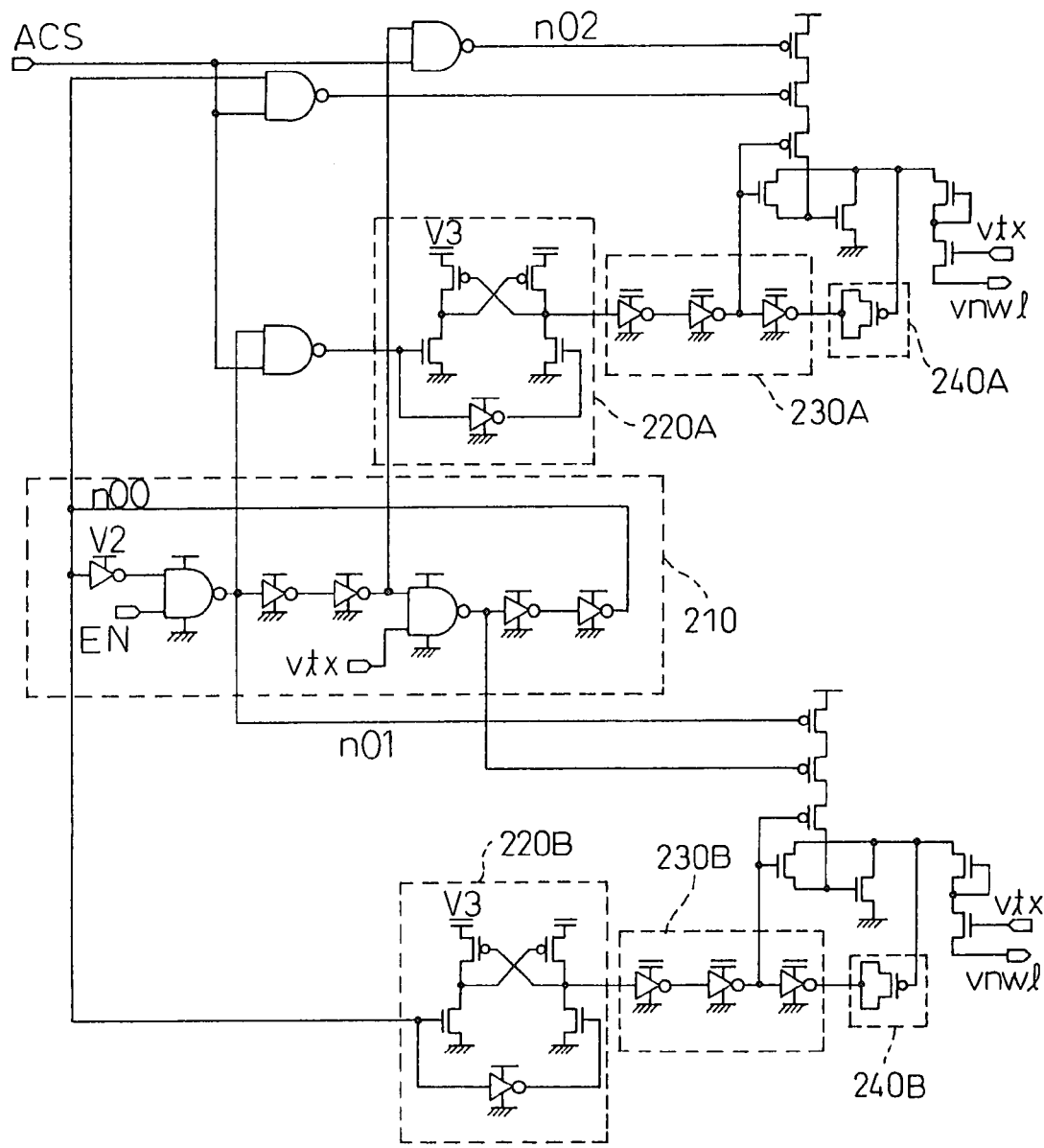
FIG. 51 is a circuit diagram showing the construction of the WL reset level generating circuit of the ninth embodiment.
Figure 52:
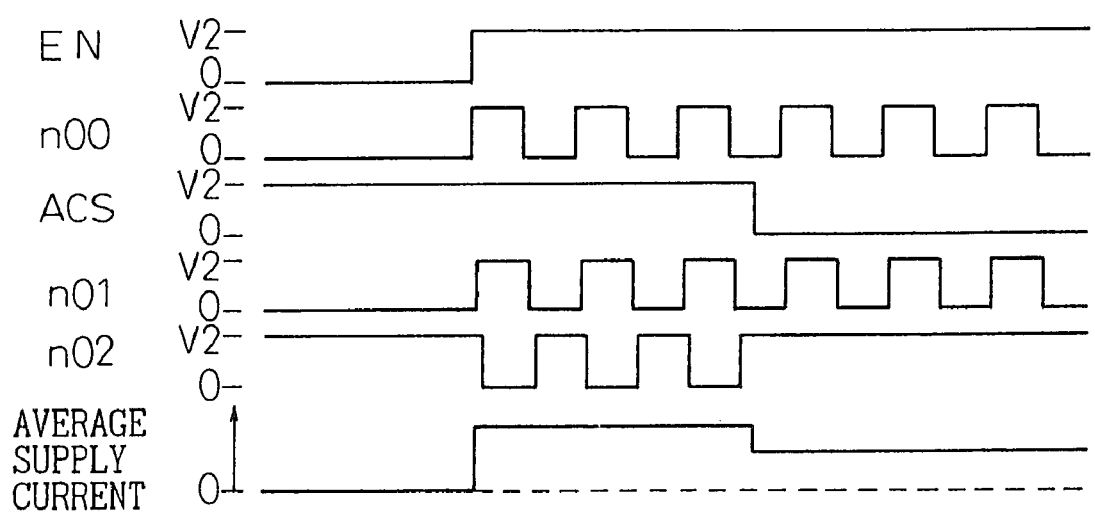
FIG. 52 is a timing chart showing the operation of the WL reset level generating circuit in the ninth embodiment.

FIG. 51 is a circuit diagram showing the concrete circuit construction of the WL reset level generating circuit of the ninth embodiment, and FIG. 52 is a timing chart showing its operation. As shown in FIG. 51, in the circuit of the modified example of the fourth embodiment shown in FIG. 38, this embodiment can inhibit the input of the oscillation signal n01 to the level converting circuit 220A of one of the sets in accordance with ACS and can also inhibit the input of the oscillation signal n00 to the power source drive portion of the capacitor 240A. The oscillation signal n00 is always inputted to the level converting circuit 220B of the other set, and the oscillation signal n01 is also inputted always to the power source driving portion. Therefore, the other set always operates.

As shown in FIG. 52, this WL reset level generating circuit operates when the control signal EN is "H", and both of two sets operate when ACS is "H". Consequently, the mean supply current becomes large. When ACS is "L", on the other hand, one of the sets does not operate, and the mean supply current becomes small.

Figure 53A:
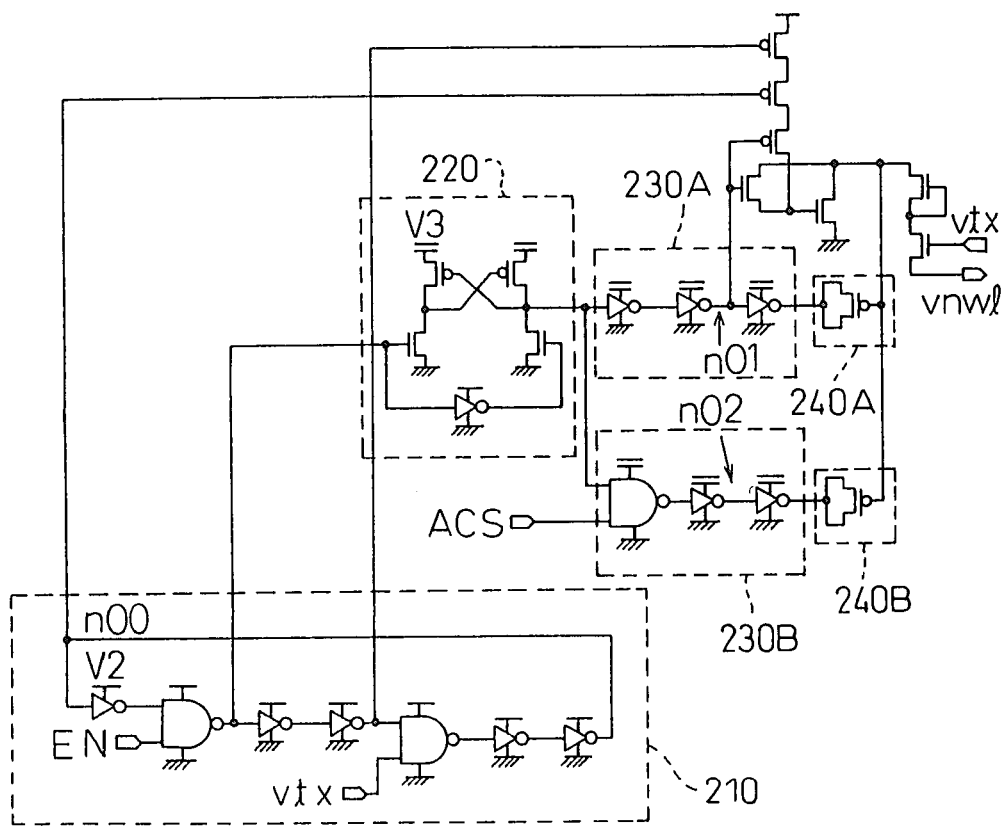
FIGS. 53A and 53B are a circuit diagram and a timing chart showing the construction and operation of the WL reset level generating circuit of the modified embodiment of the ninth embodiment.
Figure 53B:
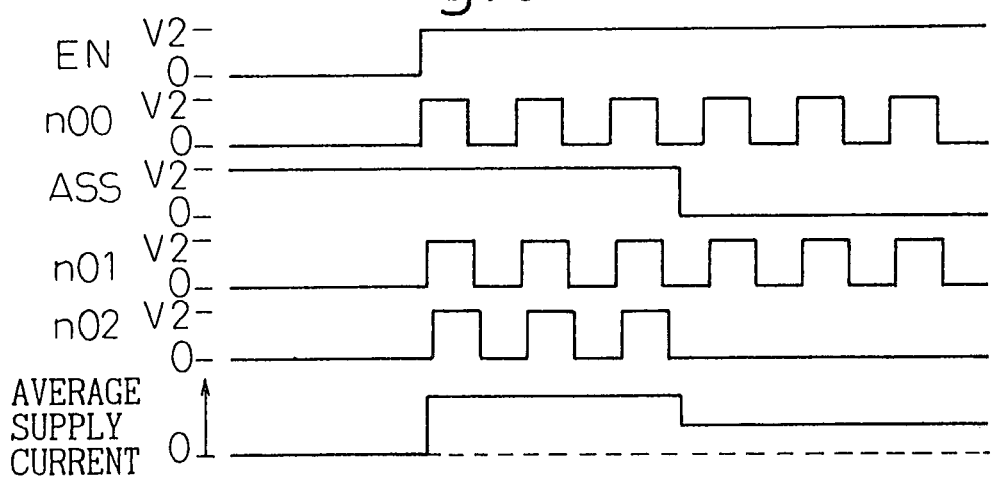

FIGS. 53A and 53B are circuit diagram and a timing chart showing the circuit construction of the WL reset level generating circuit of a modified example of the ninth embodiment and its operation. In this example, two sets of the driving circuits 230A and 230B and the capacitors 240A and 240B are disposed as shown in FIG. 53A, and the input of the oscillation signal after level conversion to one of the capacitor drive circuits (230B) can be inhibited in accordance with ACS. Since the operation is analogous to that of FIG. 52, as shown in FIG. 53B, the explanation in further detail will be omitted.

Though the fourth to ninth embodiments of the present invention have thus been explained, the constructions of these embodiments can be combined in various ways as already explained, and it is of importance to use an optimum method in accordance with the intended application.

As explained above, in the semiconductor device that extends the data holding time by reducing the sub-threshold leakage current by setting the reset level of the word line to the negative potential, the fourth to ninth embodiments of the present invention can accomplish the improvements in the characteristics such as low power consumption, the stable operation, etc., and they are particularly effective for those semiconductor devices for which scaling-down of the size and high integration density have been attempted.

Next, some preferred embodiments for accomplishing the aforementioned third object of the present invention will be explained.

Though the invention dealt with by these embodiments can be applied to various semiconductor devices, the following embodiments will illustrate the examples in which the embodiments are applied to dynamic random access memories (DRAMs).

Figure 54:
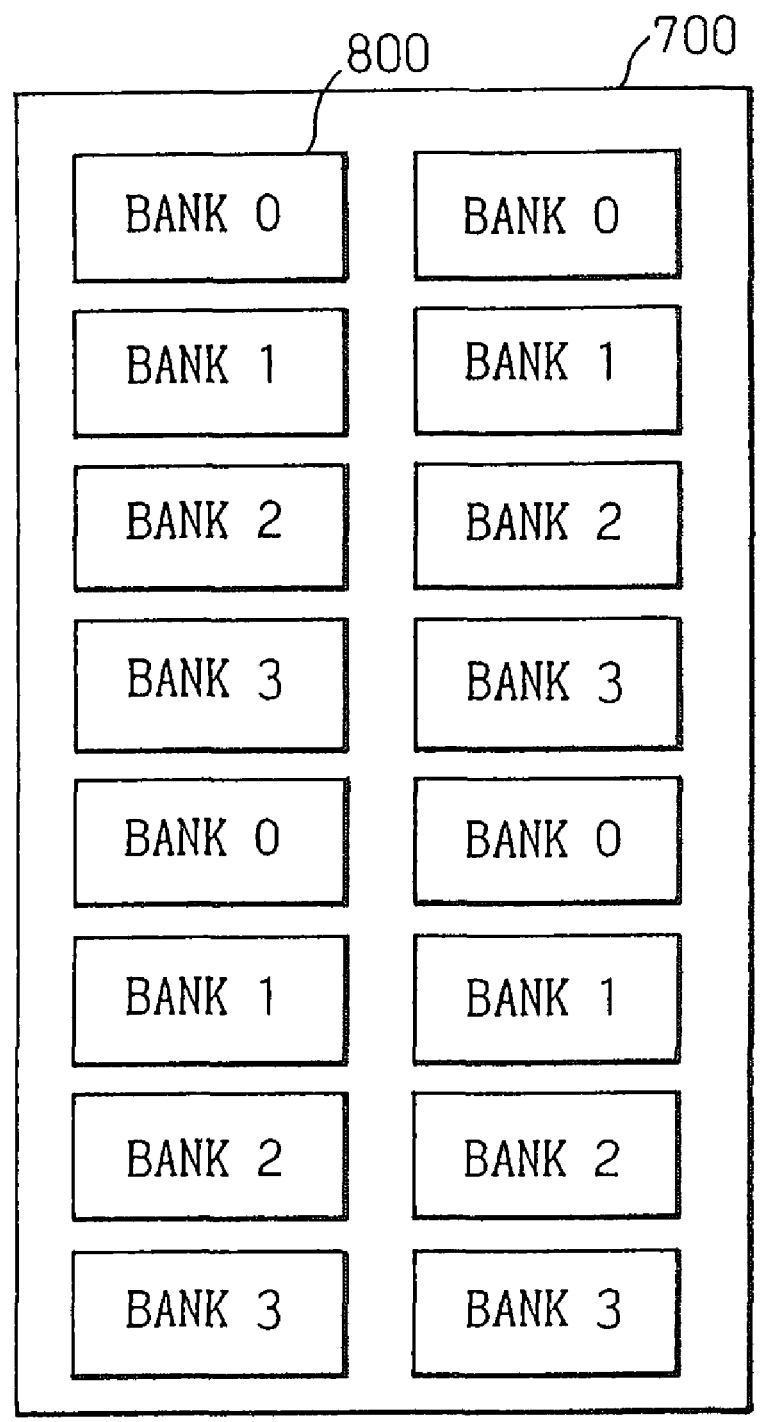
FIG. 54 is a schematic view showing the bank construction of the DRAM in the tenth embodiment.

FIG. 54 is a schematic view showing the bank construction of the DRAM chip 700 according to the tenth embodiment of the present invention. As shown in the drawing, the memory cell array is divided into sixteen blocks. Each block includes the word line, the bit line, the memory cell, the sense amplifier, the word decoder, the word driver, the column decoder, the data amplifier, the write amplifier, etc., in the same way as the ordinary DRAM. These sixteen blocks are divided into four banks, and the blocks of the same bank are accessed in parallel. In this embodiment, therefore, four blocks are accessed in parallel. In this case, for example, since eight memory cells are accessed in parallel in each block, the data width is a 32-bit data width.

Figure 55:
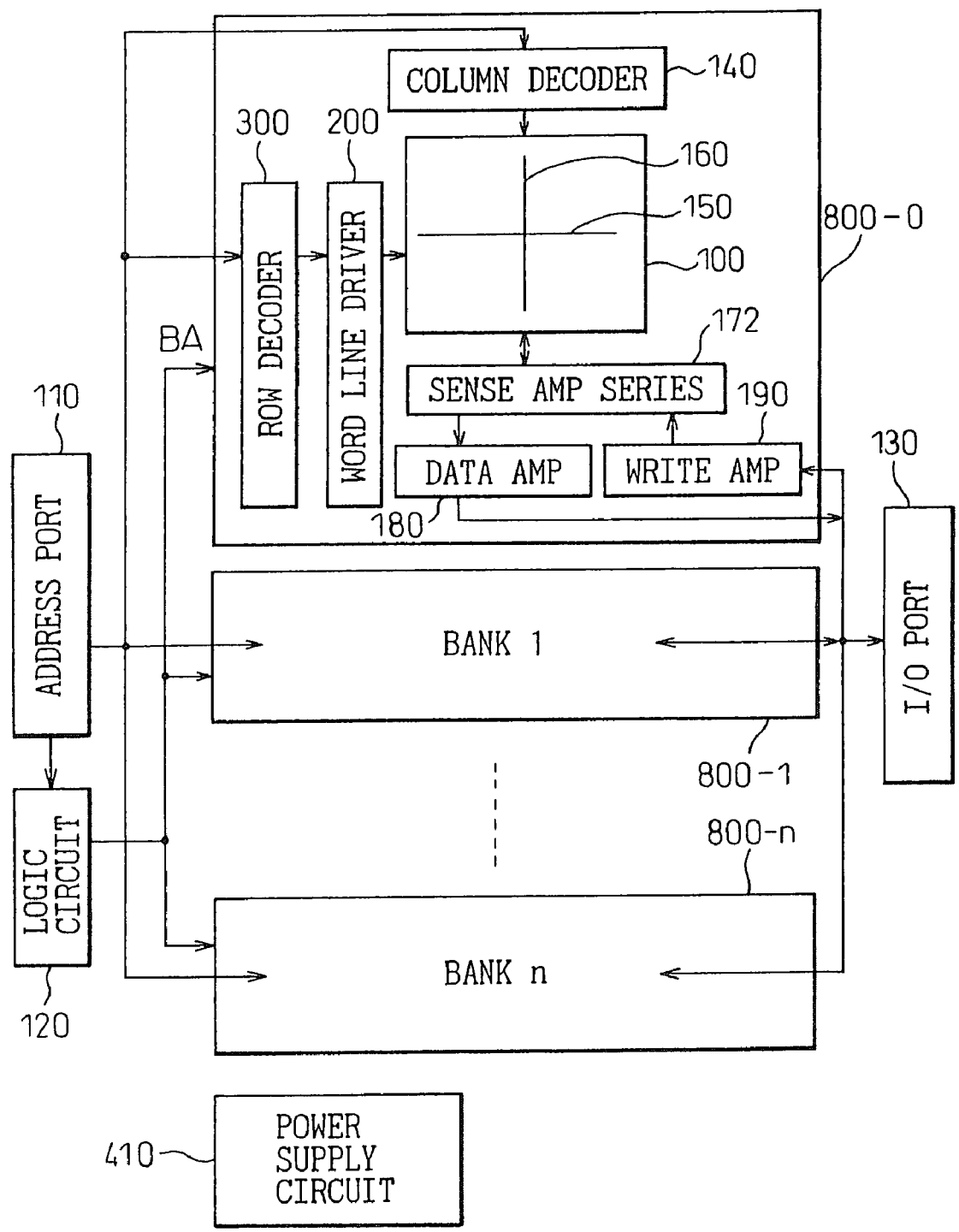
FIG. 55 is a block diagram showing the DRAM in the tenth embodiment.

FIG. 55 is a block diagram showing the functional construction of the DRAM according to the tenth embodiment. As shown in the drawing, the address signal inputted from the address port 110 is supplied to the row decoder 300 and the column decoder 140 of each bank. The row selection signal outputted by the row decoder 300 is applied to each word line 150 through the word line driver 200 and activates the word line connected to the memory cell to which access is made (selected word line), and other word lines (non-selected word lines) are kept in the non-activated state. The column selection signal outputted by the column decoder 140 is applied to the sense amplifier series 172 and activates the sense amplifier connected to the bit line to which the memory cell, that is to be accessed, is connected. Other sense amplifiers are kept in the non-activated state. The address signal and the external control signal (not shown in the drawing) inputted are supplied to the logic circuit 120, and the internal control signal generated in this circuit is supplied to each bank. When the data is written, the write data inputted to the I/O port 130 is supplied to the sense amplifier series 172 through the write amplifier 190, and the sense amplifier so activated sets the bit line to the state corresponding to the write data. The potential state (charges) corresponding to the state of this bit line is stored in the memory cell connected to the selected word line. When the data is read out, the state of the bit line changes in accordance with the stored charges of the memory cell connected to the selected word line, and the sense amplifier that is activated amplifies this data. The data amplifier 180 outputs this data to the I/O port 130. This explanation deals with the ordinary construction of the prior art. In addition to such a construction, the DRAM according to the tenth embodiment includes a power source circuit 410 for generating a potential different from the external power supply, as shown in FIG. 4.

Figure 4:
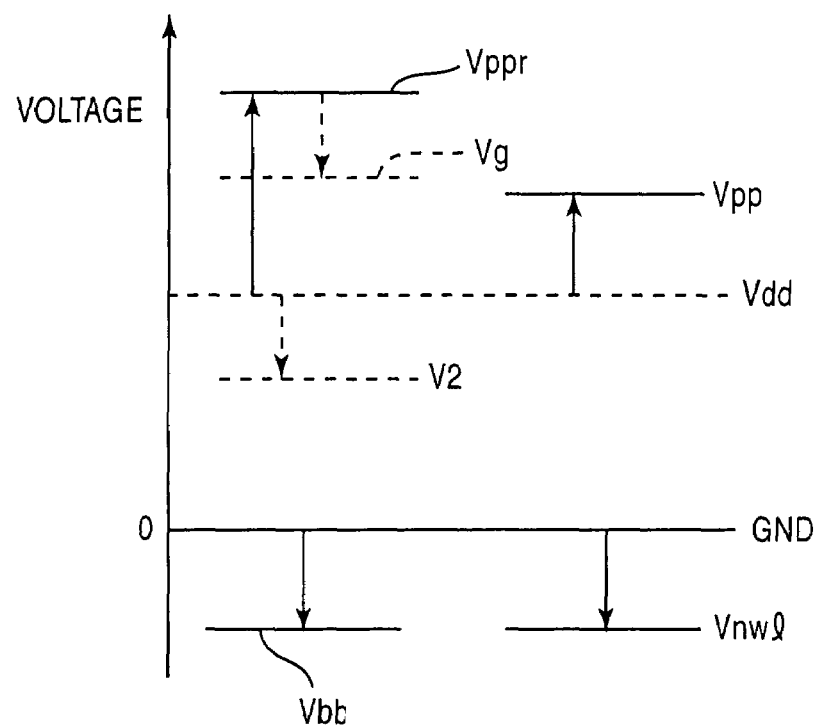
FIG. 4 is a diagram showing the voltage levels used in the DRAM.
Figure 5:
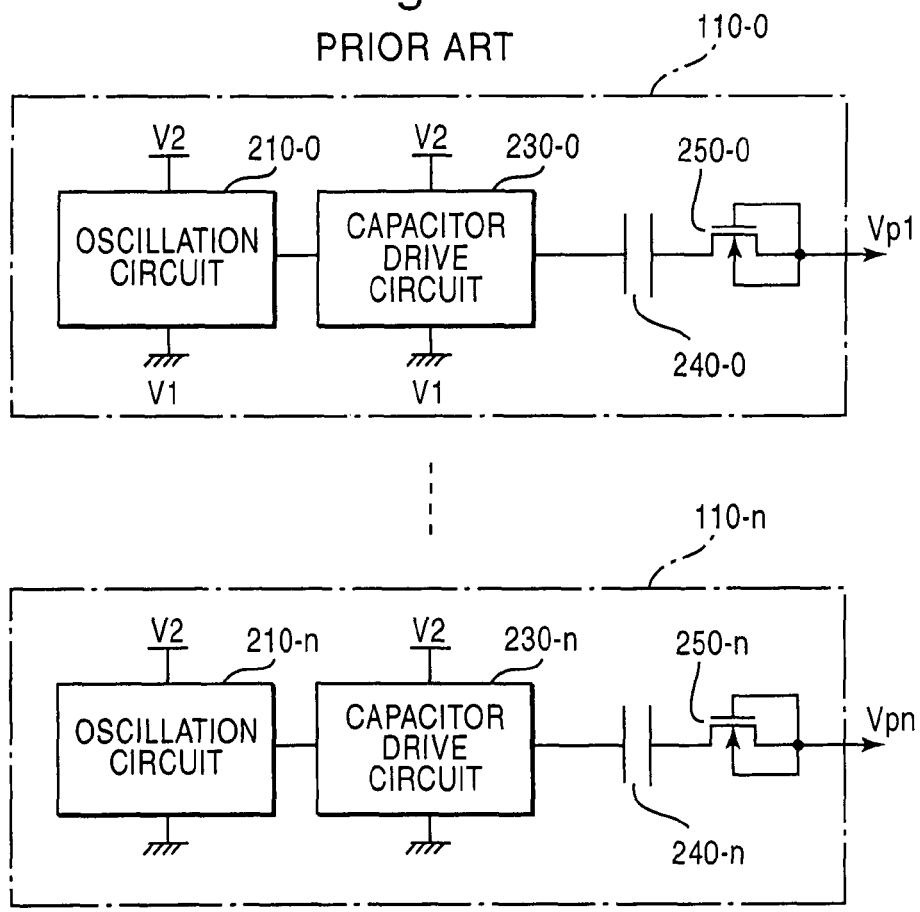
FIG. 5 is a circuit diagram showing a structural example of a power source circuit according to a prior art example.

The DRAMs of the recent type include the on-chip power source circuit or internal power source circuit for generating the power source having a potential other than the external input power supply Vdd and GND as shown in FIG. 4. FIG. 4 shows the step-up potential Vppr used for generating Vg and Vpp for the "H" level of the selected word line, the word line reset level Vnwl, and back-bias Vbb. These potentials are generated by the power source circuit that drives the capacitor by the oscillation signal. The power source circuit shown in FIG. 55 illustrates such a power source circuit as a whole.

Figure 56:
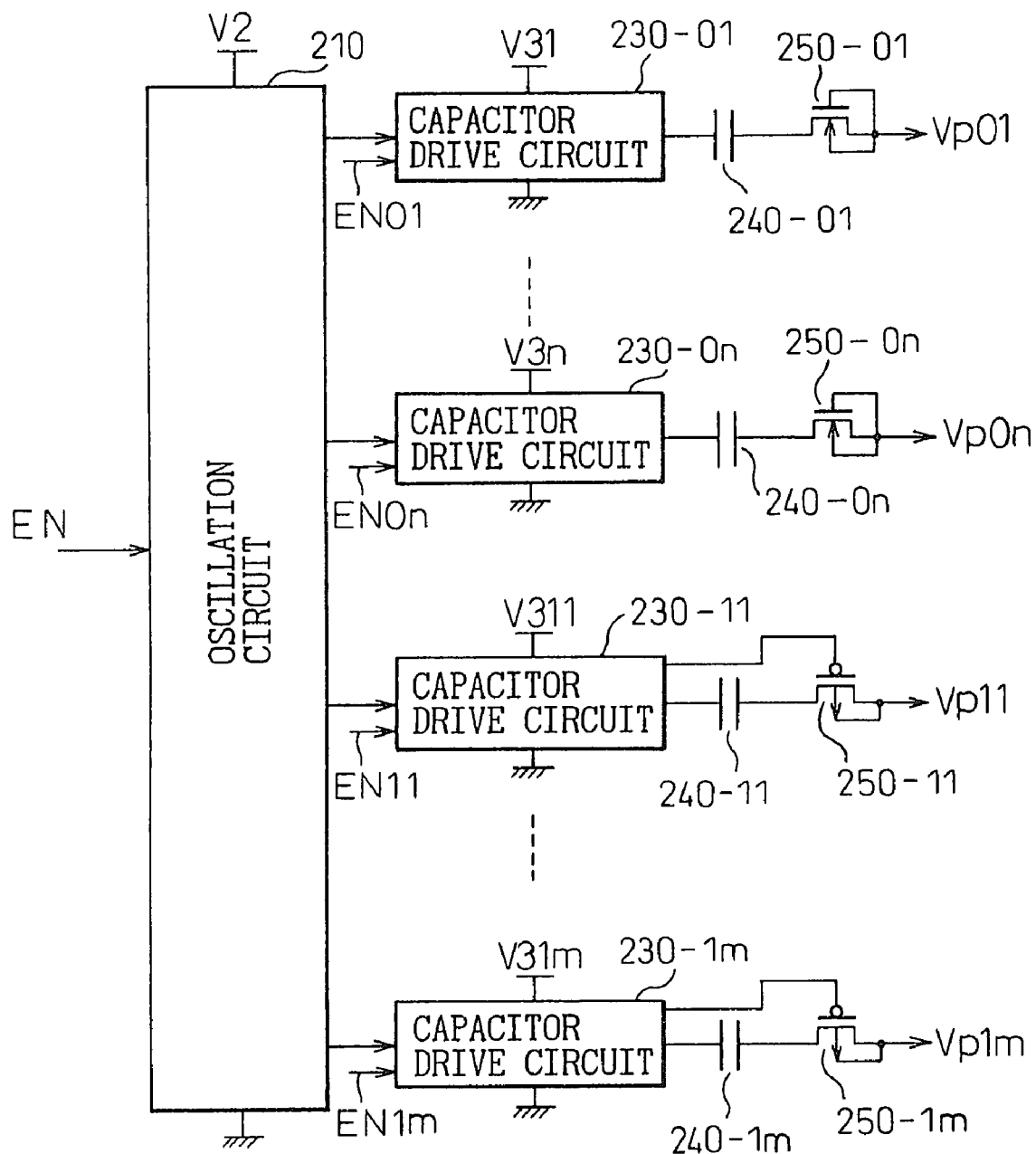
FIG. 56 is a block diagram showing the basic construction of the power source circuit in the tenth embodiment.

FIG. 56 is a block circuit diagram showing the basic construction of the power source circuit 400 according to the tenth embodiment. As shown in the drawing, the power source circuit 400 includes the capacitor drive circuits 230-01 to 230-0$n$ and 230-11 to 230-1$m$, the capacitors (pumping capacitors) 240-01 to 240-0$n$ and 240-11 to 240-1$m$ and the output circuit having the output transistors 250-01 to 250-0$n$ and 250-11 to 250-1$m$. The capacitor drive circuit, the capacitor and the output circuit form a pair and constitute the power source circuit unit. Incidentally, the output circuit in FIG. 56 comprises the transistor. The oscillation signal is supplied from the common oscillation circuit 210 to each capacitor drive circuit 230-01 to 230-0$n$ and 230-11 to 230-1$m$. The oscillation signal supplied to each capacitor drive circuit may be the same signal, or signals having different cycles, or signals having the same cycle but different phases. Each power source circuit unit generates the potentials Vp01 to Vp0$n$ and Vp11 to Vp1$m$. Each power source circuit that comprises the capacitor drive circuit 230-01 to 230-0$n$, the capacitor 240-01 to 240-0$n$ and the output transistor 250-01 to 250-0$n$ represents the negative voltage generating circuit, and each power source circuit that comprises the capacitor drive circuit 230-11 to 230-1$m$, the capacitor 240-11 to 240-1$m$ and the output transistor 250-11 to 250-1$m$ represents a boosting circuit for generating a step-up voltage. The oscillation circuit 210 can stops its oscillation by the control signal EN. When the oscillation circuit 210 stops its oscillation, no oscillation signal is outputted. Therefore, each power source circuit stops its operation, too. In other words, the operation of the power source can be controlled by the control signal EN.

Figure 57A:
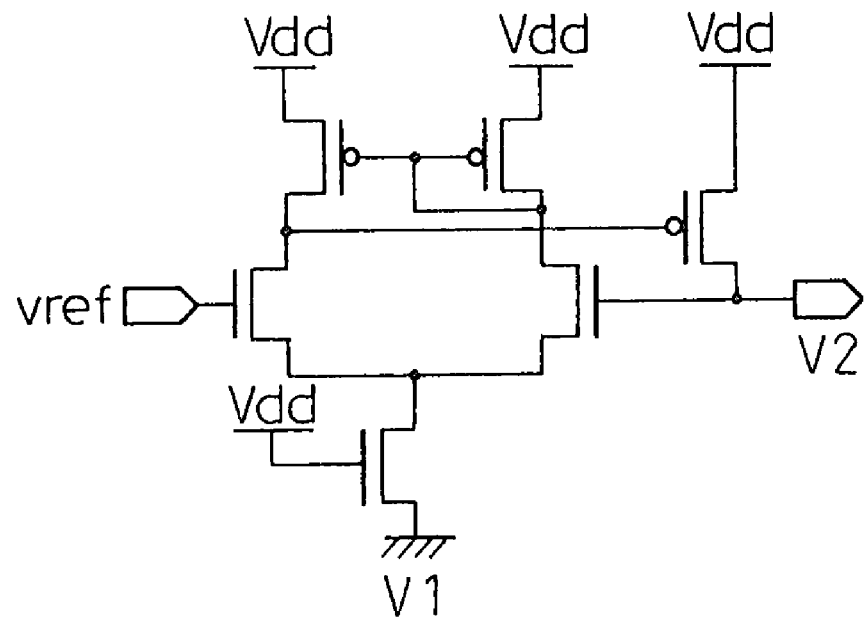
FIGS. 57A and 57B are circuit diagrams each showing a structural example of an internal regulator source circuit.
Figure 57B:
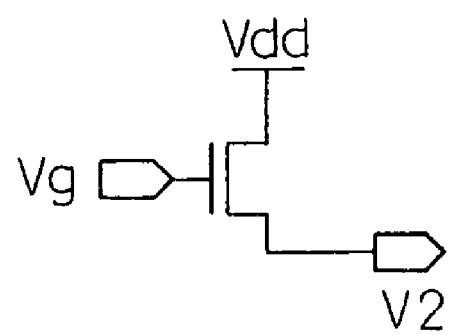

As shown in the drawing, the internally regulated power source (V2) of the oscillation circuit 210 and the internally regulated power sources (V31 to V3*n* and V311 to V31*m*) of each capacitor drive circuit 230-1 to 230-0*n* and 230-11 to 230-1*m* are different (this difference may be only a partial difference). Here, the external power source Vdd is used as the power sources V31 to V3*n* and V311 to V31*m*, while V2 is generated from the external power supply vdd by using the internal regulator circuit shown in FIGS. 57A and 57B. FIG. 57A shows the circuit using the negative feedback circuit using the driver of the P-channel transistor, and this circuit outputs a potential equal to vref as V2. Therefore, if the correct and constant voltage is used as vref, the stable internally regulated power source (V2) can be obtained even when the external power supply Vdd changes. FIG. 57B shows a regulator circuit using the N-channel transistor. When the gate voltage of the N-channel transistor is Vg, V2 is given by Vg–Vth (Vth: threshold value of the transistor). Similarly, if the correct and constant voltage is used as Vg, the stable internally regulated power source V2 can be obtained even when the external power supply Vdd fluctuates. If V2 is stable, the cycle of the oscillation signal generated by the oscillation circuit 210 can be stabilized. Since V3 is higher than V2, the current supply capacity can be increased and the increase of the chip area can be suppressed. Incidentally, it is possible to use the internally regulated power source as V2 or to make V2 equal to V3. Furthermore, both of V2 and V3 can be the external power supply Vdd. In this case, however, the cycle of the oscillation signal of the oscillation circuit is affected by the value of the external power supply.

Figure 58:
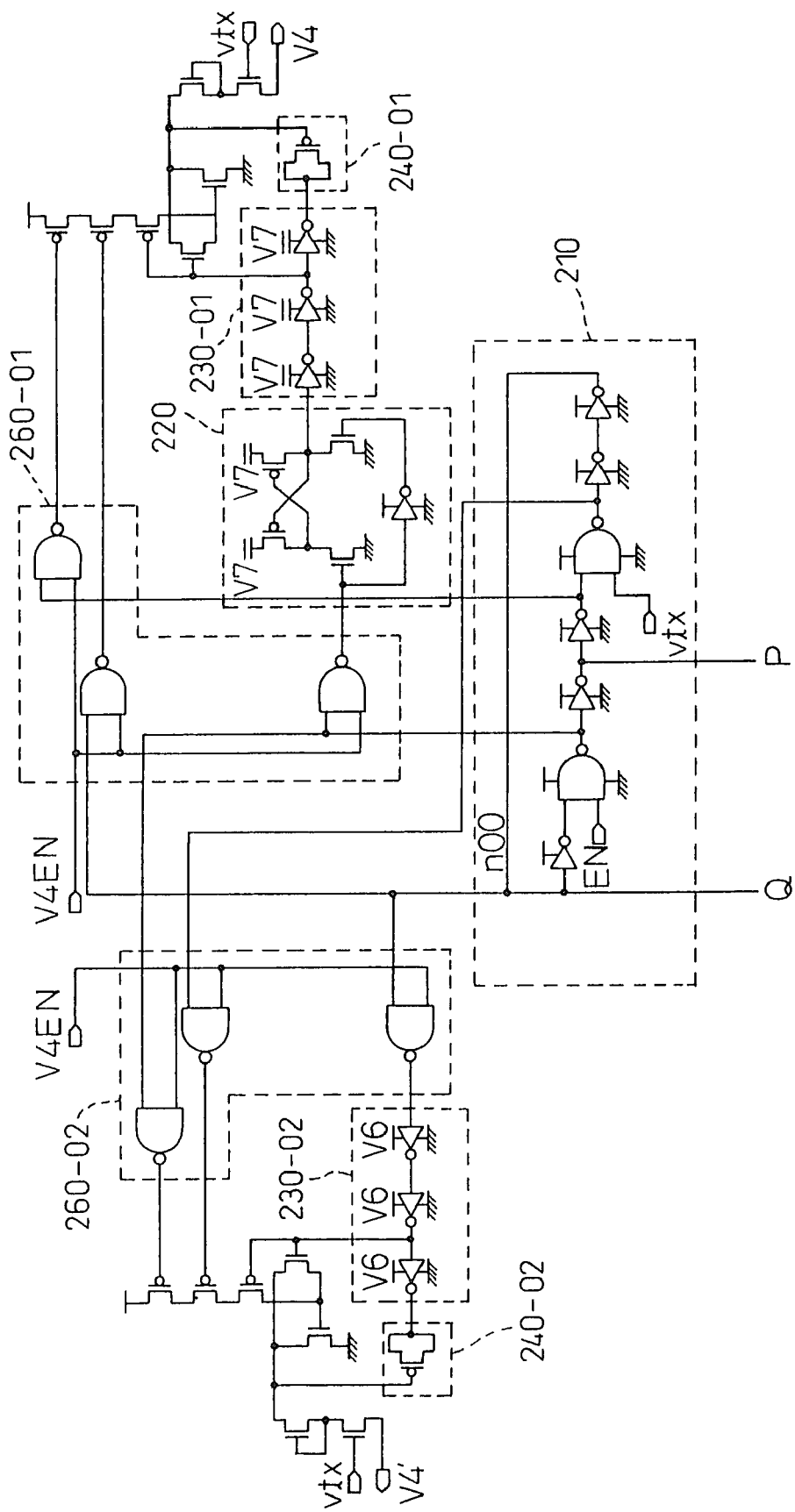
FIG. 58 is a circuit diagram showing the concrete construction of the power source circuit of the tenth embodiment.
Figure 59:
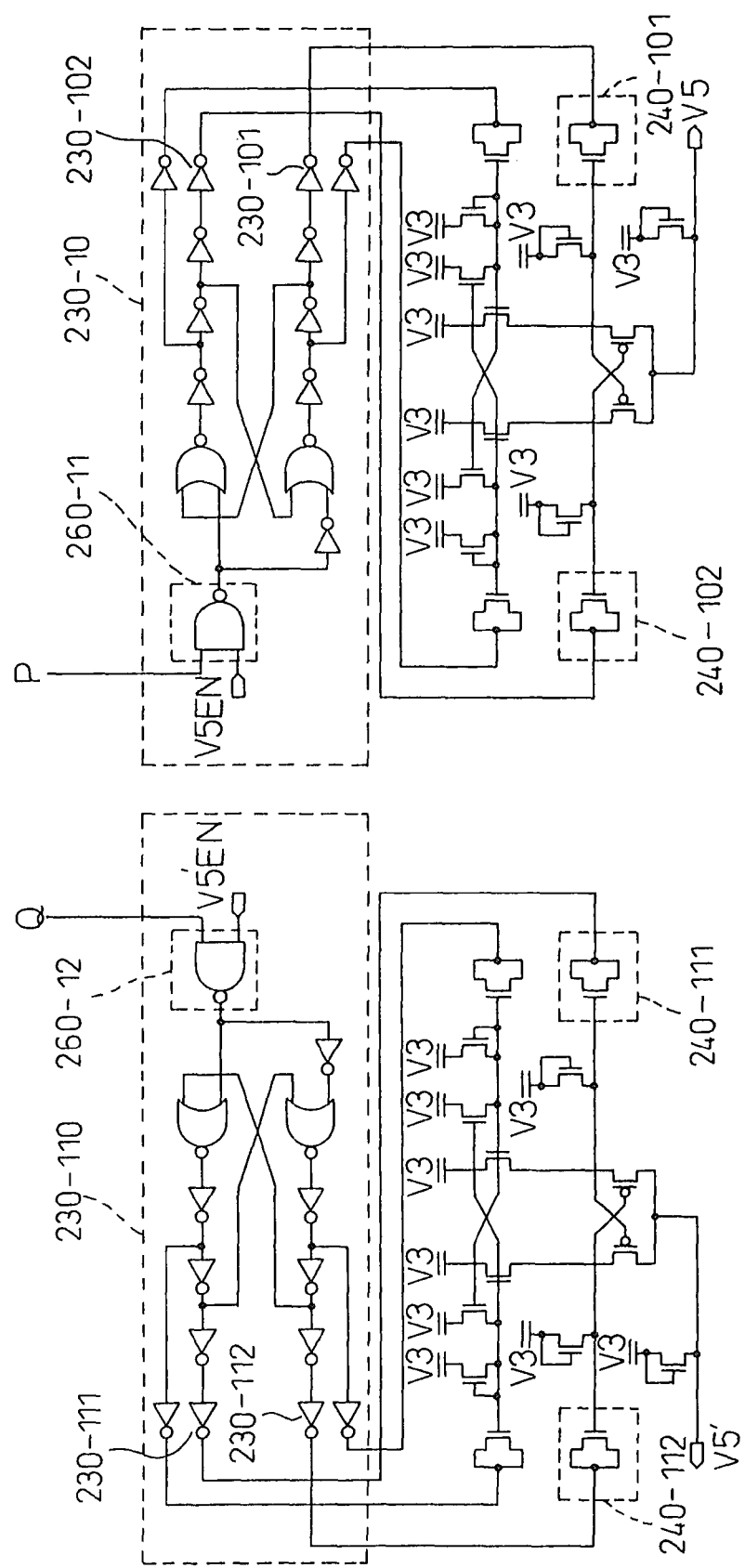
FIG. 59 is a circuit diagram showing the concrete construction of the power source circuit of the tenth embodiment.

FIGS. 58 and 59 are circuit diagrams showing the concrete circuit construction of the power source circuit according to the tenth embodiment, and represent the case in which two negative voltage generating circuits (that is, n=2) and two boosting circuits (that is, m=2) are disposed. As shown in FIG. 58, the oscillation circuit 210 is the known oscillation circuit constituted by connecting in series a plurality of inverters and a plurality of NAND gates, and inputting the output of the final stage to the initial stage. The control signal EN is inputted to the NAND gate of the second stage of the oscillation circuit 210 so that the operation of the oscillation circuit can be controlled. The NAND gate of the fifth stage of the oscillation circuit 210 and the control signal vtx inputted to the output portion are used when the WL reset level generating circuit is compulsively stopped irrespective of the EN signal, such as during the test.

The first negative voltage generating circuit comprises the level converting circuit 220, the capacitor drive circuit 230-01, the capacitor 240-01, the output circuit and the operation control circuit 260-01. As shown in the drawing, the power source of the oscillation circuit 210 is V2 and the power source of the capacitor drive circuit 230-01 is V7 which is higher than V2. Therefore, the oscillation signal of the oscillation circuit 210 is first converted by the level converting circuit 220 to the level corresponding to V3 and is then applied to the capacitor drive circuit 230-01. When the output of the capacitor drive circuit 230-01 is "H", the gate of the P-channel transistor of the capacitor 240-01 is grounded and reaches the ground level. In other words, the potential of the gate of the P-channel transistor of the capacitor 240-01 becomes lower than the potential of the source and the drain. Next, when the output of the capacitor drive circuit 230-01 changes to "L", the gate of the P-channel transistor of the capacitor 240-01 is cut off from the ground, and the source and the drain of the P-channel transistor of the capacitor 240-01 reach the ground level. Since the gate potential of the P-channel transistor is lower than the potential of the source and the drain as described above, the gate potential becomes the negative potential. This negative potential is generated as V4. The operation control circuit 260-01 is the switch for controlling the operation of the first negative voltage generating circuit. The first negative voltage generating circuit operates when the control signal V4EN is "H" and stops its operation when V4EN is "L".

The second negative voltage generating circuit comprises the capacitor drive circuit 230-02, the capacitor 240-02, the output circuit and the operation control circuit 260-02. The power source V6 of the capacitor drive circuit 230-0 has a potential that is equal to, or lower than, V2. Therefore, the level converting circuit is not necessary. The oscillation signal supplied from the oscillation circuit 210 to the second negative voltage generating circuit has a phase that is deviated from the phase of the oscillation signal supplied to the first negative voltage generating circuit. The negative potential is generated as V4' and controlled by the control signal V4'EN. The rest of the constructions are the same as that of the first negative voltage generating circuit.

The first boosting circuit comprises the capacitor drive circuit 230-10, the capacitors 240-101 and 240-102, the output circuit and the operation control circuit 260-11. The inverters 230-101 and 230-102 of the capacitor drive circuit 230-10 are the drive unit of the capacitor. The signal P is supplied from the oscillation circuit 210 to the NAND gate of the operation control circuit 260-11. The control signal V5EN is supplied to the NAND gate so that the supply of the signal P in the capacitor drive circuit, that is, the operation of the first boosting circuit, can be controlled. The detailed explanation will be hereby omitted. The second boosting circuit has the same construction, too.

As described above, in the power source circuit according to the tenth embodiment, the four power source circuits, that is, the first and second negative voltage generating circuits and the first and second boosting circuits, are driven by the oscillation signal supplied from one oscillation circuit. Therefore, since only one oscillation circuit 210 needs be disposed, the chip area as well as power consumption can be reduced.

Figure 60:
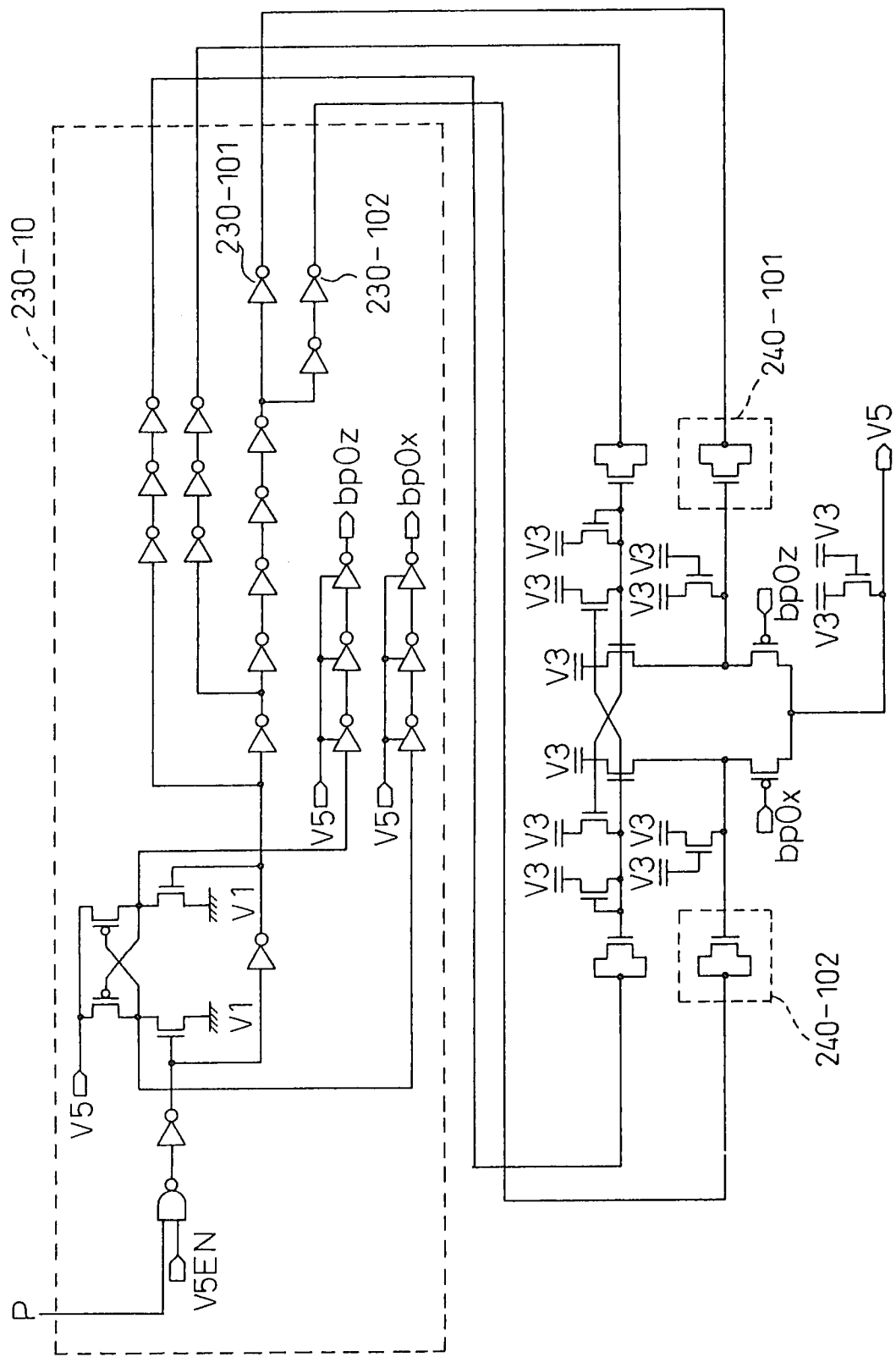
FIG. 60 is a circuit diagram showing another structural example of a booster circuit of the tenth embodiment.

FIG. 60 is a circuit diagram showing another structural example of the boosting circuit, and this circuit corresponds to the first boosting circuit shown in FIG. 59. As shown in the diagram, this circuit is different from the first boosting circuit of FIG. 59 in the gate construction of the capacitor drive circuit and the control of the output circuit. However, the basic operation is the same, and the explanation in further detail will be omitted.

Figure 61:
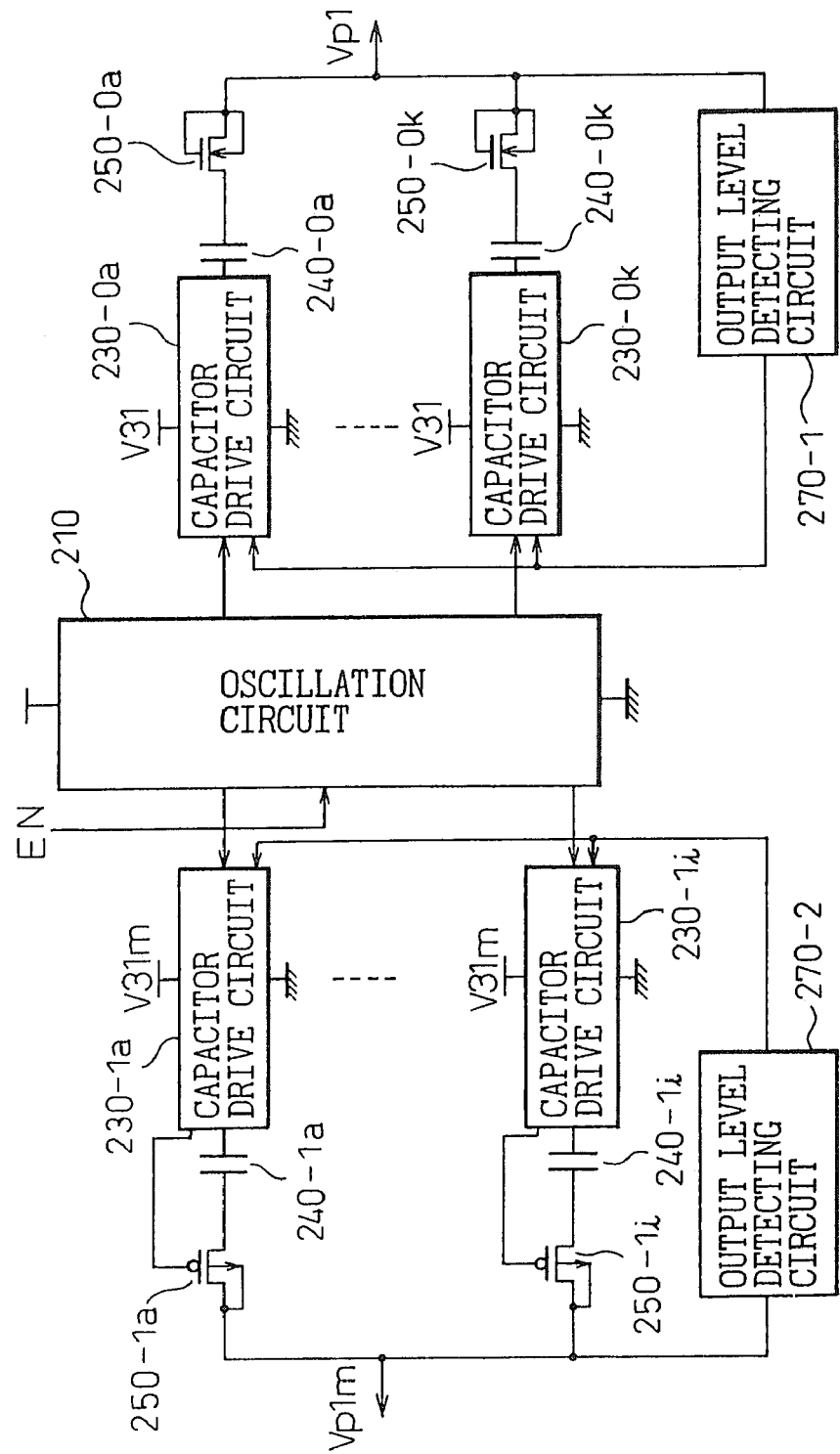
FIG. 61 is block circuit diagram showing the basic construction of the power source circuit in the eleventh embodiment.

FIG. 61 is a circuit diagram showing the construction of the power source generating circuit according to the eleventh embodiment of the present invention. In the tenth embodiment shown in FIG. 56, the eleventh embodiment constitutes one negative potential generating circuit and one boosting circuit by a plurality of units, respectively, and connecting their outputs in common. Therefore, other negative potential generating circuits and boosting circuits may be disposed besides the circuit shown in the drawing, and they may comprise a plurality of units as shown in the drawing. There are further disposed output level detecting circuits 270-1 and 270-2 for detecting the level of the output of each unit connected in common. The oscillation signals having mutually different phases are supplied from the oscillation circuit 210 to each negative potential generating circuit unit and each boosting circuit unit. The eleventh embodiment is effective when the pumping capacity is large with respect to the cycle of the oscillation signal. When the cycle of the oscillation circuit becomes short, a capacitor having a relatively large capacitance cannot be charged sufficiently and current supply efficiency deteriorates. Therefore, the cycle of the oscillation signal cannot be much reduced. On the other hand, it is preferred to shorten the cycle of the oscillation signal in order to suppress an increase of the areas of the negative potential generating circuit and the boosting circuit, and to restrict the current consumption. When the output of each unit is connected in common and the oscillation signal having a different phase is inputted to each unit as in the power source generating circuit of the eleventh embodiment, overall current efficiency does not deteriorate even when the cycle of the oscillation signal is so short as only a relatively small capacitor has to be charged, since the current is supplied with other unit alternately.

The level detecting circuits 270-1 and 270-2 detect the level of the negative potential and the level of the boosted potential, that are connected in common (i.e., they detect whether the potentials are within or outside a predetermined range), and control the operation of a part, or the whole, of the capacitor drive circuits 230-0a to 230-0k and 230-1a to 230-1l on the basis of the detection result. This construction is directed to operate a large number of units so as to secure a sufficient amount of the current supply when the current consumption of all the negative potential generating circuits or of all the boosting circuits is large, and to reduce power consumption by stopping the operation of a part of the units when current consumption of the potential is small.

In the tenth and eleventh embodiments, the oscillation signal for driving the capacitor is generated by the oscillation circuit in the chip. On the other hand, a synchronous DRAM (SDRAM), DDR-DRAM (Double-Data-Rate DRAM), etc., to which a clock is supplied from outside and which makes it possible to execute a high-speed operation by conducting the input/output operations of the signal synchronously with this clock, is available as a kind of DRAM. Since this clock is always supplied when the chip is operative condition, signals similar to the oscillation signal can be generated by frequency-dividing the clock signal from external. Next, the twelfth embodiment of the present invention, which is applied to such a semiconductor device, will be explained.

Figure 62:
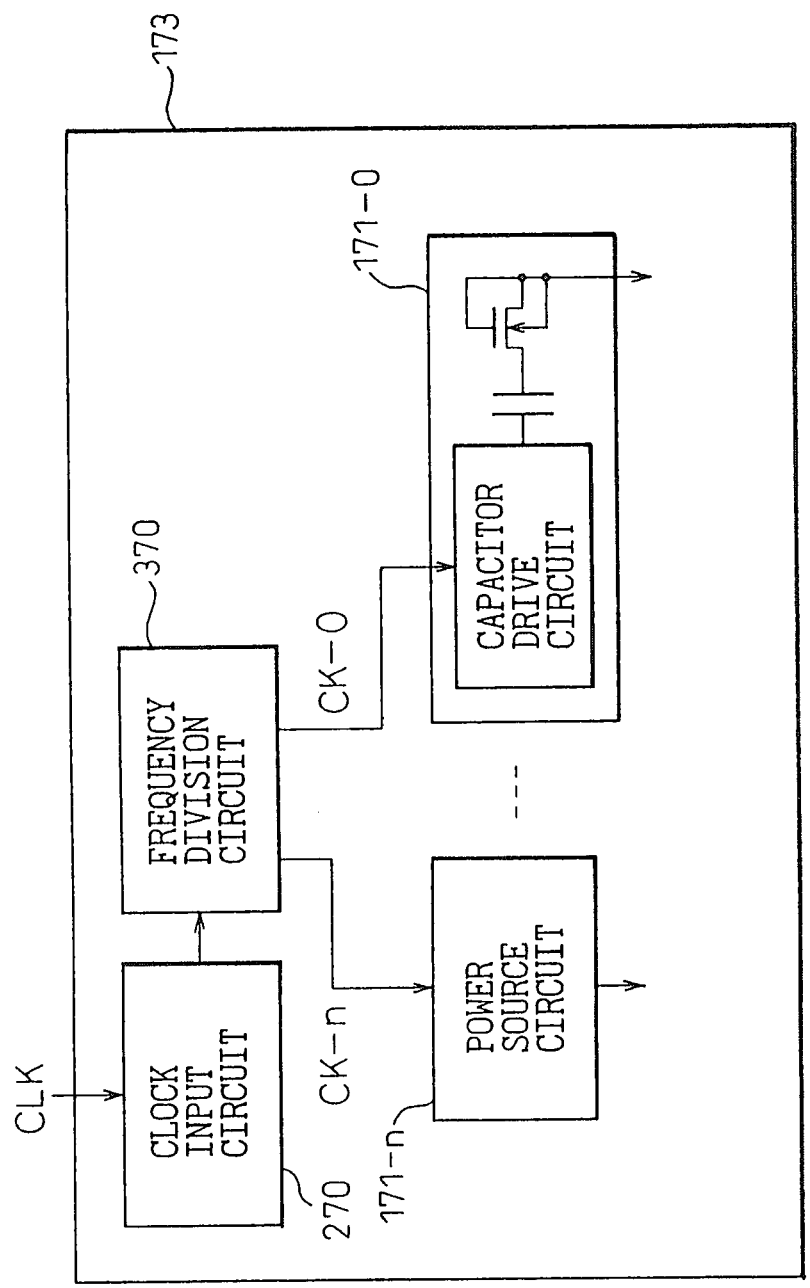
FIG. 62 is a block diagram showing the construction of a semiconductor device according to the twelfth embodiment.

FIG. 62 is a block circuit diagram showing the construction of the semiconductor device according to the twelfth embodiment. As shown in the circuit diagram, the semiconductor device 173 of the twelfth embodiment includes a clock input circuit 270 for receiving the clock CLK supplied from outside, a frequency dividing circuit 370 for frequency-dividing the clock outputted from the clock input circuit 270 and a plurality of power source circuits 171-0 to 171-n for generating power source voltages whose potentials are different from the external power supply voltage by driving the capacitor with the frequency divided clock outputted from the frequency dividing circuit 370. The frequency divided clocks supplied from the frequency dividing circuit 370 to each power source circuit 171-0 to 171-n may be the same frequency divided clocks or the frequency divided clocks having the same cycle but different phases or different frequencies of the frequency divided clocks. Each power source generally circuit 171-0 to 171-n has the capacitor drive circuit, the capacitor and the output circuit that are explained in the eleventh embodiment, and the level converting circuit shown in FIG. 58 is used when a capacitor drive circuit having a high power source voltage is used. Since the frequency dividing circuits are so arranged as to be in common with one another in the twelfth embodiment the chip area as well as power consumption can be reduced.

Figure 63A:
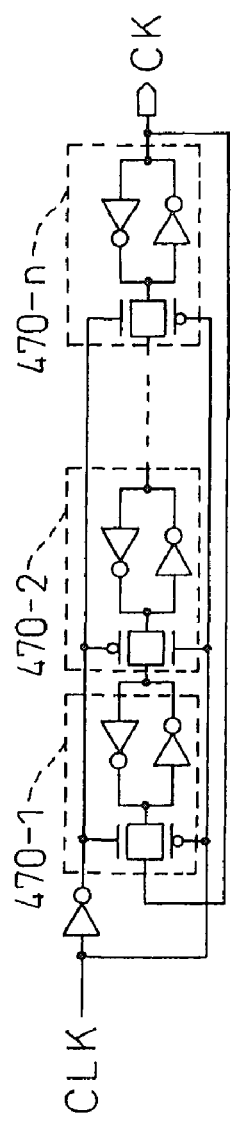
FIGS. 63A and 63B are circuit diagrams showing a structural example of a frequency-dividing circuit in the twelfth embodiment.
Figure 63B:
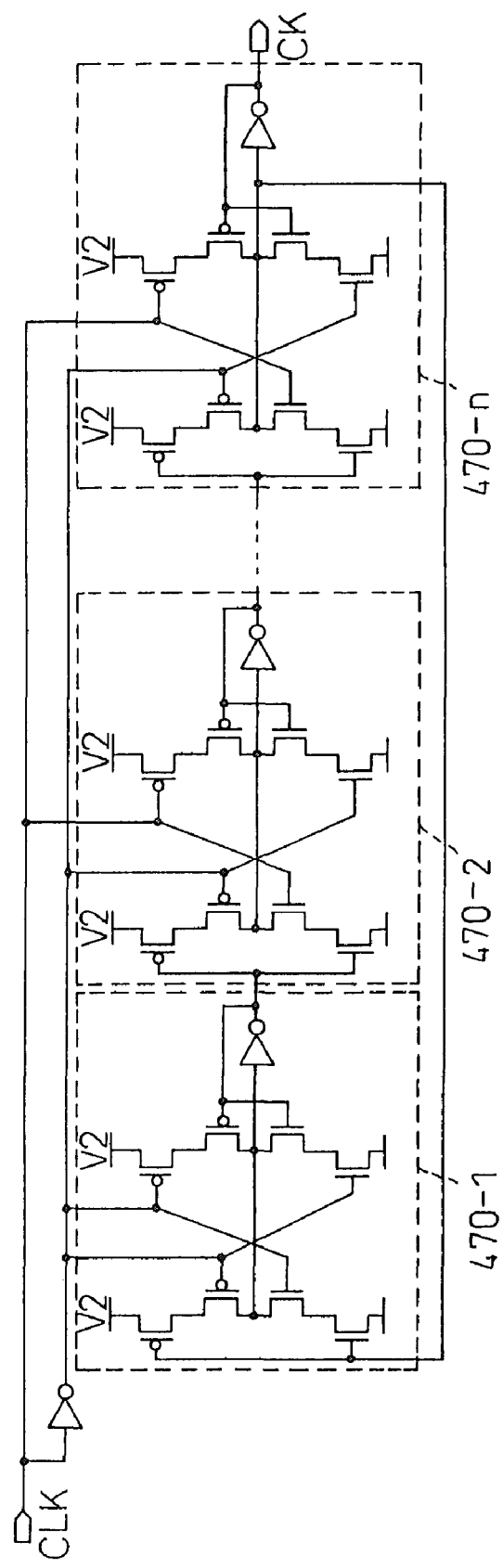

FIGS. 63A and 63B show structural examples of the circuits used for the frequency dividing circuit 370 of the twelfth embodiment. In the case of the synchronously operating DRAMs, the clock signal supplied from outside has mostly an extremely high speed, and cannot as such be used for the capacitor drive circuit. Therefore, the frequency divided clock CK is generated by using the frequency dividing circuits shown in FIGS. 63A and 63B. In FIG. 63A, a single stage ½ frequency dividing circuit is constituted by combining a flip-flop circuit using two inverters and a transfer gate controlled by the clock CLK. A ½$^n$ frequency dividing circuit can be accomplished by connecting them in series of n stages of the ½ frequency dividing circuit. The detail explanation of FIG. 63B will be omitted, but this circuit is constituted by connecting n stages of the ½ frequency dividing circuits in series in the same way as in FIG. 63A.

Though the embodiments of the present invention have thus been described, the constructions of the tenth to twelfth embodiments can be combined in various ways as already described, and it is of importance to employ the optimum method in accordance with the intended application.

As explained above, in the semiconductor device having a plurality of power source circuits for generating different power source voltages by driving the capacitor by the oscillation signal, the tenth to twelfth embodiments can reduce both the chip area and power consumption.

What is claimed is:

1. A semiconductor device including a word line drive circuit for resetting a word line by driving said word line connected to a specific memory cell when said specific memory cell in a memory cell array including a plurality of memory cells is returned from an activated state to a standby state;
    wherein a reset level of said word line drive circuit which is set when the reset operation of said word line is executed can be switched between a first potential and a second potential; and
    wherein a reset level switch circuit for switching said first potential and said second potential of said reset level is disposed in said word line drive circuit.

2. A semiconductor device according to claim 1, wherein said second potential is set to a level lower than said first potential.

3. A semiconductor device according to claim 1, wherein said first potential of said reset level is a ground potential and said second potential is a potential of a negative voltage level.

4. A semiconductor device according to claim 1, wherein the switching operation of said reset level to said second potential is executed after said reset operation is started and the level of said word line drops.

5. A semiconductor device according to claim 1, which further includes:
    a reset level switching control timing circuit for setting in advance a period in which the level of said word line drops to a predetermined level after the start of said reset operation, and for switching said reset level from said first potential to said second potential after said period passes from the timing of the start of said reset operation.

6. A semiconductor device according to claim 1, which further includes:
    a word line potential judging circuit for supervising the potential of said word line and switching said reset level from said first potential to said second potential when it detects the drop of the potential of said word line to a predetermined level.

7. A semiconductor device according to claim 1, wherein the switching operation of said reset level between said first potential and said second potential is executed by an activation signal and a non-activation signal for activating and non-activating a sense amplifier of said memory cell array.

* * * * *